(12) United States Patent
Chen et al.

(10) Patent No.: US 12,507,438 B2
(45) Date of Patent: Dec. 23, 2025

(54) SEMICONDUCTOR STRUCTURE WITH CONTACT RAIL AND METHOD FOR FORMING THE SAME

(71) Applicant: Taiwan Semiconductor Manufacturing Co., Ltd., Hsinchu (TW)

(72) Inventors: Chun-Yuan Chen, Hsinchu (TW); Cheng-Chi Chuang, New Taipei (TW); Chih-Hao Wang, Baoshan Township (TW); Huan-Chieh Su, Tianzhong Township (TW); Kuo-Nan Yang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 327 days.

(21) Appl. No.: 18/313,634

(22) Filed: May 8, 2023

(65) Prior Publication Data
US 2024/0250134 A1 Jul. 25, 2024

Related U.S. Application Data

(60) Provisional application No. 63/480,702, filed on Jan. 20, 2023.

(51) Int. Cl.
*H10D 30/67* (2025.01)
*H01L 23/48* (2006.01)
(Continued)

(52) U.S. Cl.
CPC ....... *H10D 30/6729* (2025.01); *H01L 23/481* (2013.01); *H01L 23/5286* (2013.01); *H01L 23/535* (2013.01); *H10D 30/014* (2025.01); *H10D 30/43* (2025.01); *H10D 30/6735* (2025.01); *H10D 30/6757* (2025.01); *H10D 62/121* (2025.01); *H10D 64/017* (2025.01);
(Continued)

(58) Field of Classification Search
CPC ............ H01L 23/5286; H10D 84/0135; H10D 30/673
See application file for complete search history.

(56) References Cited

U.S. PATENT DOCUMENTS 11,380,607 B2 7/2022 Kim
11,532,744 B2 12/2022 Chen
(Continued)

FOREIGN PATENT DOCUMENTS

KR 20200049439 A 5/2020
KR 20210012084 A 2/2021
(Continued)

*Primary Examiner* — Amar Movva
(74) *Attorney, Agent, or Firm* — Slater Matsil, LLP

(57) ABSTRACT

A method includes forming a gate electrode and a source/drain region over a bulk portion of a semiconductor substrate, forming a cut-metal-gate region to separate the gate electrode into a first portion and a second portion, forming a source/drain contact plug overlapping and electrically connected to the source/drain region, forming a first contact rail overlapping a portion of the cut-metal-gate region, removing the bulk portion of the semiconductor substrate, and etching the cut-metal-gate region to form a trench. A surface of the first contact rail is revealed to the trench. A via rail is formed in the trench, and the via rail is electrically connected to the source/drain region through the first contact rail.

20 Claims, 65 Drawing Sheets

(51) Int. Cl.
  *H01L 23/528* (2006.01)
  *H01L 23/535* (2006.01)
  *H10D 30/01* (2025.01)
  *H10D 30/43* (2025.01)
  *H10D 62/10* (2025.01)
  *H10D 64/01* (2025.01)
  *H10D 84/01* (2025.01)
  *H10D 84/03* (2025.01)
  *H10D 84/83* (2025.01)

(52) U.S. Cl.
  CPC ....... *H10D 84/0128* (2025.01); *H10D 84/013* (2025.01); *H10D 84/0135* (2025.01); *H10D 84/0149* (2025.01); *H10D 84/0186* (2025.01); *H10D 84/038* (2025.01); *H10D 84/83* (2025.01)

(56) References Cited

U.S. PATENT DOCUMENTS

| | | |
|---|---|---|
| 11,721,628 B2 | 8/2023 | Kim |
| 12,034,008 B2 | 7/2024 | Baek et al. |
| 2024/0290620 A1 | 8/2024 | Jang |
| 2024/0371704 A1 | 11/2024 | Chen |

FOREIGN PATENT DOCUMENTS

| | | |
|---|---|---|
| KR | 20210102816 A | 8/2021 |
| KR | 20210148543 A | 12/2021 |
| KR | 20220023897 A | 3/2022 |
| KR | 20220055391 A | 5/2022 |

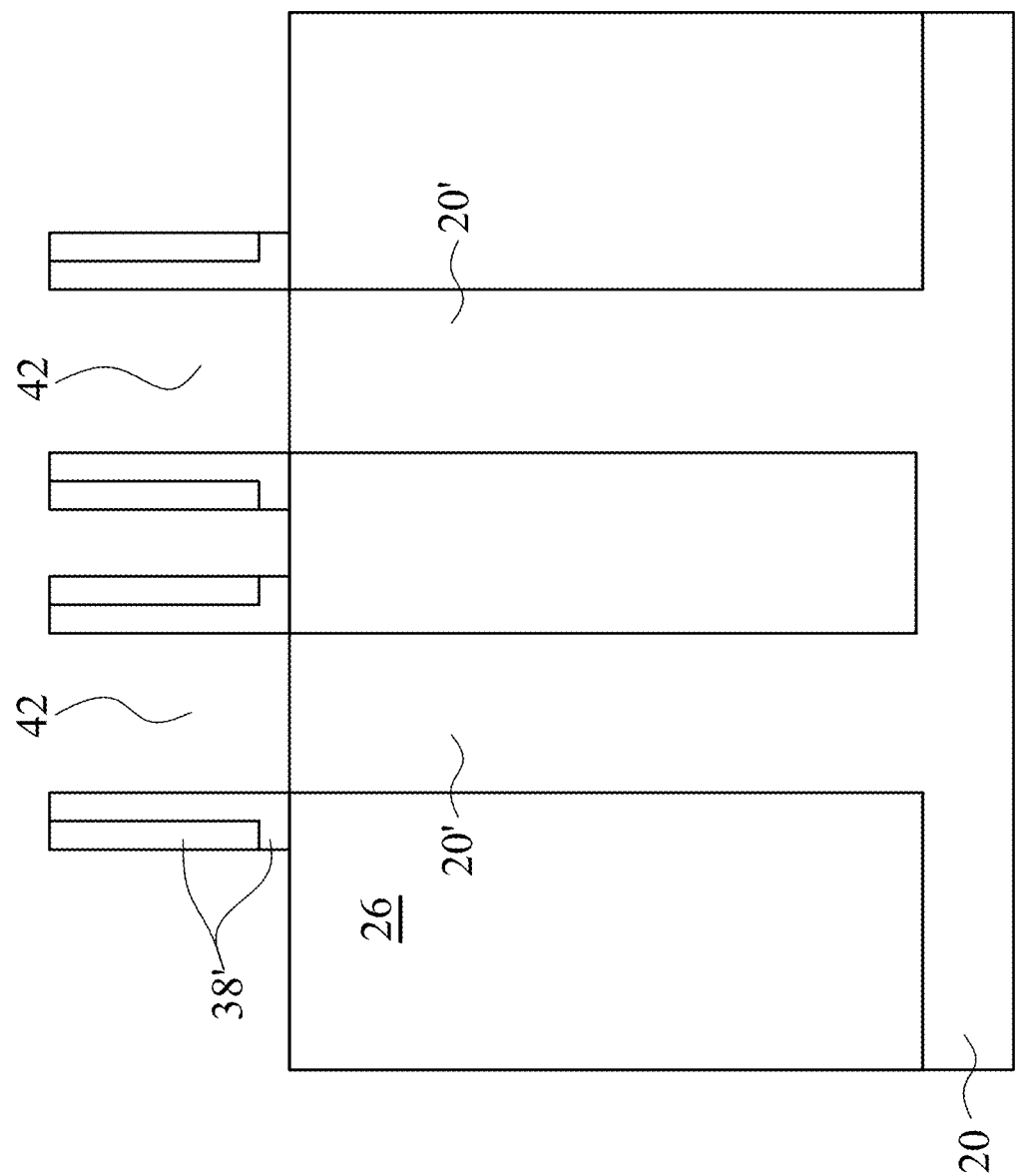

SEMICONDUCTOR STRUCTURE WITH CONTACT RAIL AND METHOD FOR FORMING THE SAME

PRIORITY CLAIM AND CROSS-REFERENCE

This application claims the benefit of the following provisionally filed U.S. Patent application: Application No. 63/480,702, filed on Jan. 20, 2023, and entitled "Semiconductor Structure with Contact Rail and Method for Forming the Same," which application is hereby incorporated herein by reference.

BACKGROUND

Header cells are used in integrated circuits for gating the power provided to certain circuits. A head cell includes a transistor, whose source is connected to a power node such as VDD. The drain is used as another power node, whose voltage is determined by whether the transistor is turned on or off. When the header cell is turned on, the drain receives the power, and hence the circuit is powered. When the header cell is turned off, no power is provided to the circuit. The source of the header cell may be provided with a power, for example, through a power rail that is in a power over the header cell, or through an epitaxy region and a via at a bottom of the epitaxy region, wherein the via has a bottom connected to a backside power rail.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-4, 5A, 5B, 6A, 6B, 7A, 7B, 8A, 8B, 9A, 9B, 10A, 10B, 10C, 11A, 11B, 12A, 12B, 13A, 13B, 14-1, 14-2, 15A, 15B, 16A, 16B, 17A, 17B, 18, 19, 20A, 20B, 21A, 21B, 22-24, 25A, 25B, 25C, 26A, 26B, 26C, 27A, 27B, 28, and 29 illustrate the perspective views, cross-sectional views, and top views (layouts) of intermediate stages in the formation of a header cell and contact rails for providing power from backside power rails in accordance with some embodiments.

DETAILED DESCRIPTION

Figure 1:
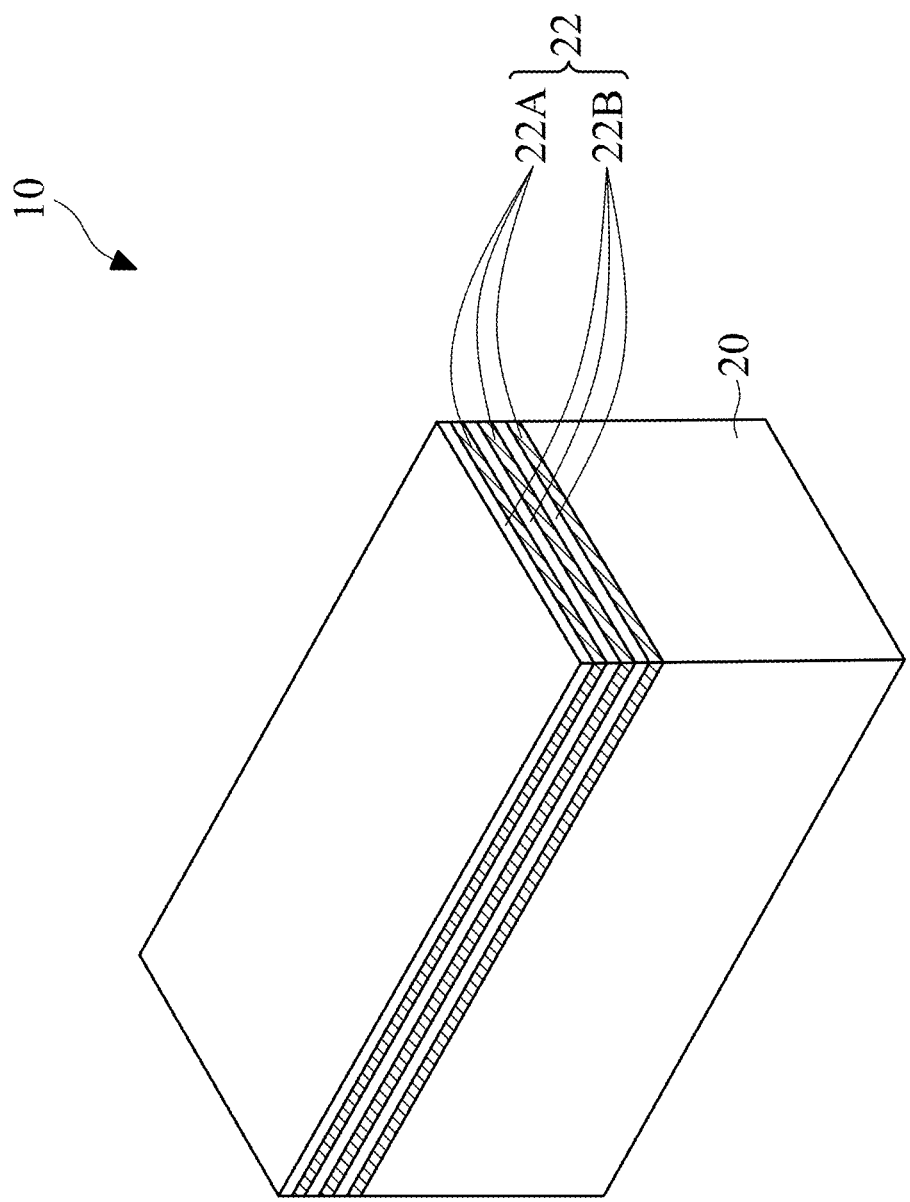

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A structure including a backside powered header cell and contact rails connecting to backside power rails are provided. The method of forming the structure are provided. In accordance with some embodiments, a header cell is formed of a Gate-All-Around (GAA) transistor. A gate isolation region (also referred to as a Cut-Metal-Gate (CMG) region) is formed to cut the gate stacks of transistors. A first contact rail is formed in the CMG region. Accordingly, the first contact rail has a lengthwise direction perpendicular to the lengthwise direction of the gate stacks. The contact rail is connected to a source region of an ungated backside power rail that carries ungated power supply voltage TVDD, which is on a backside of a respective semiconductor substrate. The drain region of the header cell is connected to a second contact rail that is in a second CMG region. The second contact rail is connected to a gated backside power rail that carries ungated power supply voltage VVDD.

It is appreciated that although header cells and GAA transistors are used as examples, the concept of the present disclosure are readily available for other types of transistors and applications including and not limited to, non-header-cell applications, Fin Field-Effect Transistors (FinFETs), planar transistors, and the like. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1-4, 5A, 5B, 6A, 6B, 7A, 7B, 8A, 8B, 9A, 9B, 10A, 10B, 10C, 11A, 11B, 12A, 12B, 13A, 13B, 14-1, 14-2, 15A, 15B, 16A, 16B, 17A, 17B, 18, 19, 20A, 20B, 21A, 21B, 22-24, 25A, 25B, 25C, 26A, 26B, 26C, 27A, 27B, 28, and 29 illustrate the perspective views, cross-sectional views, and top views (layouts) of intermediate stages in the formation of a header cell, contact rails, and via rails in accordance with some embodiments. The corresponding processes are also reflected schematically in the process flow shown in FIG. 40.

Referring to FIG. 1, a perspective view of wafer 10 is shown. Wafer 10 includes a multilayer structure comprising multilayer stack 22 on substrate 20. In accordance with some embodiments, substrate 20 is a semiconductor substrate, which may be a silicon substrate, a silicon germanium (SiGe) substrate, or the like, while other substrates and/or structures, such as semiconductor-on-insulator (SOI), strained SOI, silicon germanium on insulator, or the like, could be used. Substrate 20 may be doped as a p-type semiconductor, although in other embodiments, it may be doped as an n-type semiconductor.

Figure 40:
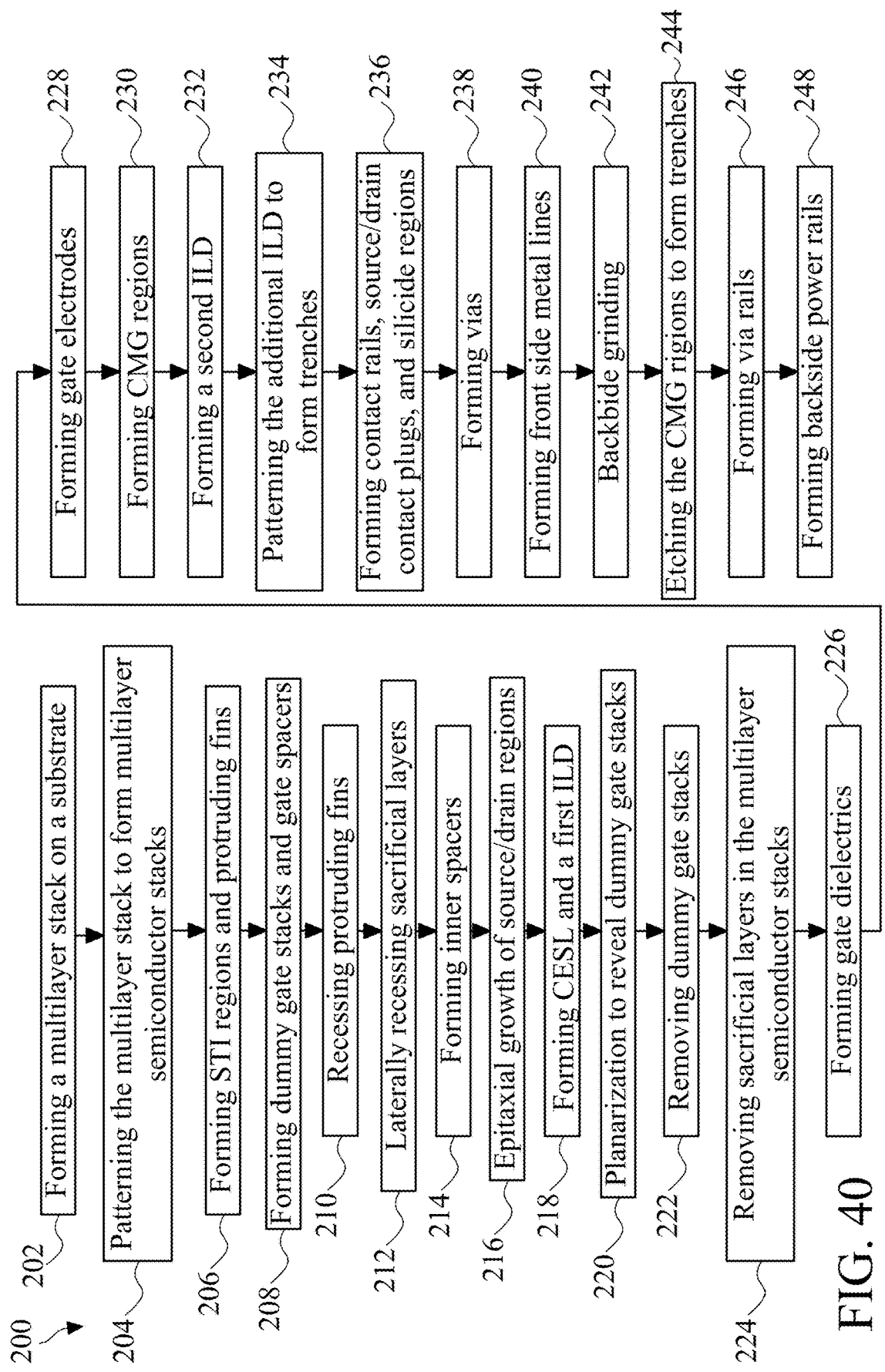
FIG. 40 illustrates a process flow for forming a header cell, contact rails, and via rails in accordance with some embodiments.

In accordance with some embodiments, multilayer stack 22 is formed through a series of epitaxy processes for depositing alternating materials. The respective process is illustrated as process 202 in the process flow 200 as shown in FIG. 40. In accordance with some embodiments, multilayer stack 22 comprises first layers 22A formed of a first semiconductor material and second layers 22B formed of a second semiconductor material different from the first semiconductor material. Due to the epitaxy, the first layers 22A and the second layers 22B have the same lattice orientations as substrate 20.

In accordance with some embodiments, the first semiconductor material of a first layer 22A is formed of or comprises SiGe, Ge, Si, GaAs, InSb, GaSb, InAlAs, InGaAs, GaSbP, GaAsSb, or the like. In accordance with some embodiments, the deposition of first layers 22A (for example, SiGe) is through epitaxial growth, and the corresponding deposition method may be Vapor-Phase Epitaxy (VPE), Molecular Beam Epitaxy (MBE), Chemical Vapor deposition (CVD), Low Pressure CVD (LPCVD), Atomic Layer Deposition (ALD), Ultra High Vacuum CVD (UHVCVD), Reduced Pressure CVD (RPCVD), or the like. In accordance with some embodiments, the first layer 22A is formed to a first thickness in the range between about 30 Å and about 300 Å. However, any suitable thickness may be utilized while remaining within the scope of the embodiments.

Once the first layer 22A has been deposited over substrate 20, a second layer 22B is deposited over the first layer 22A. In accordance with some embodiments, the second layers 22B is formed of or comprises a second semiconductor material such as Si, SiGe, Ge, GaAs, InSb, GaSb, InAlAs, InGaAs, GaSbP, GaAsSb, combinations of these, or the like, with the second semiconductor material being different from the first semiconductor material of first layer 22A. For example, in accordance with some embodiments in which the first layer 22A is silicon germanium, the second layer 22B may be formed of silicon, or vice versa. It is appreciated that any suitable combination of materials may be utilized for first layers 22A and the second layers 22B.

In accordance with some embodiments, the second layer 22B is epitaxially grown on the first layer 22A using a deposition technique similar to that is used to form the first layer 22A. In accordance with some embodiments, the second layer 22B is formed to a similar thickness to that of the first layer 22A. The second layer 22B may also be formed to a thickness that is different from the first layer 22A. In accordance with some embodiments, the second layer 22B may be formed to a second thickness in the range between about 10 Å and about 500 Å, for example.

Once the second layer 22B has been formed over the first layer 22A, the deposition process is repeated to form the remaining layers in multilayer stack 22, until a desired topmost layer of multilayer stack 22 has been formed. In accordance with some embodiments, first layers 22A have thicknesses the same as or similar to each other, and second layers 22B have thicknesses the same as or similar to each other. First layers 22A may also have the same thicknesses as, or different thicknesses from, that of second layers 22B. In accordance with some embodiments, first layers 22A are removed in the subsequent processes, and are alternatively referred to as sacrificial layers 22A throughout the description. In accordance with alternative embodiments, second layers 22B are sacrificial, and are removed in the subsequent processes.

In accordance with some embodiments, there are some pad oxide layer(s) and hard mask layer(s) (not shown) formed over multilayer stack 22. These layers are patterned, and are used for the subsequent patterning of multilayer stack 22.

Figure 2:
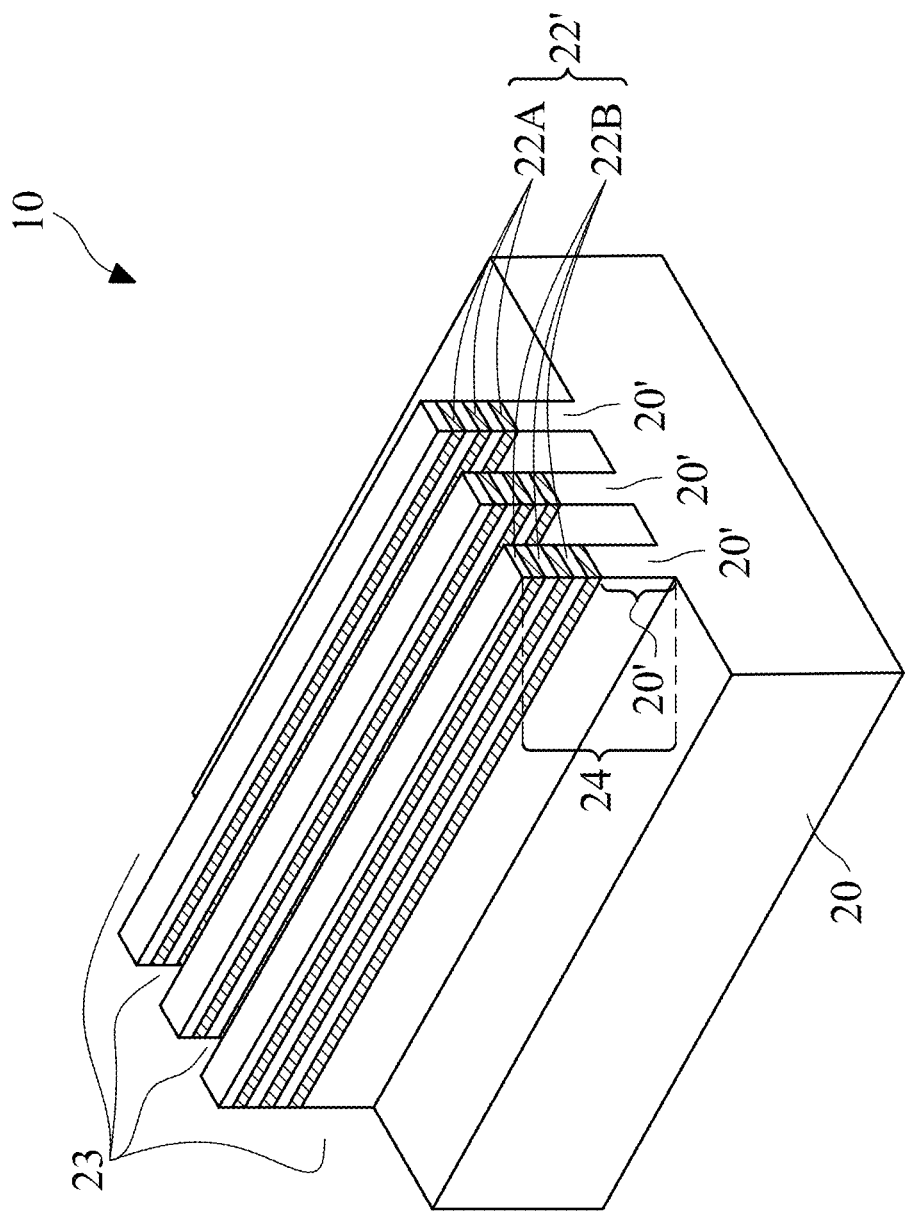

Referring to FIG. 2, multilayer stack 22 and a portion of the underlying substrate 20 are patterned in an etching process(es), so that trenches 23 are formed. The respective process is illustrated as process 204 in the process flow 200 as shown in FIG. 40. Trenches 23 extend into substrate 20. The remaining portions of multilayer stacks are referred to as multilayer stacks 22' hereinafter. Underlying multilayer stacks 22', some portions of substrate 20 are left, and are referred to as substrate strips 20' hereinafter. Multilayer stacks 22' include semiconductor layers 22A and 22B. Semiconductor layers 22A are alternatively referred to as sacrificial layers, and Semiconductor layers 22B are alternatively referred to as nanostructures hereinafter. The portions of multilayer stacks 22' and the underlying substrate strips 20' are collectively referred to as semiconductor strips 24.

In above-illustrated embodiments, the GAA transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figure 3:
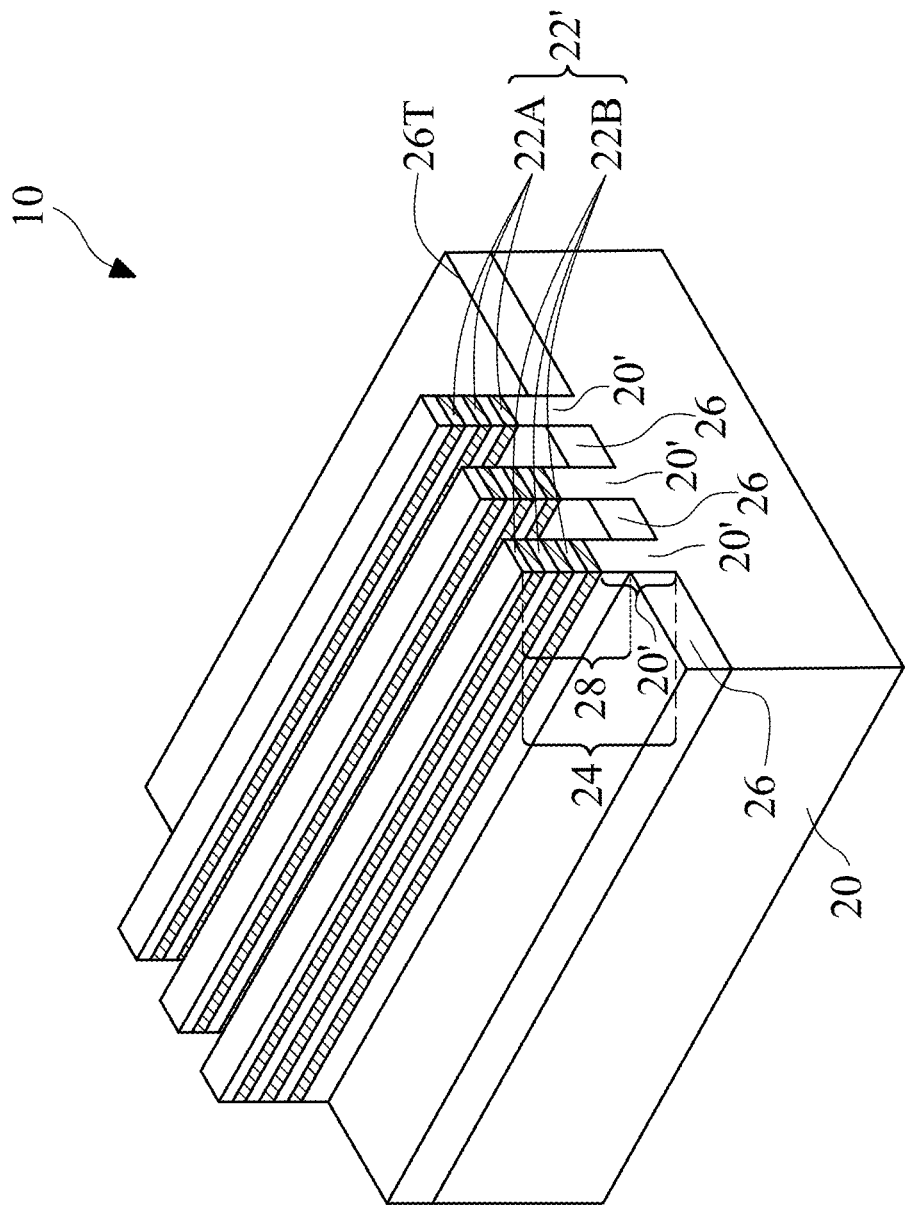

FIG. 3 illustrates the formation of isolation regions 26, which are also referred to as Shallow Trench Isolation (STI) regions throughout the description. The respective process is illustrated as process 206 in the process flow 200 as shown in FIG. 40. STI regions 26 may include a liner oxide (not shown), which may be a thermal oxide formed through the thermal oxidation of a surface layer of substrate 20. The liner oxide may also be a deposited silicon oxide layer formed using, for example, ALD, High-Density Plasma Chemical Vapor Deposition (HDPCVD), CVD, or the like. STI regions 26 may also include a dielectric material over the liner oxide, wherein the dielectric material may be formed using Flowable Chemical Vapor Deposition (FCVD), spin-on coating, HDPCVD, or the like. A planarization process such as a Chemical Mechanical Polish (CMP) process or a mechanical grinding process may then be performed to level the top surface of the dielectric material, and the remaining portions of the dielectric material are STI regions 26.

STI regions 26 are then recessed, so that the top portions of semiconductor strips 24 protrude higher than the top surfaces 26T of the remaining portions of STI regions 26 to form protruding fins 28. Protruding fins 28 include multi-layer stacks 22' and the top portions of substrate strips 20'. The recessing of STI regions 26 may be performed through a dry etching process, wherein $NF_3$ and $NH_3$, for example, are used as the etching gases. During the etching process, plasma may be generated. Argon may also be included. In accordance with alternative embodiments of the present disclosure, the recessing of STI regions 26 is performed through a wet etching process. The etching chemical may include HF, for example.

Figure 4:
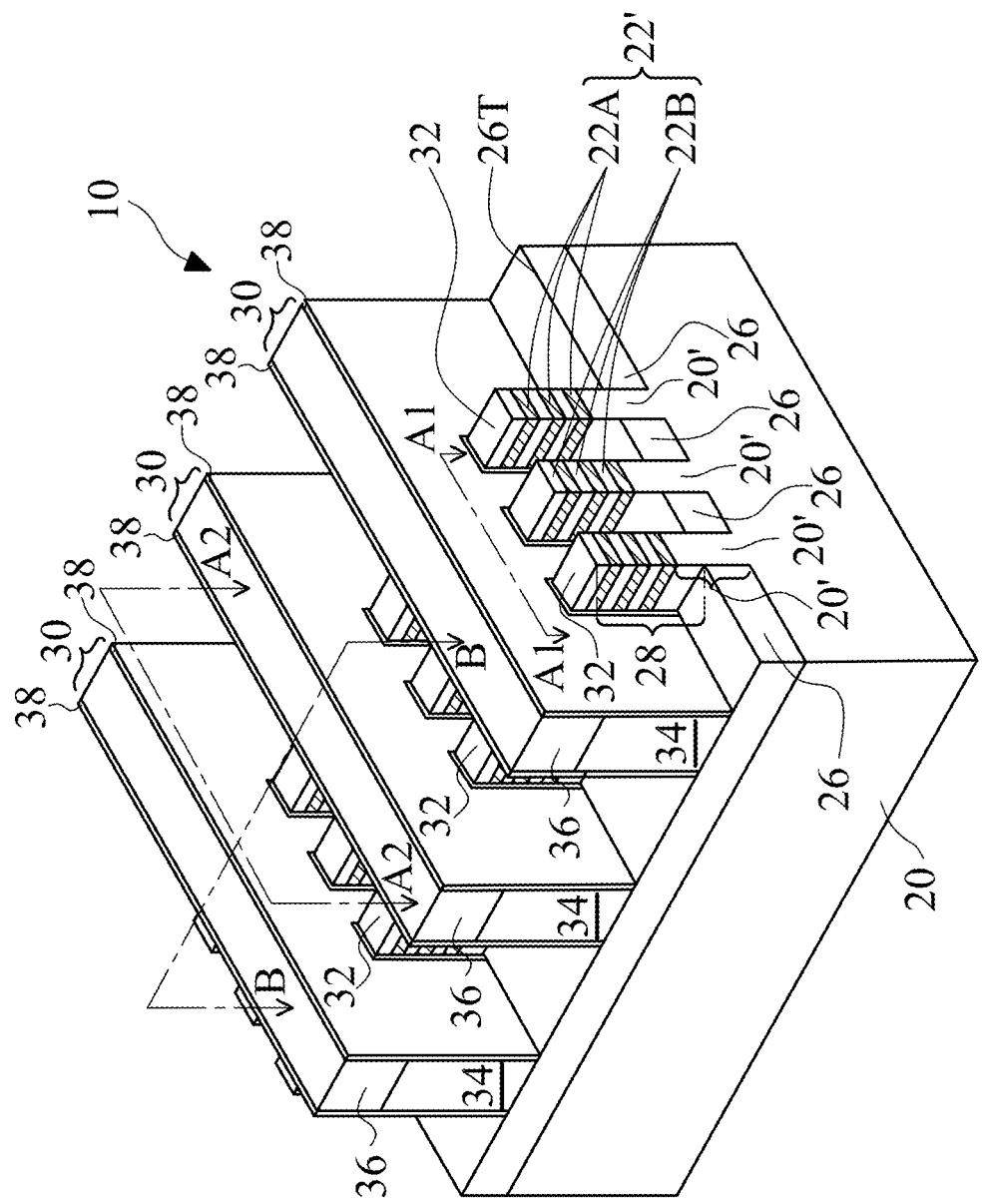

Referring to FIG. 4, dummy gate stacks 30 and gate spacers 38 are formed on the top surfaces and the sidewalls of (protruding) fins 28. The respective process is illustrated as process 208 in the process flow 200 as shown in FIG. 40. Dummy gate stacks 30 may include dummy gate dielectrics 32 and dummy gate electrodes 34 over dummy gate dielectrics 32. Dummy gate dielectrics 32 may be formed by oxidizing the surface portions of protruding fins 28 to form oxide layers, or by depositing a dielectric layer such as a silicon oxide layer. Dummy gate electrodes 34 may be formed, for example, using polysilicon or amorphous silicon, and other materials such as amorphous carbon may also be used.

Each of dummy gate stacks 30 may also include one (or a plurality of) hard mask layer 36 over dummy gate electrode 34. Hard mask layers 36 may be formed of silicon nitride, silicon oxide, silicon carbo-nitride, silicon oxy-carbo nitride, or multilayers thereof. The formation of dummy gate stacks 30 includes forming a dummy gate dielectric layer, depositing a dummy gate electrode layer over the dummy gate dielectric layer, depositing one or more hard mask layers, and then patterning the formed layers through a pattering process(es).

Next, gate spacers 38 are formed on the sidewalls of dummy gate stacks 30. In accordance with some embodiments of the present disclosure, gate spacers 38 are formed of a dielectric material such as silicon nitride (SiN), silicon oxide ($SiO_2$), silicon carbo-nitride (SiCN), silicon oxynitride (SiON), silicon oxy-carbo-nitride (SiOCN), or the like, and may have a single-layer structure or a multilayer structure including a plurality of dielectric layers. The formation process of gate spacers 38 may include depositing one or a plurality of dielectric layers, and then performing an anisotropic etching process(es) on the dielectric layer(s). The remaining portions of the dielectric layer(s) are gate spacers 38.

Figure 5A:
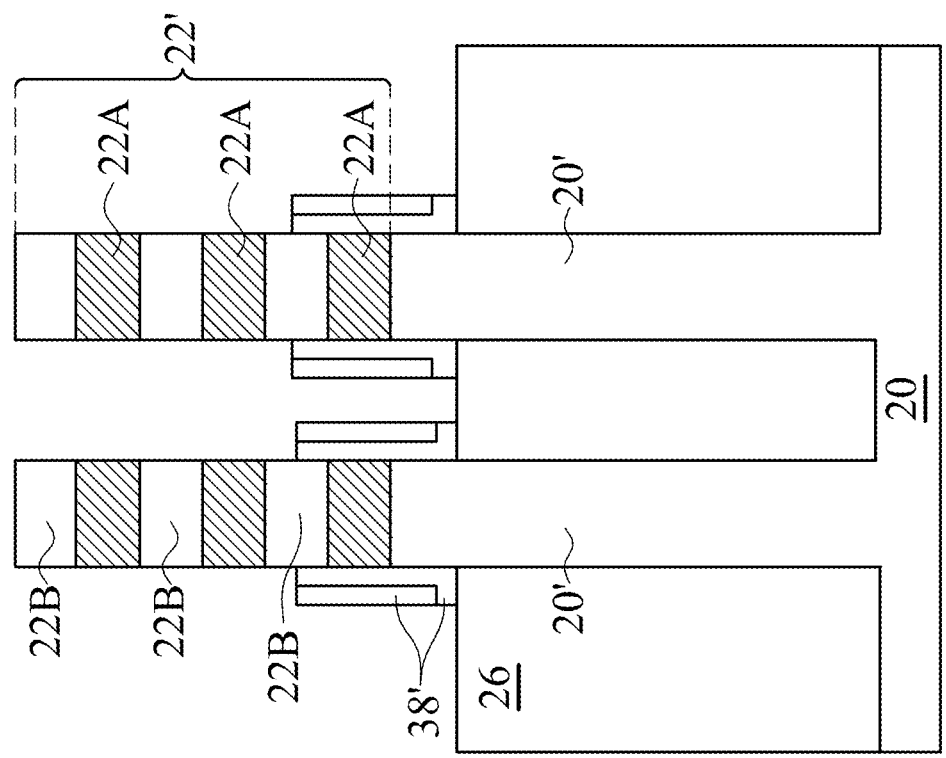
Figure 5B:
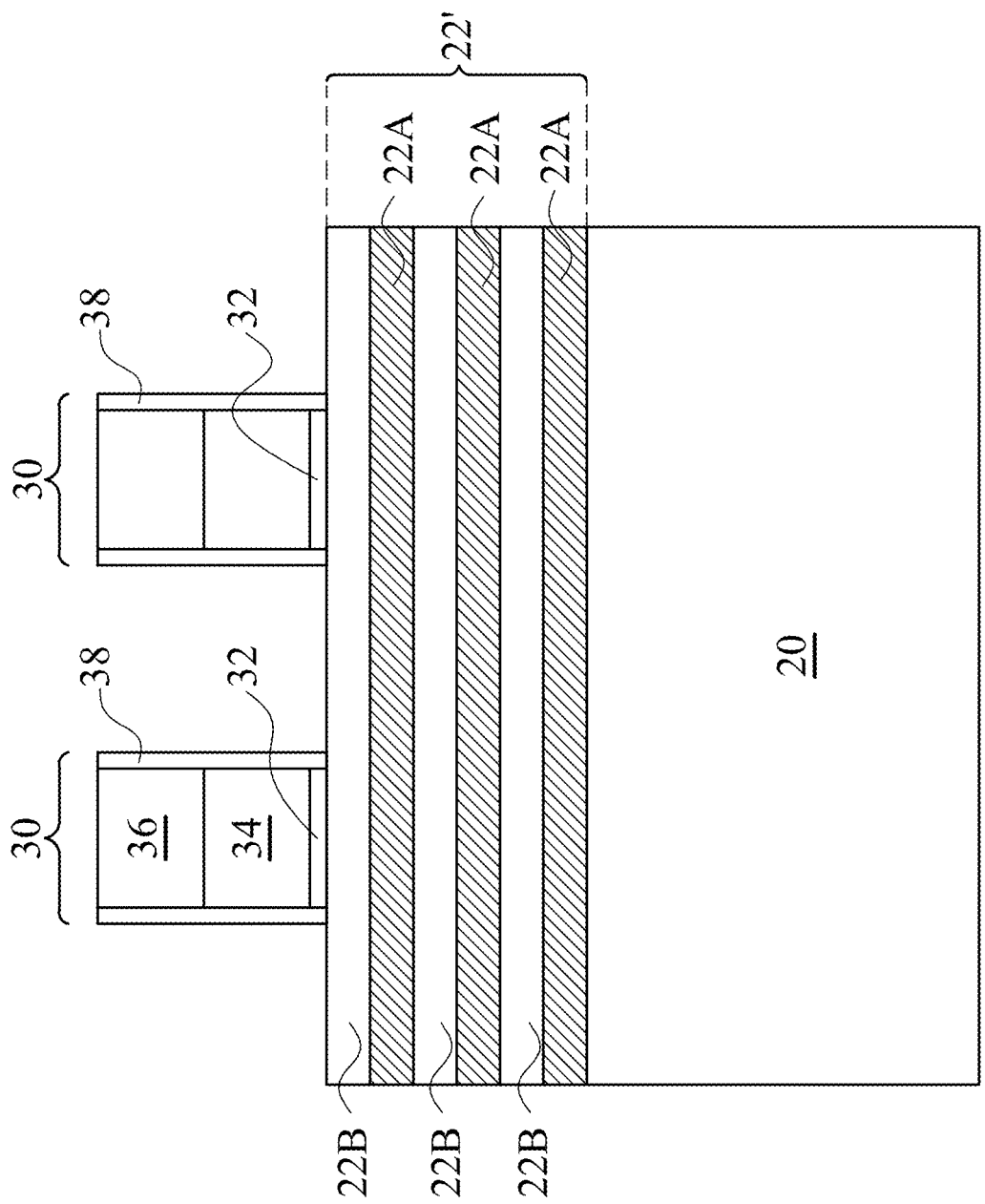

FIGS. 5A and 5B illustrate the cross-sectional views of the structure shown in FIG. 4. FIG. 5A illustrates the reference cross-section A1-A1 in FIG. 4, which cross-section cuts through the portions of protruding fins 28 not covered by gate stacks 30 and gate spacers 38, and is perpendicular to the gate-length direction. Fin spacers 38' which are on the sidewalls of protruding fins 28, are also illustrated. FIG. 5B illustrates the reference cross-section B-B in FIG. 4, which reference cross-section is parallel to the lengthwise directions of protruding fins 28.

Figure 6A:
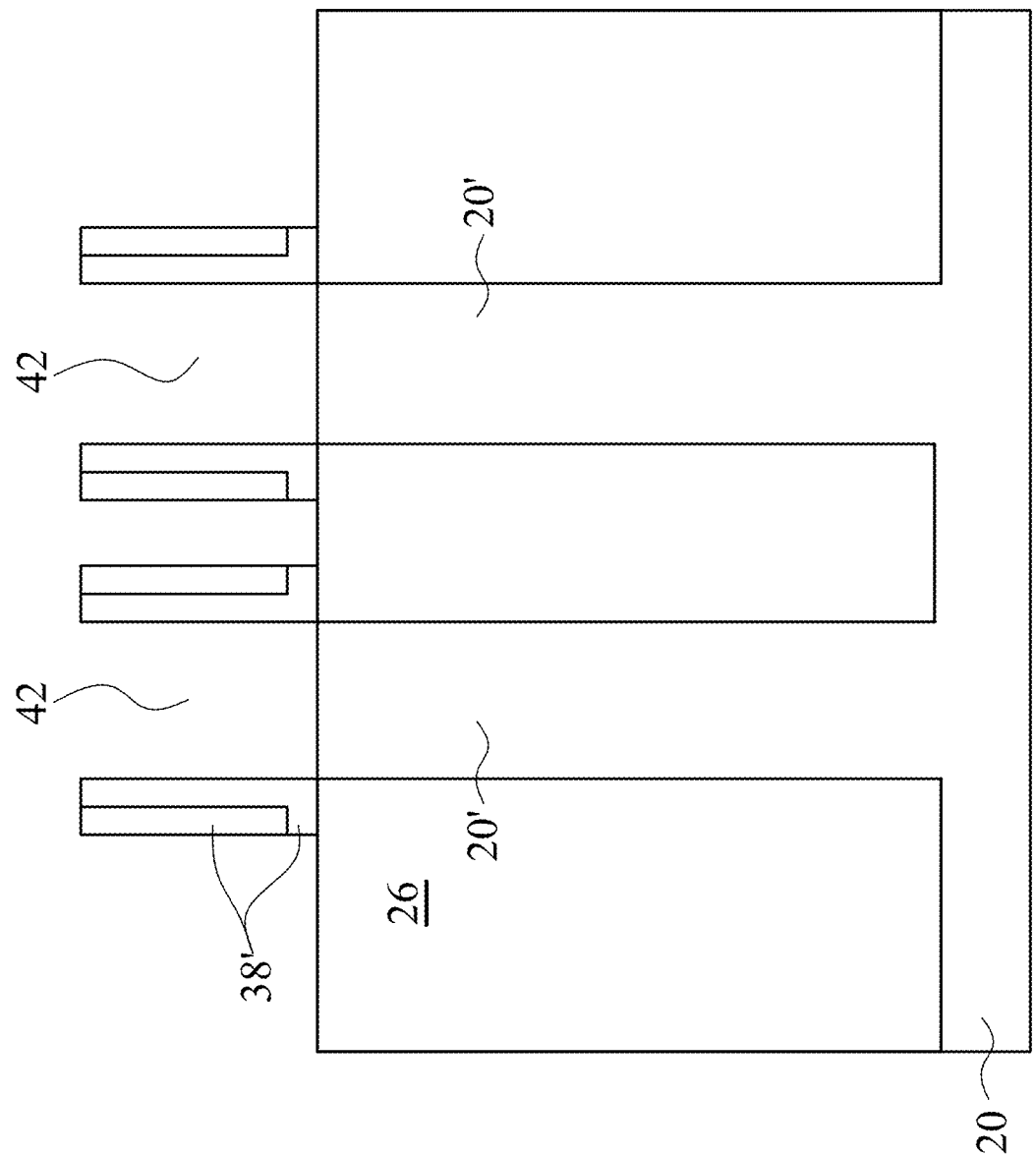
Figure 6B:
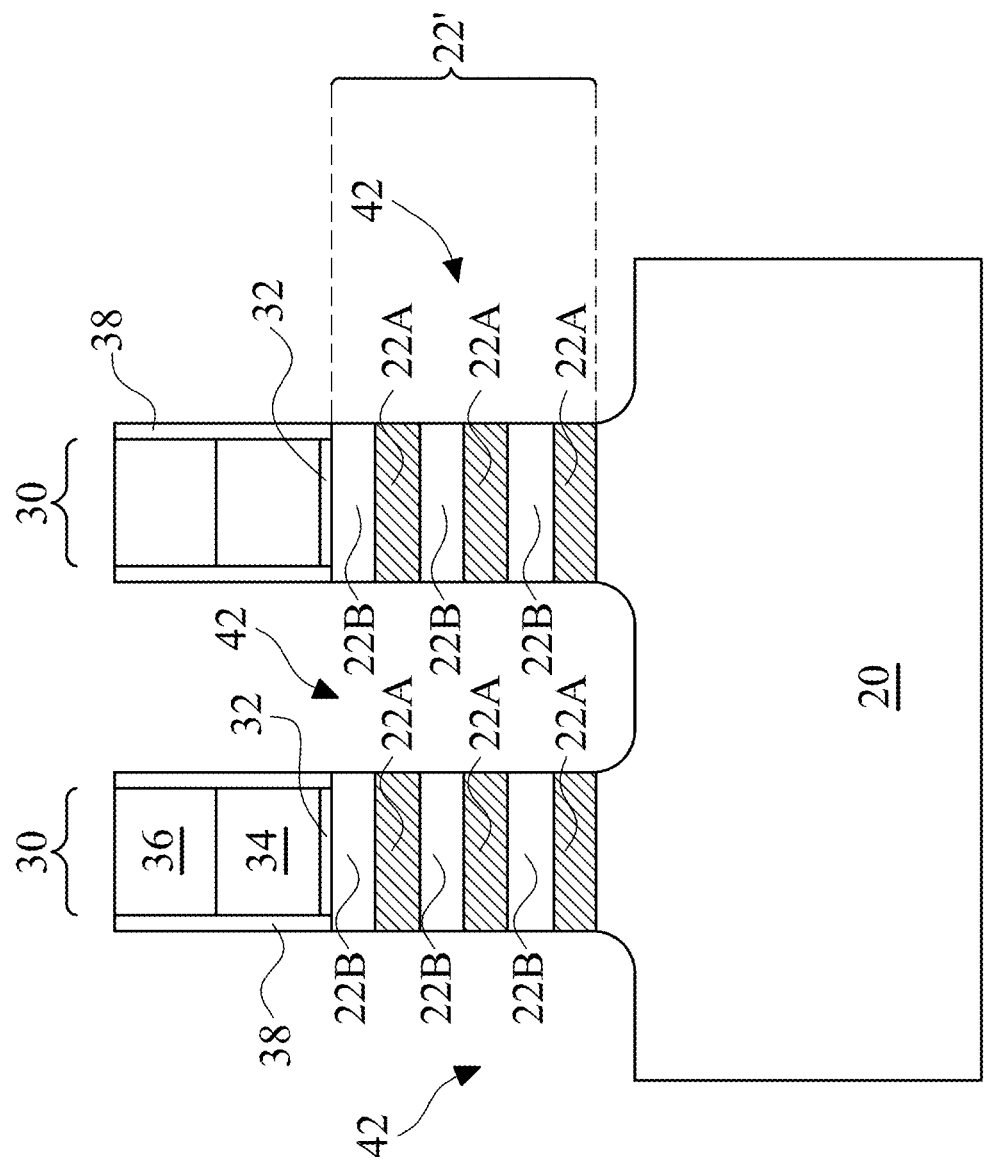

Referring to FIGS. 6A and 6B, the portions of protruding fins 28 that are not directly underlying dummy gate stacks 30 and gate spacers 38 are recessed through an etching process to form recesses 42. The respective process is illustrated as process 210 in the process flow 200 as shown in FIG. 40. The bottoms of recesses 42 are at least level with, or may be lower than (as shown in FIG. 6B), the bottoms of multilayer semiconductor stacks 22'. The etching may be anisotropic, so that the sidewalls of multilayer semiconductor stacks 22' facing recesses 42 are vertical and straight, as shown in FIG. 6B.

Figure 7A:
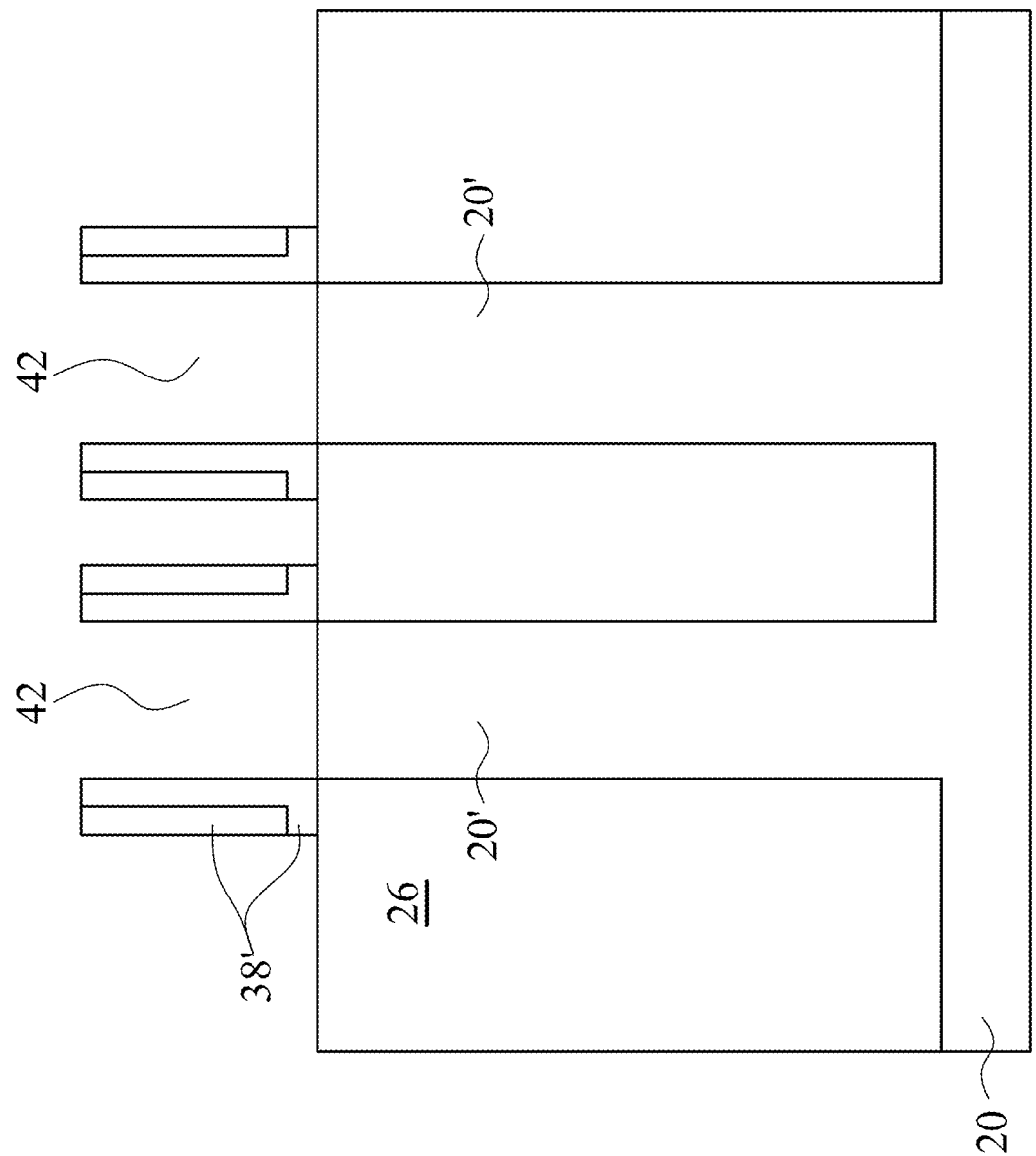
Figure 7B:
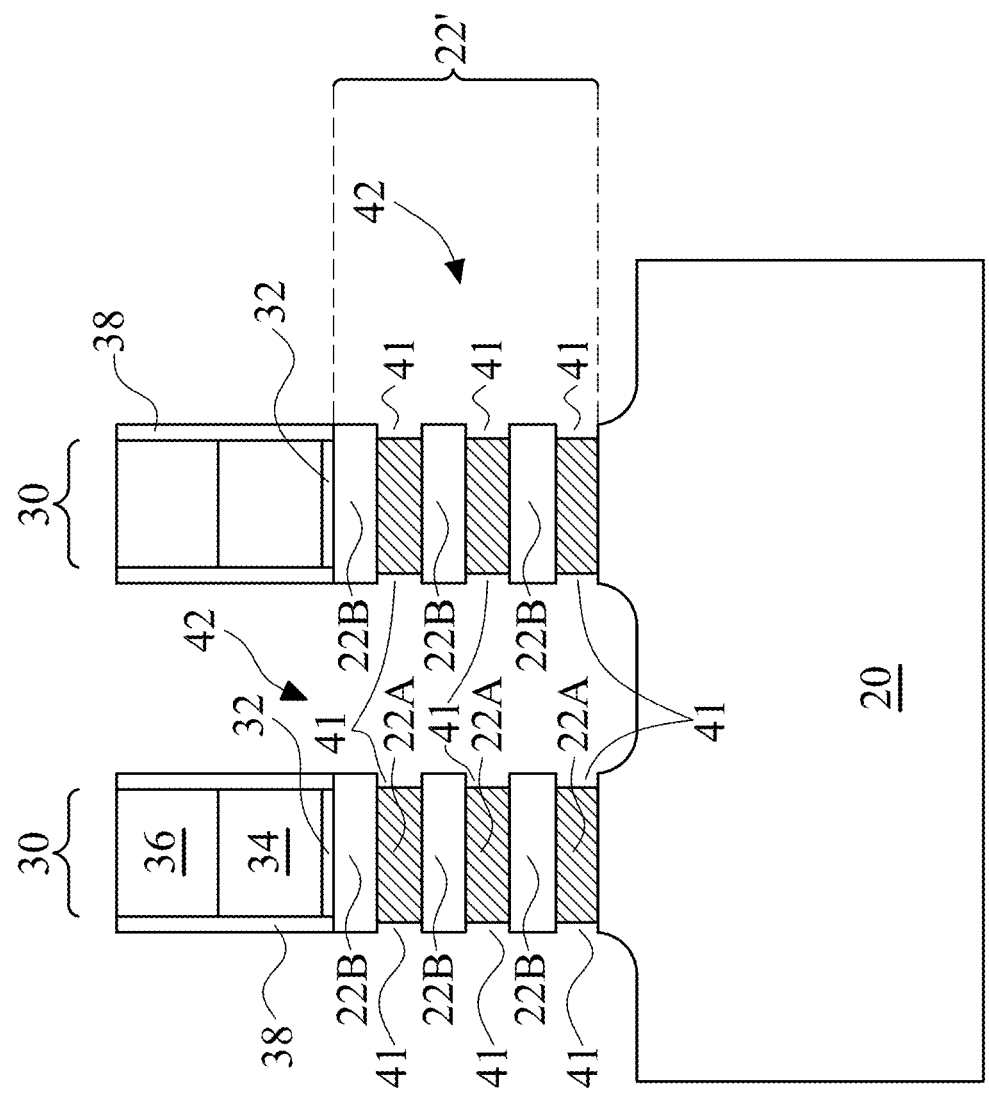

Referring to FIGS. 7A and 7B, sacrificial semiconductor layers 22A are laterally recessed to form lateral recesses 41, which are recessed from the edges of the respective overlying and underlying nanostructures 22B. The respective process is illustrated as process 212 in the process flow 200 as shown in FIG. 40. The lateral recessing of sacrificial semiconductor layers 22A may be achieved through a wet etching process using an etchant that is more selective to the material (for example, silicon germanium (SiGe)) of sacrificial semiconductor layers 22A than the material (for example, silicon (Si)) of the nanostructures 22B and substrate 20. For example, in an embodiment in which sacrificial semiconductor layers 22A are formed of silicon germanium and the nanostructures 22B are formed of silicon, the wet etching process may be performed using an etchant such as hydrochloric acid (HCl). In accordance with alternative embodiments, the lateral recessing of sacrificial semiconductor layers 22A is performed through an isotropic dry etching process or a combination of a dry etching process and a wet etching process.

Figure 8B:
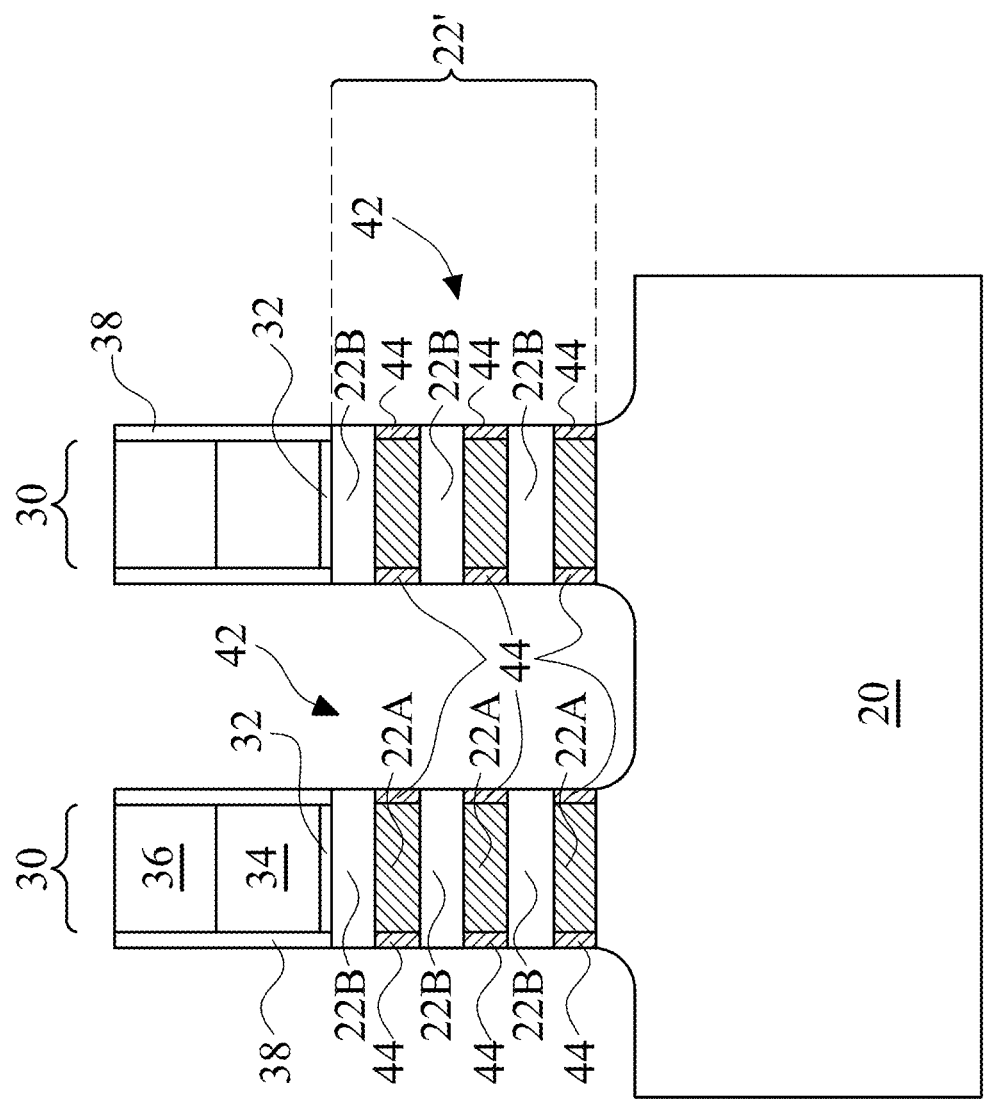

FIGS. 8A and 8B illustrate the formation of inner spacers 44. The respective process is illustrated as process 214 in the process flow 200 as shown in FIG. 40. The formation process incudes depositing a spacer layer extending into recesses 41, and performing an etching process to remove the portions of inner spacer layer outside of recesses 41, thus leaving inner spacers 44 in recesses 41. Inner spacers 44 may be formed of or comprise SiOCN, SiON, SiOC, SiCN, or the like. In accordance with some embodiments, the etching of the spacer layer may be performed through a wet etching process, in which the etching chemical may include $H_2SO_4$, diluted HF, ammonia solution ($NH_4OH$, ammonia in water), or the like, or combinations thereof.

Figure 9A:
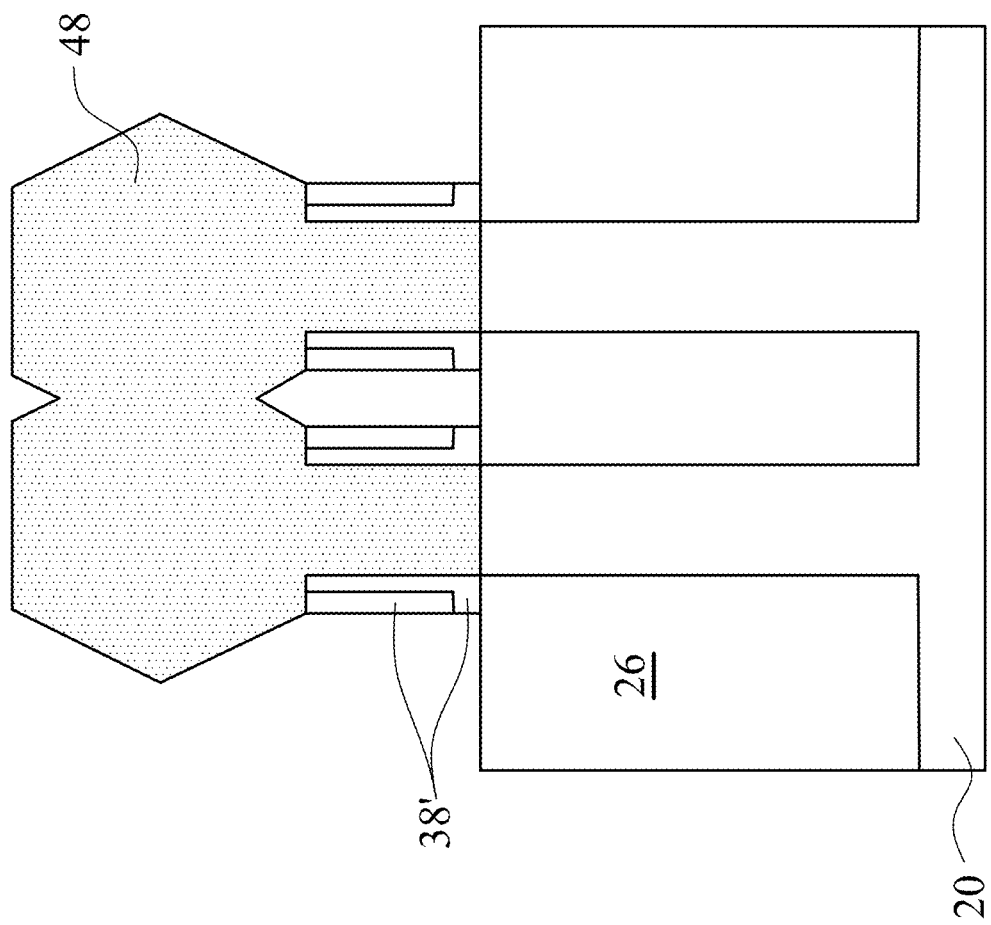
Figure 9B:
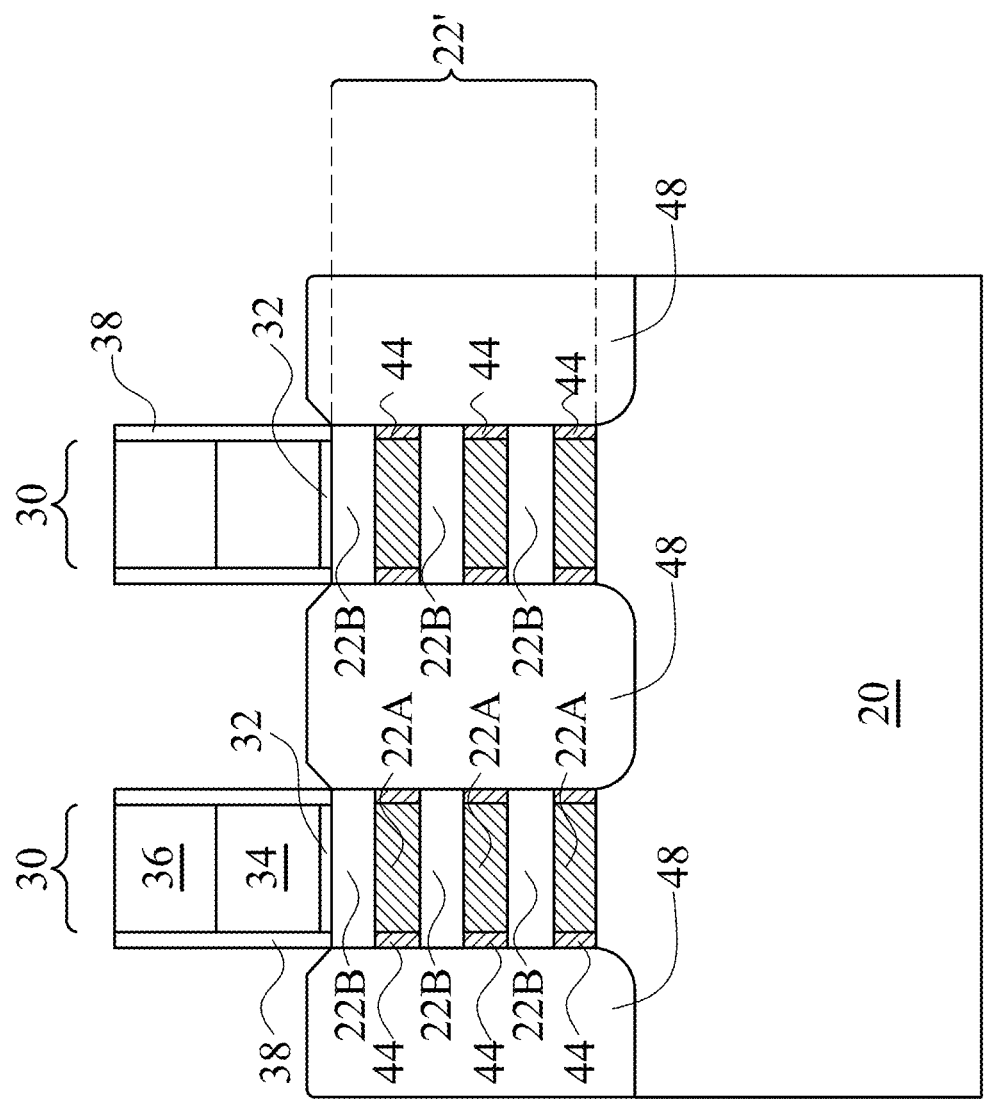

Referring to FIGS. 9A and 9B, epitaxial source/drain regions 48 are formed in recesses 42. The respective process is illustrated as process 216 in the process flow 200 as shown in FIG. 40. In accordance with some embodiments, the source/drain regions 48 may exert stress on the nanostructures 22B, which are used as the channels of the corresponding GAA transistors, thereby improving performance. In accordance with some embodiments, the corresponding transistor is n-type, and epitaxial source/drain regions 48 are accordingly formed as of n-type by doping an n-type dopant. For example, silicon phosphorous (SiP), silicon carbon phosphorous (SiCP), or the like may be grown to form epitaxial source/drain regions 48.

After recesses 42 are filled with epitaxy regions 48, the further epitaxial growth of epitaxy regions 48 causes epitaxy regions 48 to expand horizontally, and facets may be formed. The further growth of epitaxy regions 48 may also cause neighboring epitaxy regions 48 to merge with each other. After the epitaxy process, epitaxy regions 48 may (or may not) be further implanted with an n-type impurity to form source and drain regions, which are also denoted using reference numeral 48.

Figure 10A:
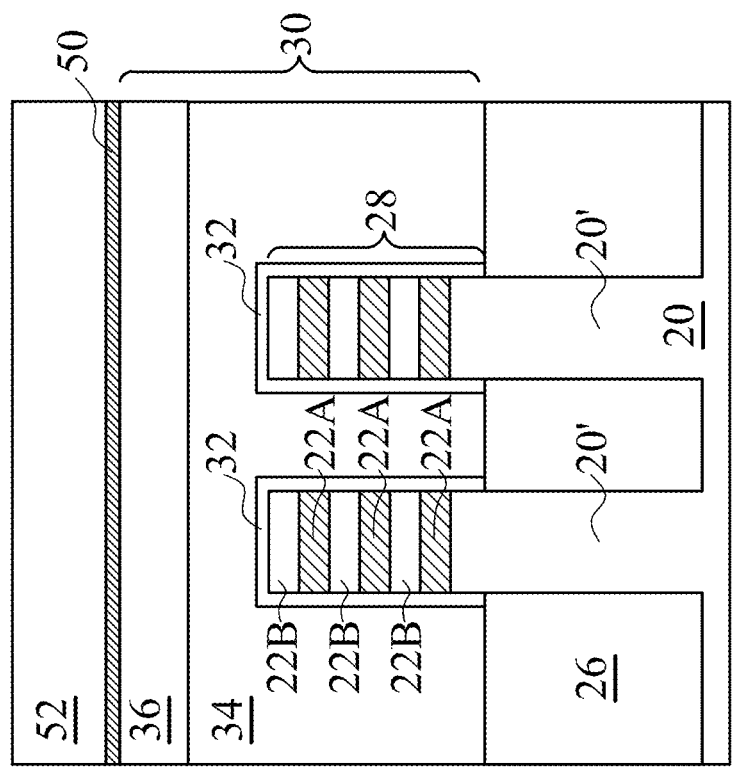
Figure 10B:
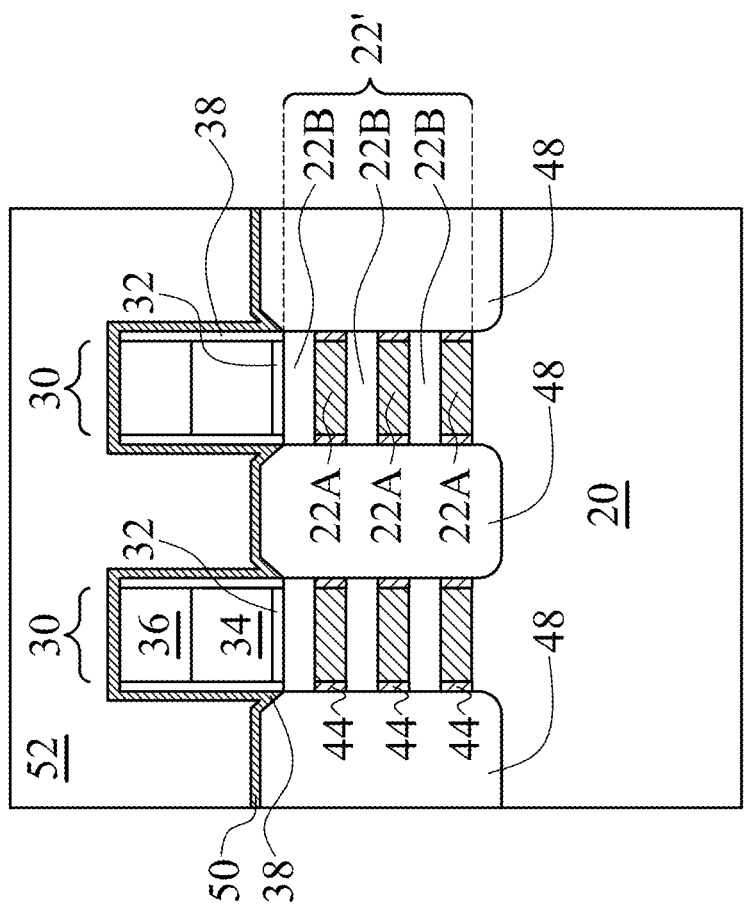
Figure 10C:
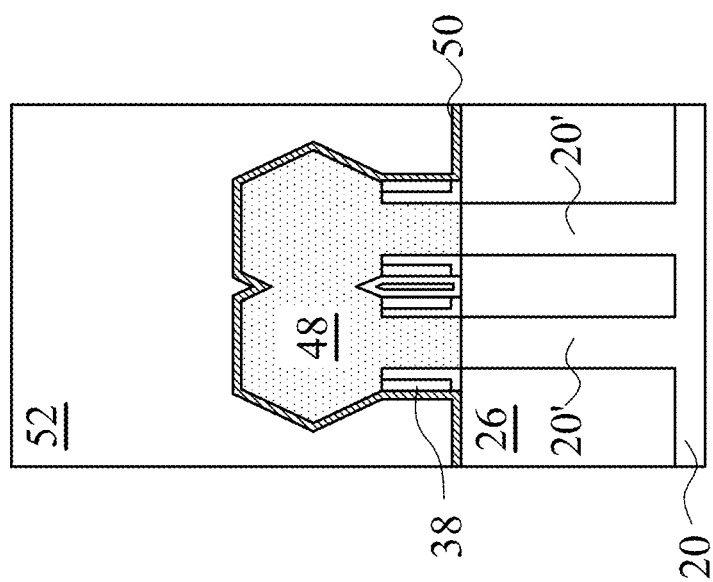

FIGS. 10A, 10B, and 10C illustrate the cross-sectional views of the structure after the formation of Contact Etch Stop Layer (CESL) 50 and Inter-Layer Dielectric (ILD) 52. FIGS. 10A, 10B, and 10C are obtained from the same cross-section same as the cross-sections A2-A2, B-B, and A1-A1, respectively, in FIG. 4. The respective process is illustrated as process 218 in the process flow 200 as shown in FIG. 40. CESL 50 may be formed of silicon oxide, silicon nitride, silicon carbo-nitride, or the like, and may be formed using CVD, ALD, or the like. ILD 52 may include a dielectric material formed using, for example, FCVD, spin-on coating, CVD, or any other suitable deposition method. ILD 52 may be formed of an oxygen-containing dielectric material, which may be a silicon-oxide based such as silicon oxide, Phospho-Silicate Glass (PSG), Boro-Silicate Glass (BSG), Boron-Doped Phospho-Silicate Glass (BPSG), Undoped Silicate Glass (USG), or the like.

Figure 11A:
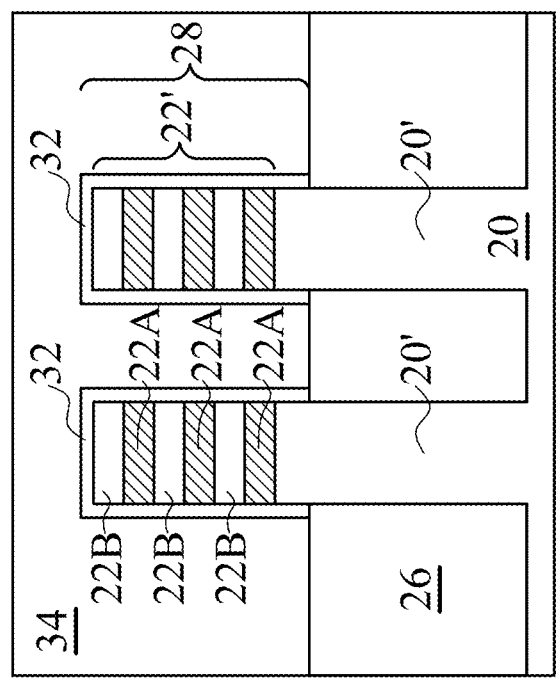
Figure 11B:
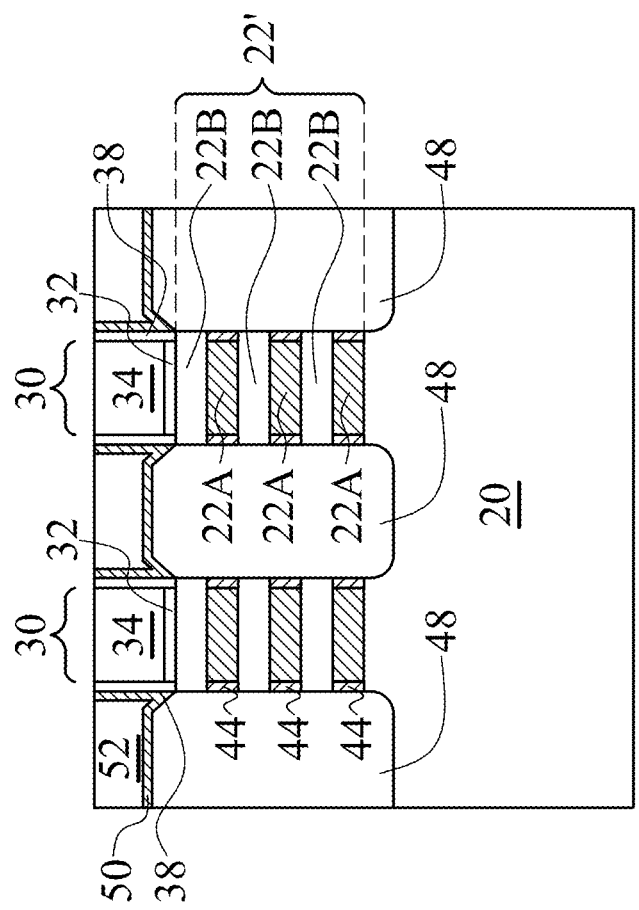

In subsequent processes, replacement gate stacks are formed to replace dummy gate stacks 30. Referring to FIGS. 11A and 11B, a planarization process such as a CMP process or a mechanical grinding process is performed to level the top surface of ILD 52. The respective process is illustrated as process 220 in the process flow 200 as shown in FIG. 40. In accordance with some embodiments, the planarization process may remove hard masks 36 to reveal dummy gate electrodes 34, as shown in FIG. 11B. In accordance with alternative embodiments, the planarization process may reveal, and is stopped on, hard masks 36. In accordance with some embodiments, after the planarization process, the top surfaces of dummy gate electrodes 34 (or hard masks 36), gate spacers 38, and ILD 52 are level with each other within process variations.

Figure 12A:
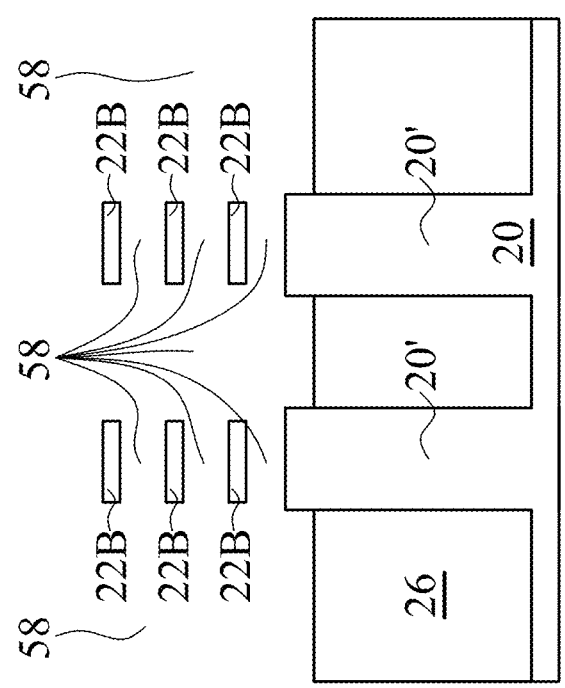
Figure 12B:
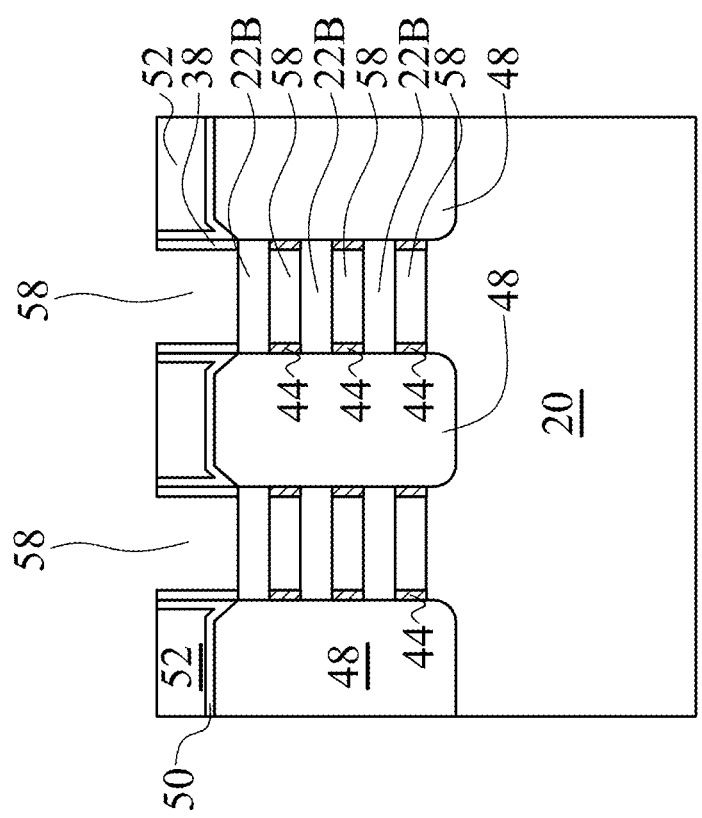

Next, dummy gate electrodes 34 (and hard masks 36, if remaining) are removed in one or more etching processes, so that recesses 58 are formed, as shown in FIGS. 12A and 12B. The respective process is illustrated as process 222 in the process flow 200 as shown in FIG. 40. The portions of the dummy gate dielectrics 32 in recesses 58 are also removed. Sacrificial layers 22A are then removed to extend recesses 58 between nanostructures 22B. The respective process is illustrated as process 224 in the process flow 200 as shown in FIG. 40. Sacrificial layers 22A may be removed by performing an isotropic etching process such as a wet etching process using etchants which are selective to the materials of sacrificial layers 22A. Nanostructures 22B, substrate 20, STI regions 26 remain relatively un-etched as compared to sacrificial layers 22A.

Figure 13A:
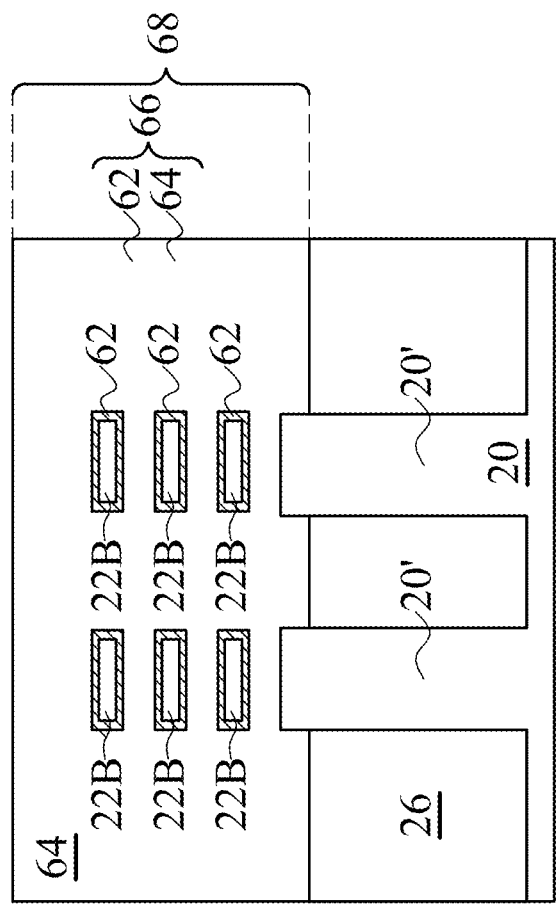
Figure 13B:
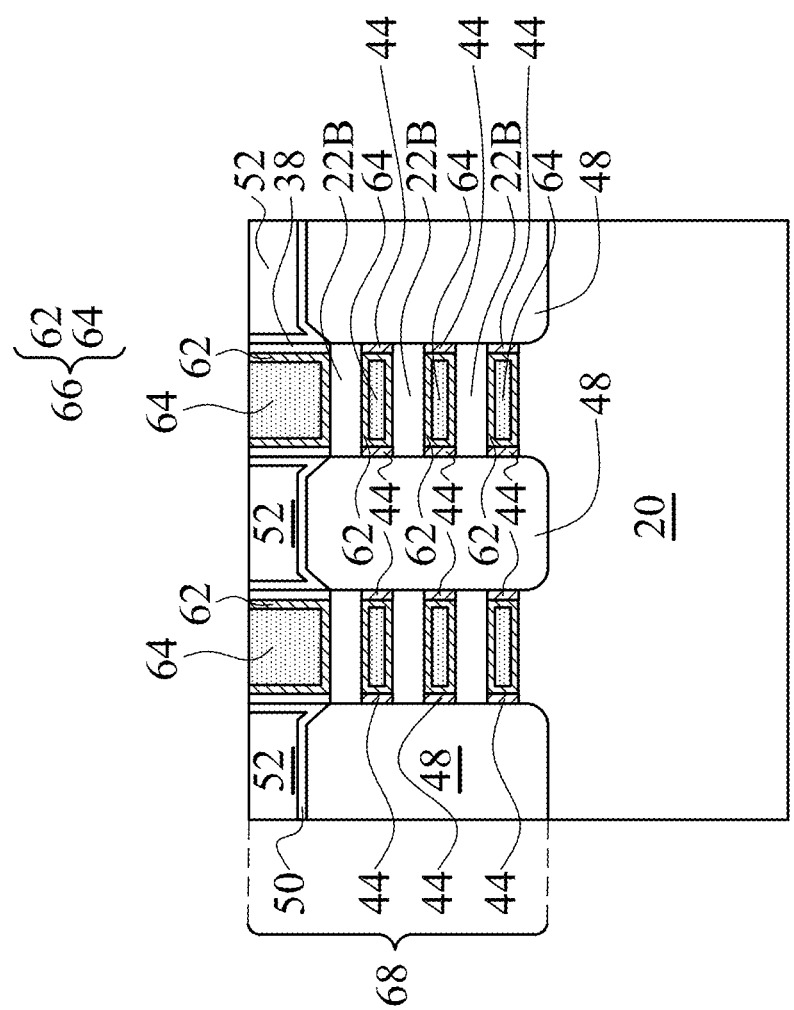

Referring to FIGS. 13A and 13B, gate stacks 66 are formed. Gate dielectrics 62 are first formed. The respective process is illustrated as process 226 in the process flow 200 as shown in FIG. 40. In accordance with some embodiments, each of gate dielectrics 62 may include an interfacial layer and a high-k dielectric layer on the interfacial layer. The interfacial layer may be formed of or comprises silicon oxide, which may be deposited through a conformal deposition process such as ALD or CVD. In accordance with alternative embodiments, the interfacial layer is formed through thermal oxidation. The high-k dielectric layers may comprise one or more dielectric layers. For example, the high-k dielectric layer(s) may include a metal oxide or a silicate of hafnium, aluminum, zirconium, lanthanum, manganese, barium, titanium, lead, or combinations thereof.

Gate electrodes 64 are then formed. In the formation, conductive layers are first formed on the high-k dielectric layer, and fill the remaining portions of recesses 58. The respective process is illustrated as process 228 in the process flow 200 as shown in FIG. 40. Gate electrodes 64 may include a metal-containing material such as TiN, TaN, TiAl, TiAlC, cobalt, ruthenium, aluminum, tungsten, combinations thereof, and/or multilayers thereof. Gate dielectrics 62 and gate electrodes 64 also fill the spaces between adjacent ones of nanostructures 22B, and fill the spaces between the bottom ones of nanostructures 22B and the underlying substrate strips 20'. After the filling of recesses 58, a planarization process such as a CMP process or a mechanical grinding process is performed to remove the excess portions of the gate dielectrics 62 and the material of gate electrodes 64, which excess portions are over the top surface of ILD 52. Gate electrodes 64 and gate dielectrics 62 are collectively referred to as gate stacks 66 of the resulting transistor (nano-FET) 68, which is also a header cell in accordance with some embodiments.

Figures 1, 14:
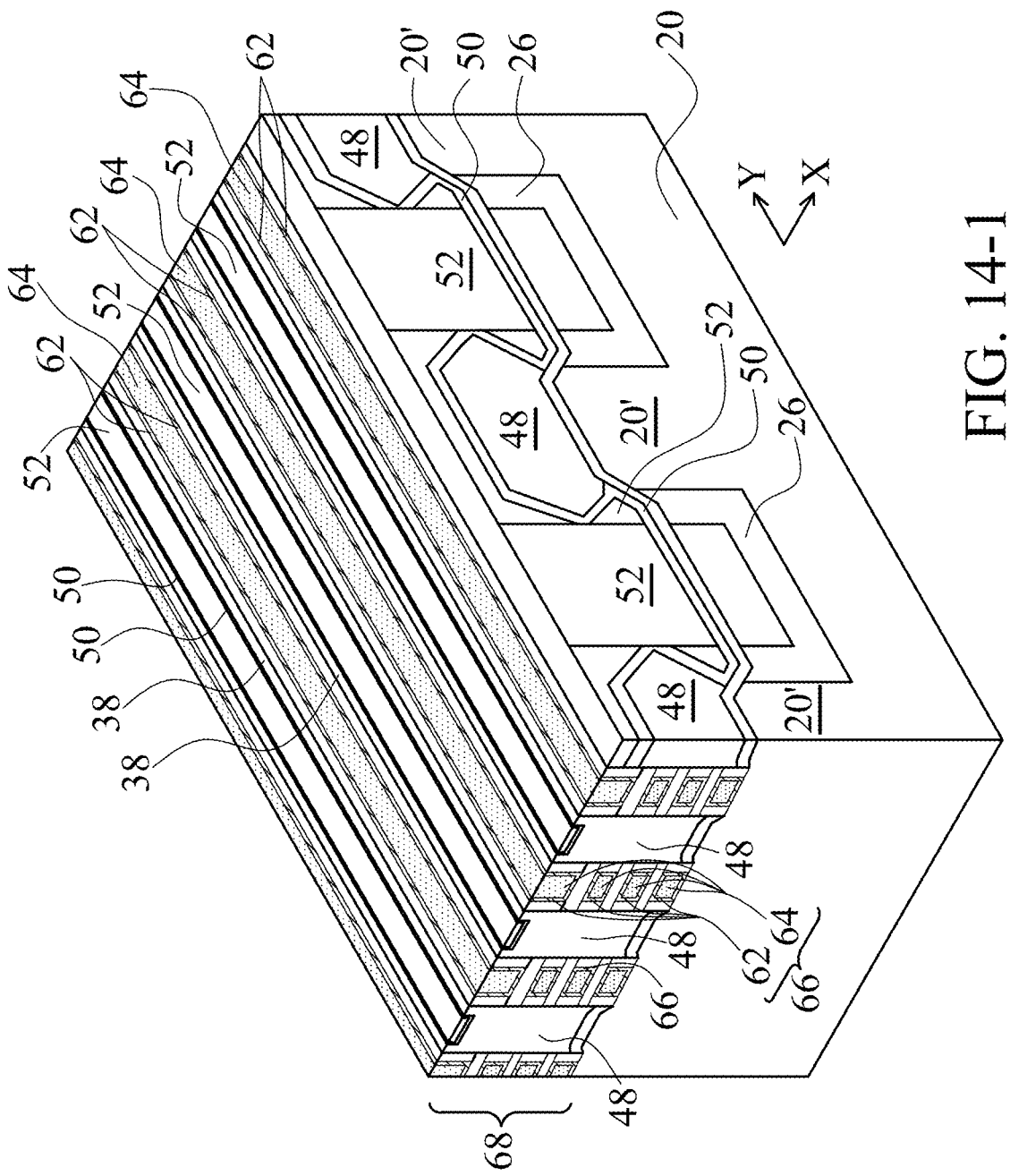
Figures 2, 14:
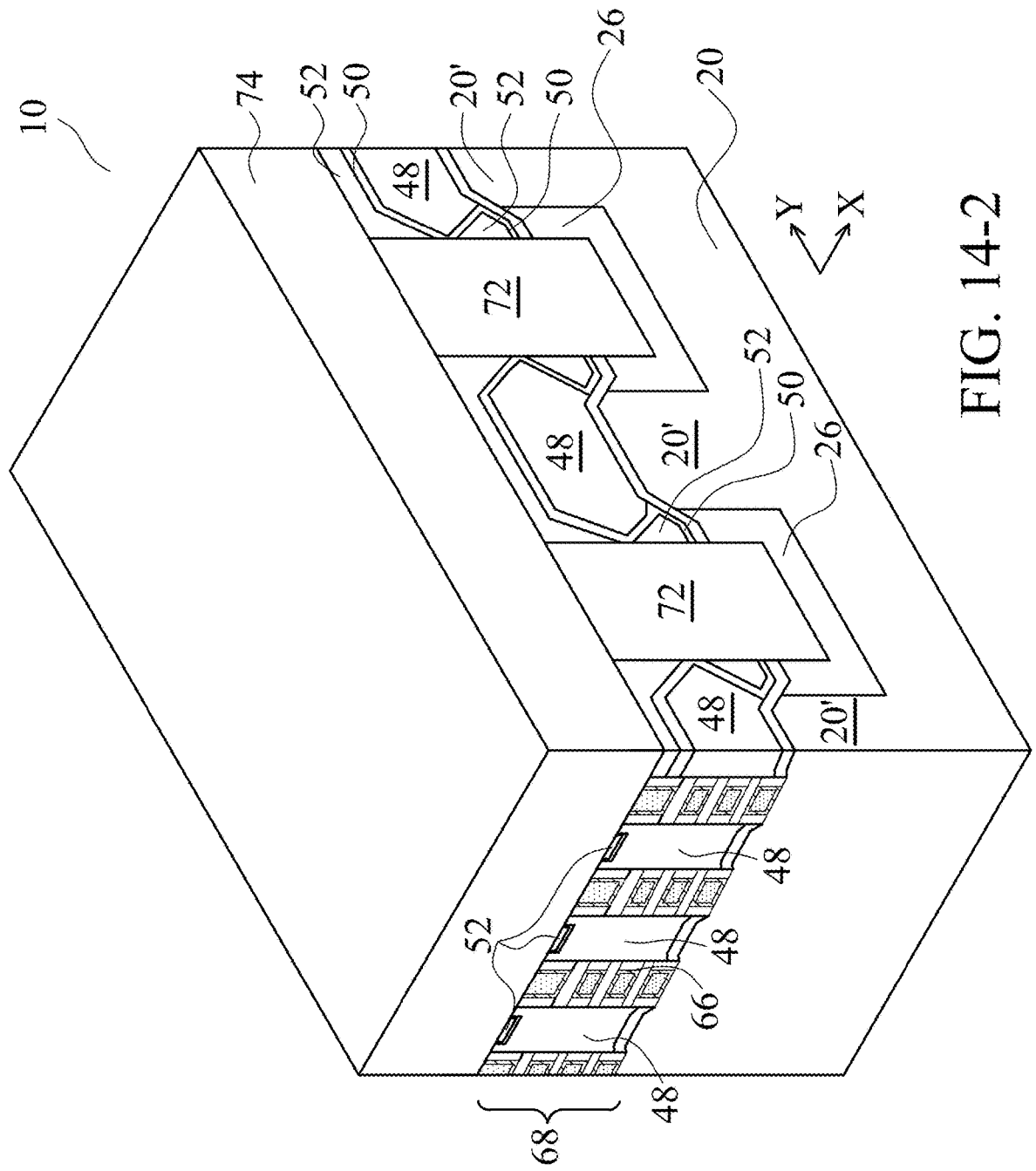
Figure 26A:
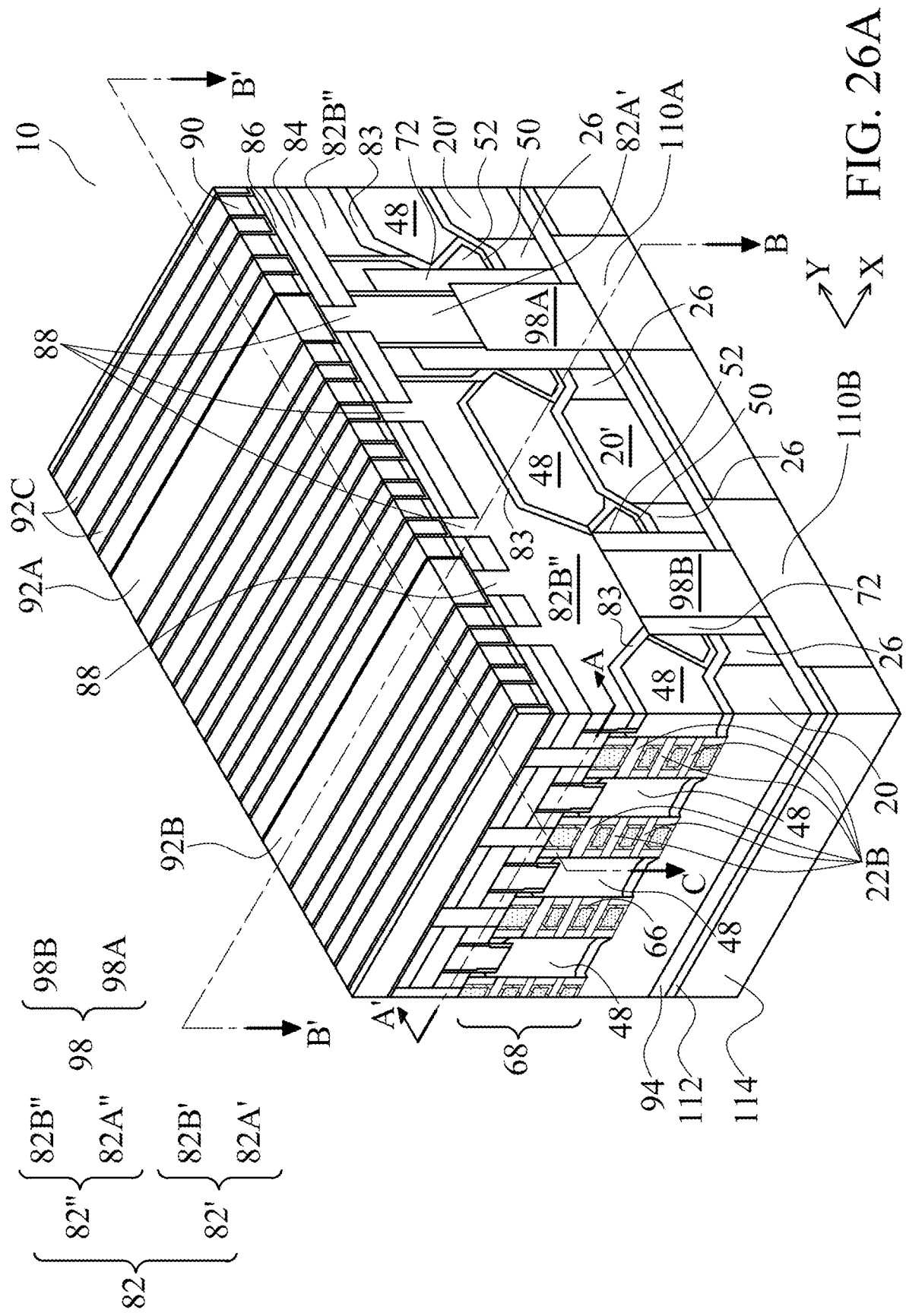

FIGS. 14-1 through 26A illustrate the formation of CMG regions, contact rails, backside power rails, and the connections connecting the backside power rails to source/drain regions of transistor 68. A perspective view of transistor 68 including a plurality of source/drain regions and channel regions is shown in FIG. 14-1 as an example. The transistor 68 may be formed through preceding processes.

Figure 19:
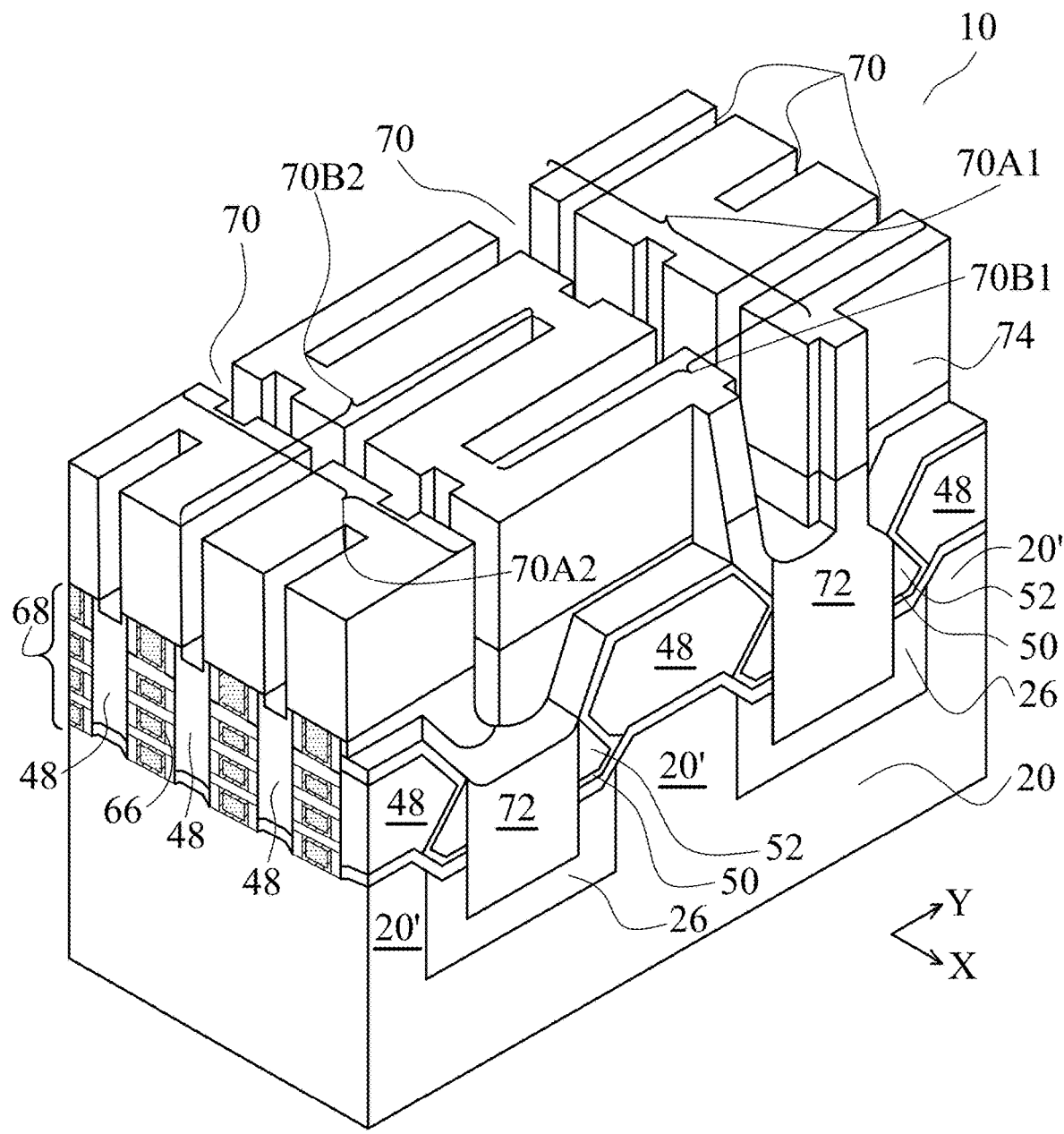

In subsequent FIGS. 14-2 through 19, a plurality of patterning processes are performed to form trenches 70 (FIG. 19), which are used to form contact rails and source/drain contact plugs. It is appreciated that the illustrated formation processes for forming trenches 70 are examples, and different processes may be used.

Referring to FIG. 14-2, CMG regions 72 are formed. The respective process is illustrated as process 230 in the process flow 200 as shown in FIG. 40. The formation process includes etching gate stacks 66, ILD 52, CESL 50, and the underlying STI regions 26 to form trenches, and filling trenches with a dielectric material(s) to form CMG regions 72. Gate stacks 66 have lengthwise directions in the Y-direction, and CMG regions 72 have lengthwise directions in the X-direction. Each of the illustrated CMG regions 72 cuts a plurality of gate stacks 66 (including four in the illustrated region) apart.

Further referring to FIG. 14-2, ILD 74 is formed. The respective process is illustrated as process 232 in the process flow 200 as shown in FIG. 40. The material of ILD 74 may be selected from the same candidate materials for forming ILD 52, and may include silicon oxide, BSG, PSG, BPSG, or the like.

FIGS. 15A, 15B, 16A, 16B, 17A, 17B, 18, and 19 illustrate the formation of a plurality of hard masks, and using the hard masks to pattern ILD 74 in order to form trenches 70. The respective process is illustrated as process 234 in the process flow 200 as shown in FIG. 40.

Figure 15A:
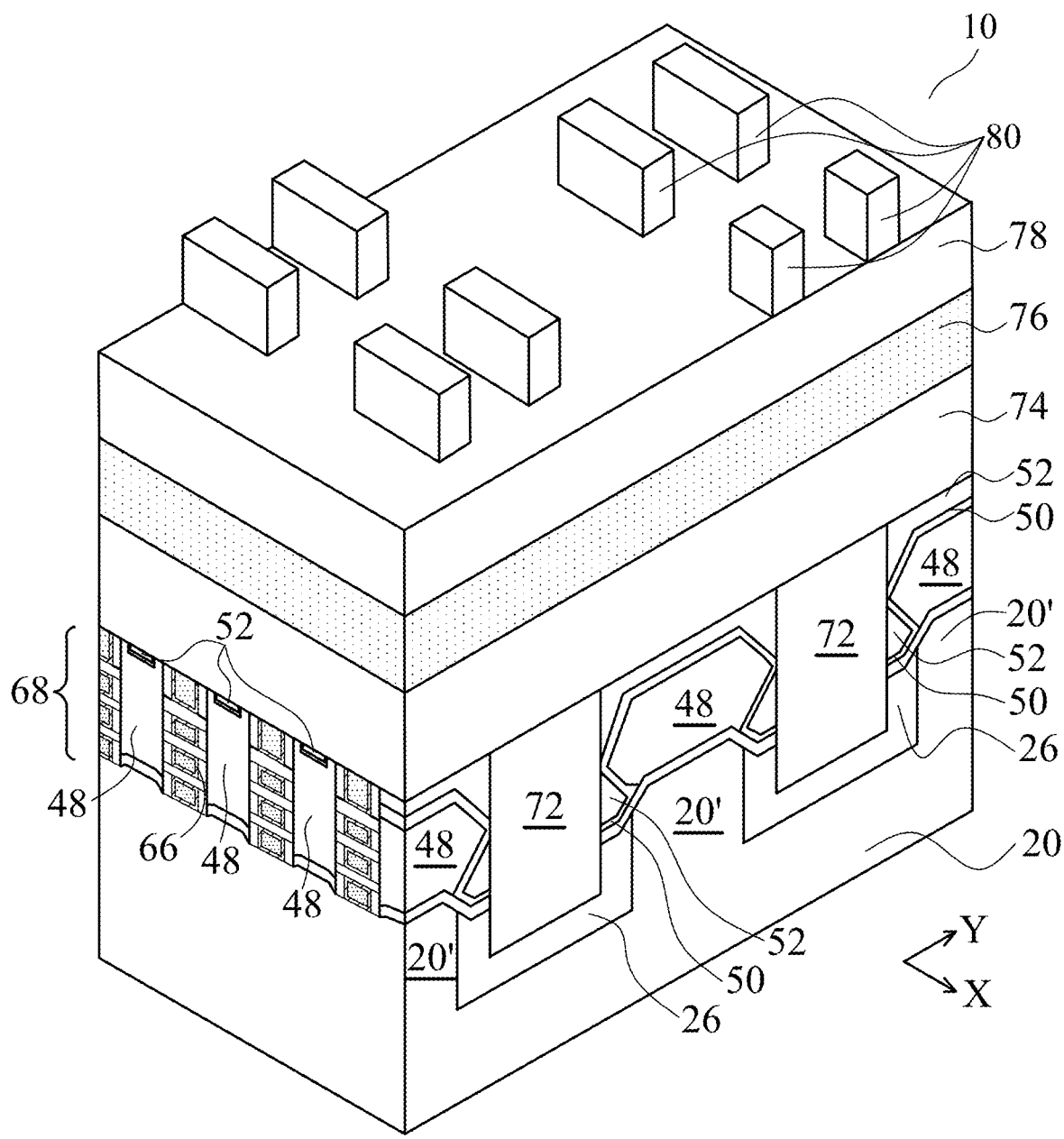

Referring to FIG. 15A, hard masks 76 and 78 are deposited. In accordance with some embodiments, hard mask 76 is formed of or comprises a material selected from tungsten carbide (WC) or a metal oxide such as LaO, AlO, AlON, ZrO, HfO, ZnO, ZrN, ZrAlO, TiO, TaO, YO, or the like, or combinations thereof. Hard mask 78 may comprise a material different from the material of hard mask 76. In accordance with some embodiments, hard mask 78 is formed of or comprises a material selected from $SiO_2$, SiN, SiON, oxygen-doped silicon carbide, oxygen-doped silicon carbo-nitride, or the like, or combinations thereof.

Figure 15B:
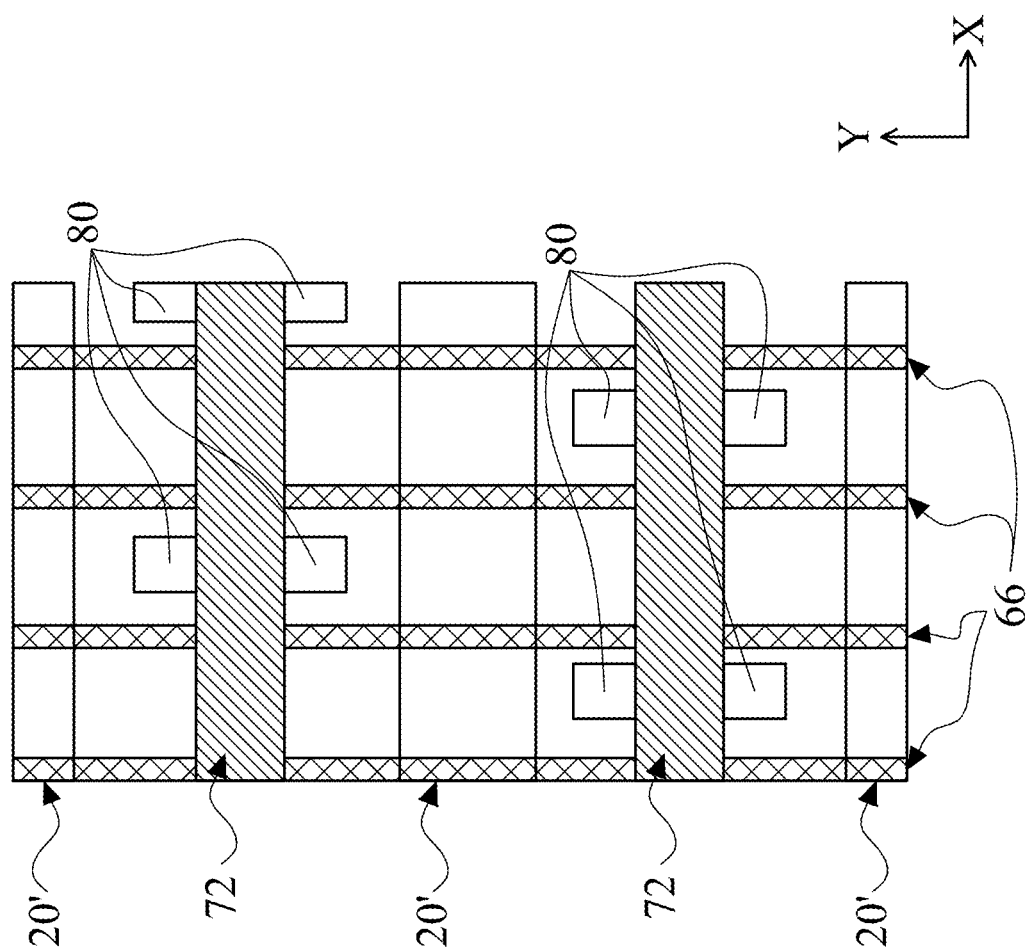

Etching mask 80 is then formed over hard mask 78. Etching mask 80 includes the patterns for defining the boundaries of source/drain contact plugs and to isolate the contact plugs that are to be formed to connect to power supply VVDD. In accordance with some embodiments, etching mask 80 comprises a hard mask material that is different from the materials of both of hard masks 76 and 78. Alternatively, etching mask 80 may comprise a photoresist, and may be a single-layer etching mask or a tri-layer etching mask. FIG. 15B illustrates a top view of the structure shown in FIG. 15A.

Figure 16A:
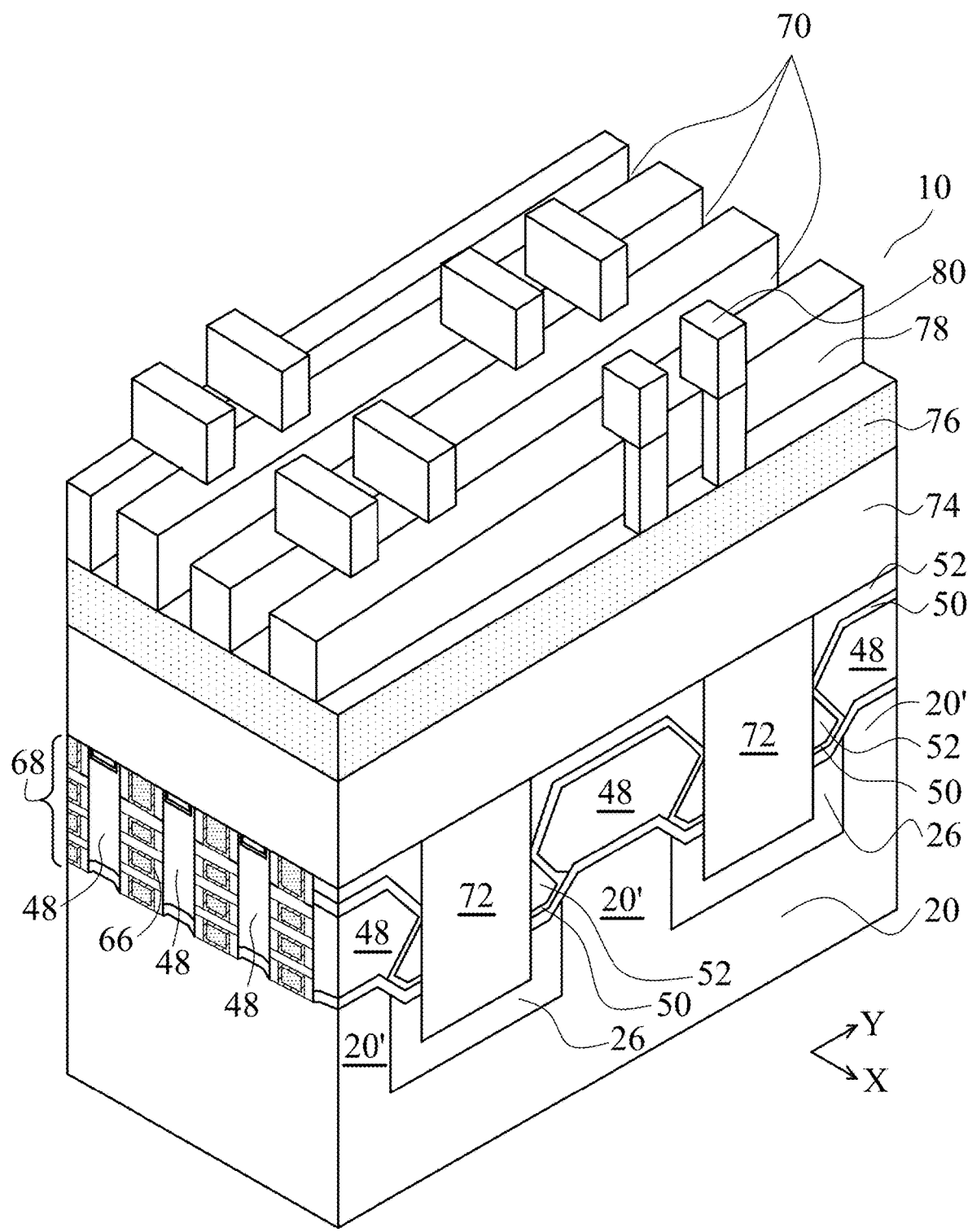
Figure 16B:
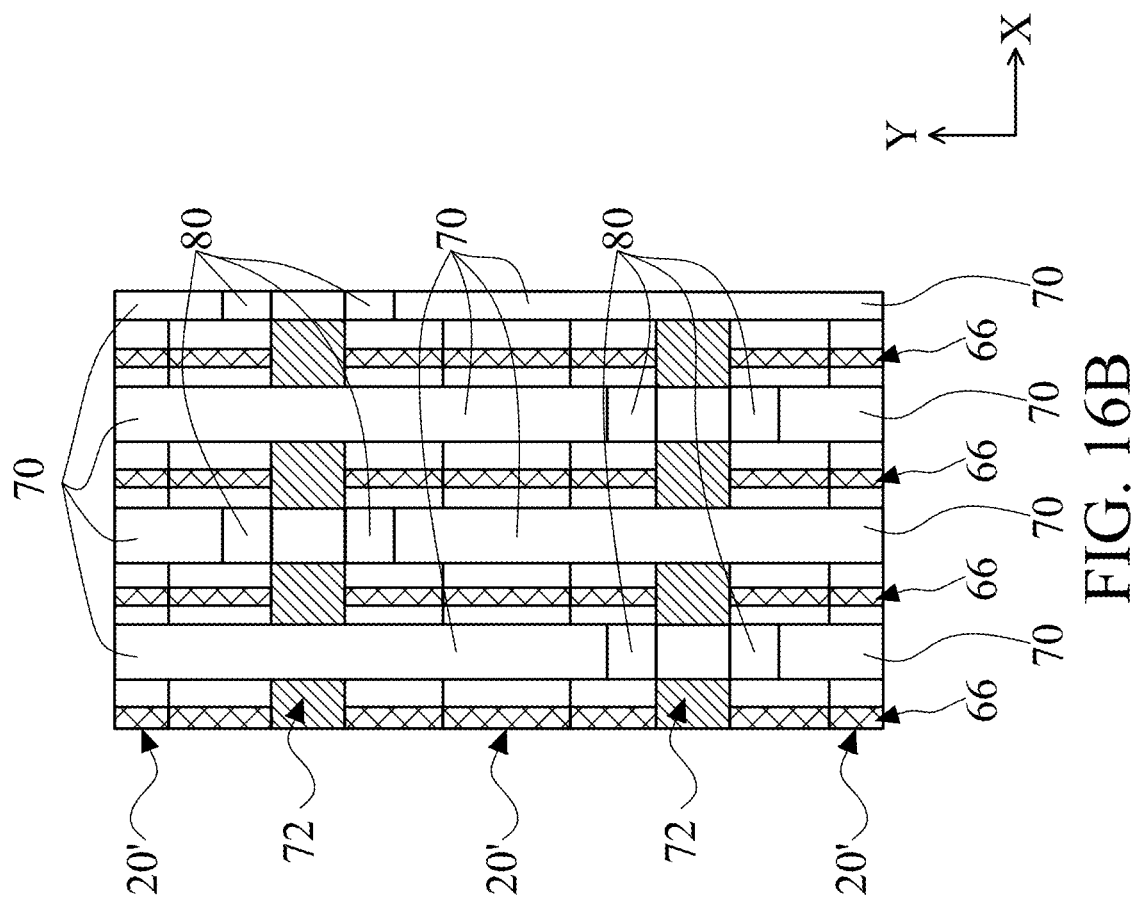

FIGS. 16A and 16B illustrate a perspective view and a top view, respectively, in the patterning of hard mask 78, in which trenches 70 are formed as having lengthwise directions in the Y-direction. In accordance with some embodiments, the patterning of hard mask 78 may include a double-patterning process, which includes forming mandrels (not shown) and spacers (not shown) on the sidewalls of the mandrels, removing the mandrels, so that the spacers are formed as elongated strips extending in the Y-direction. The spacers and etching mask 80 are then used in combination as an etching mask to etch hard mask 78, so that trenches 70 are formed.

Figure 17A:
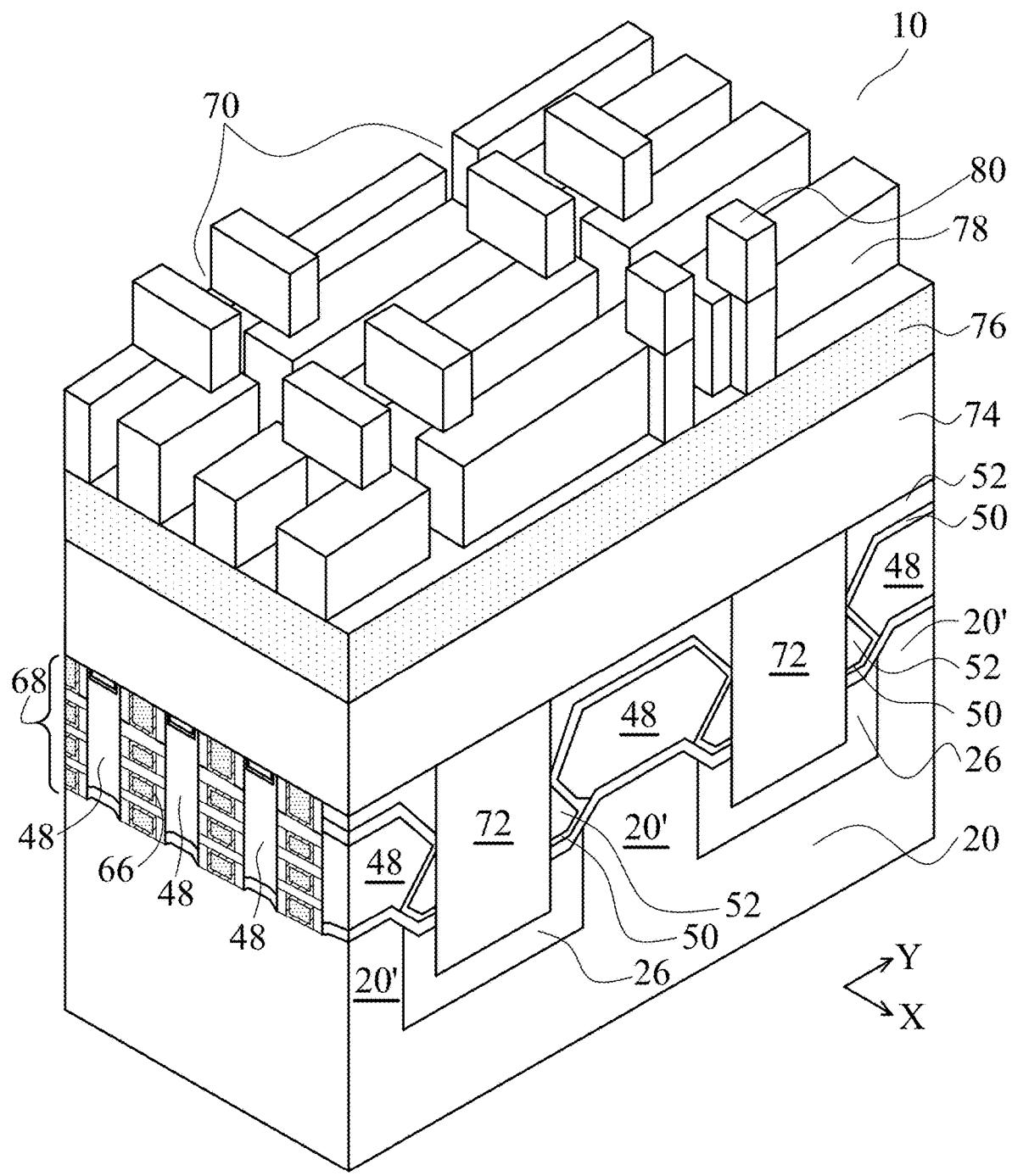
Figure 17B:
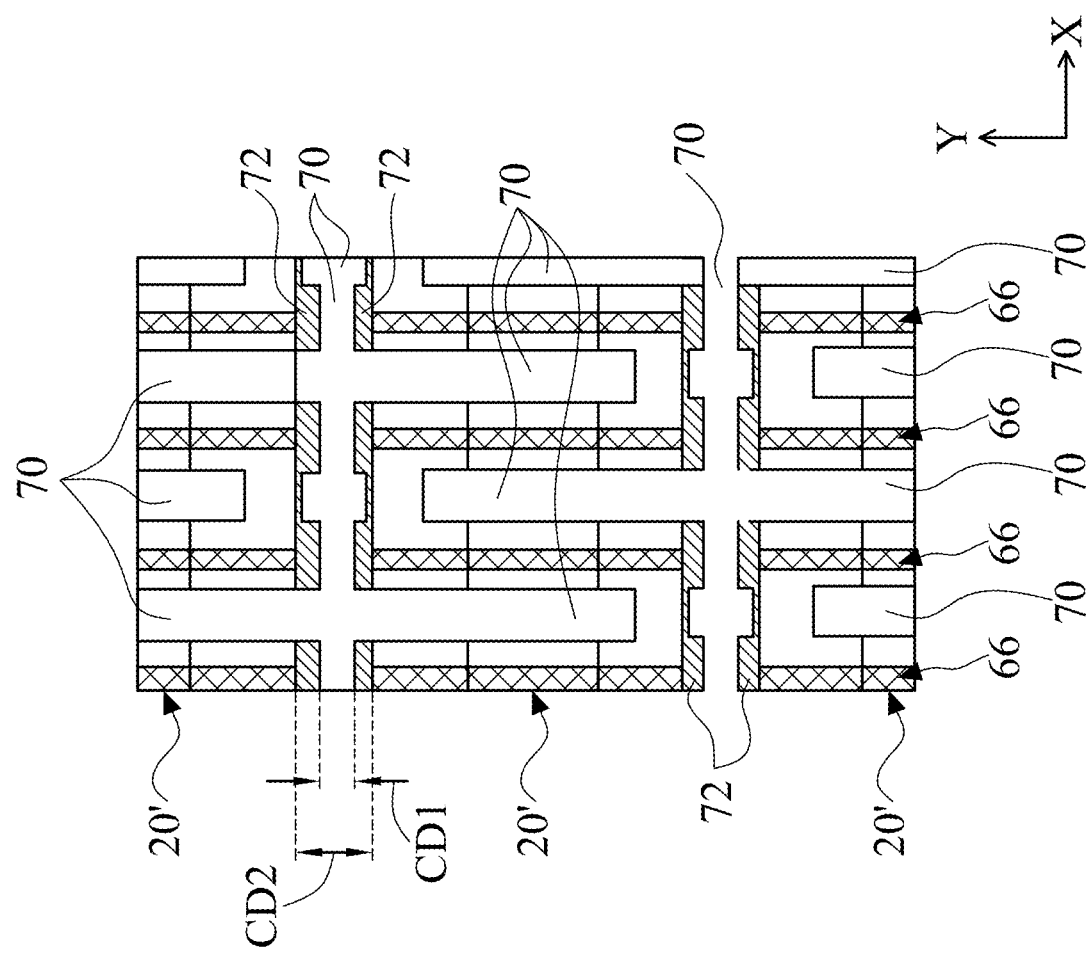

FIGS. 17A and 17B illustrate a perspective view and a top view, respectively, of hard mask 78 after being patterned. Some trenches 70 have lengthwise directions in the X-direction, and some other trenches 70 have lengthwise directions in the Y-direction. The etching process is stopped on hard mask 76. As shown in FIG. 17B, CMG regions 72 have width CD2. The trenches 70 that are in the CMD regions 72 have trench width CD1, which is smaller than the width CD2 of CMD regions 72. Making trench width CD1 to be smaller than width CD2 may prevent the leakage between the subsequently formed source/drain contacts and gate stacks.

Figure 18:
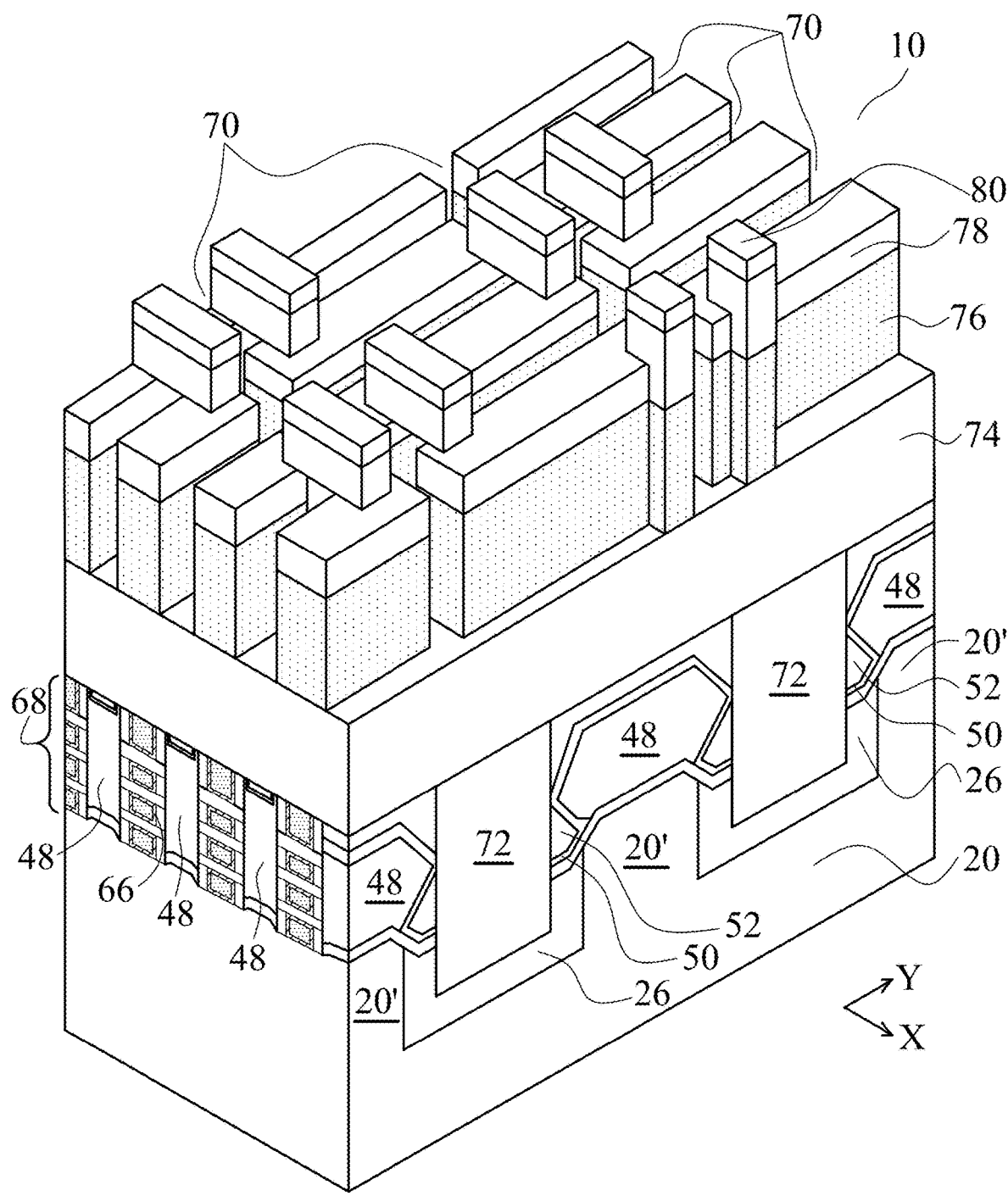

FIG. 18 illustrates the patterning of hard mask 76. Trenches 70 thus extend through hard mask 76 to reveal ILD 74. In the patterning process, etching mask 80 and the patterned hard mask 78 are in combination used as the etching mask.

Referring to FIG. 19, the etching process is continued, so that ILD 74, ILD 52, and CESL 50 are etched, and trenches 70 penetrate through these features. Trenches 70 include trenches 70A1 and 70A2 extending in the X-direction, and trenches 70B1 and 70B2 extending in the Y-direction. CMG regions 72 are exposed to trenches 70A1 and 70A2. Source/drain regions 48 are exposed to trenches 70B1 and 70B2.

Figure 20A:
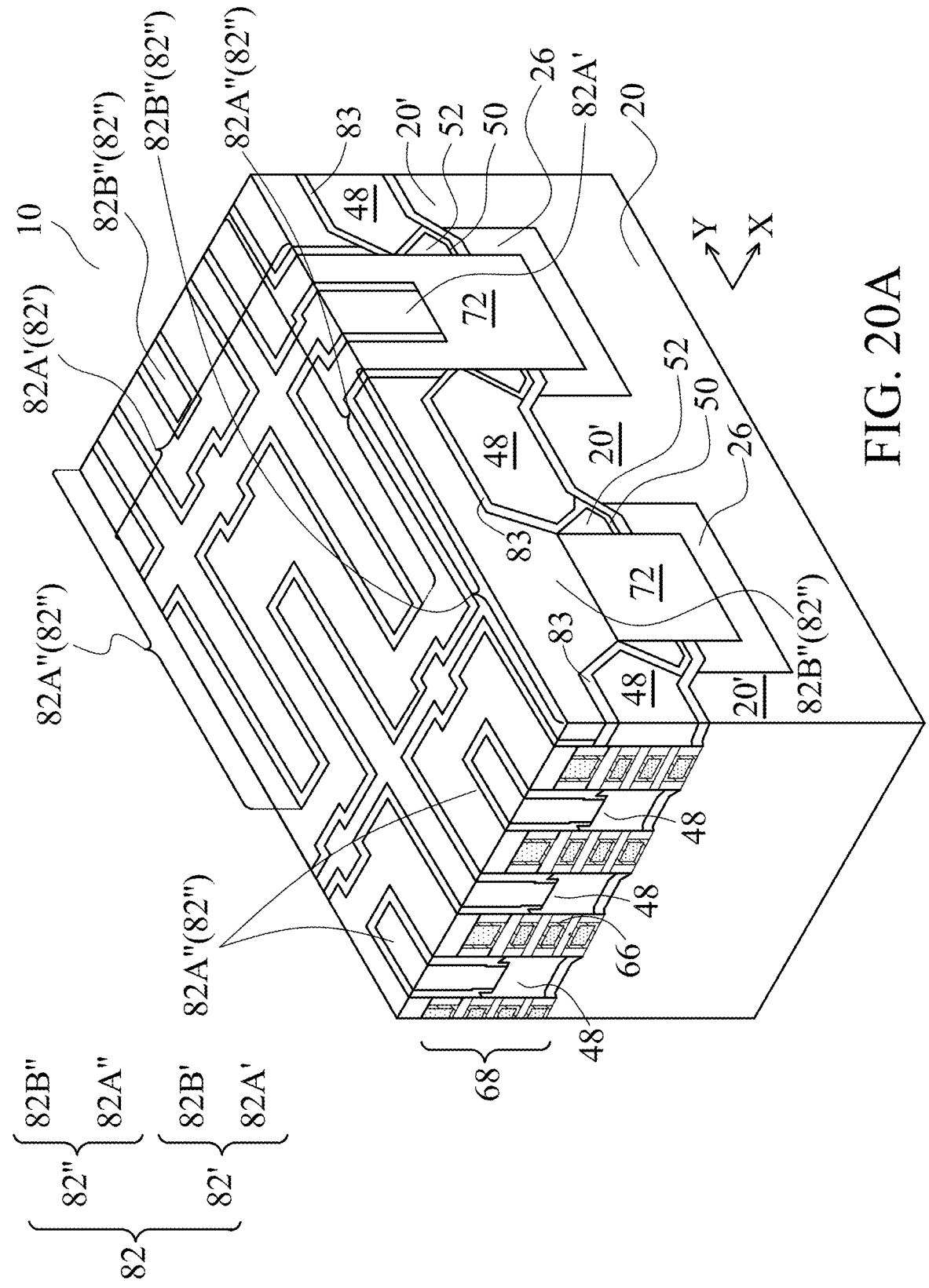
Figure 20B:
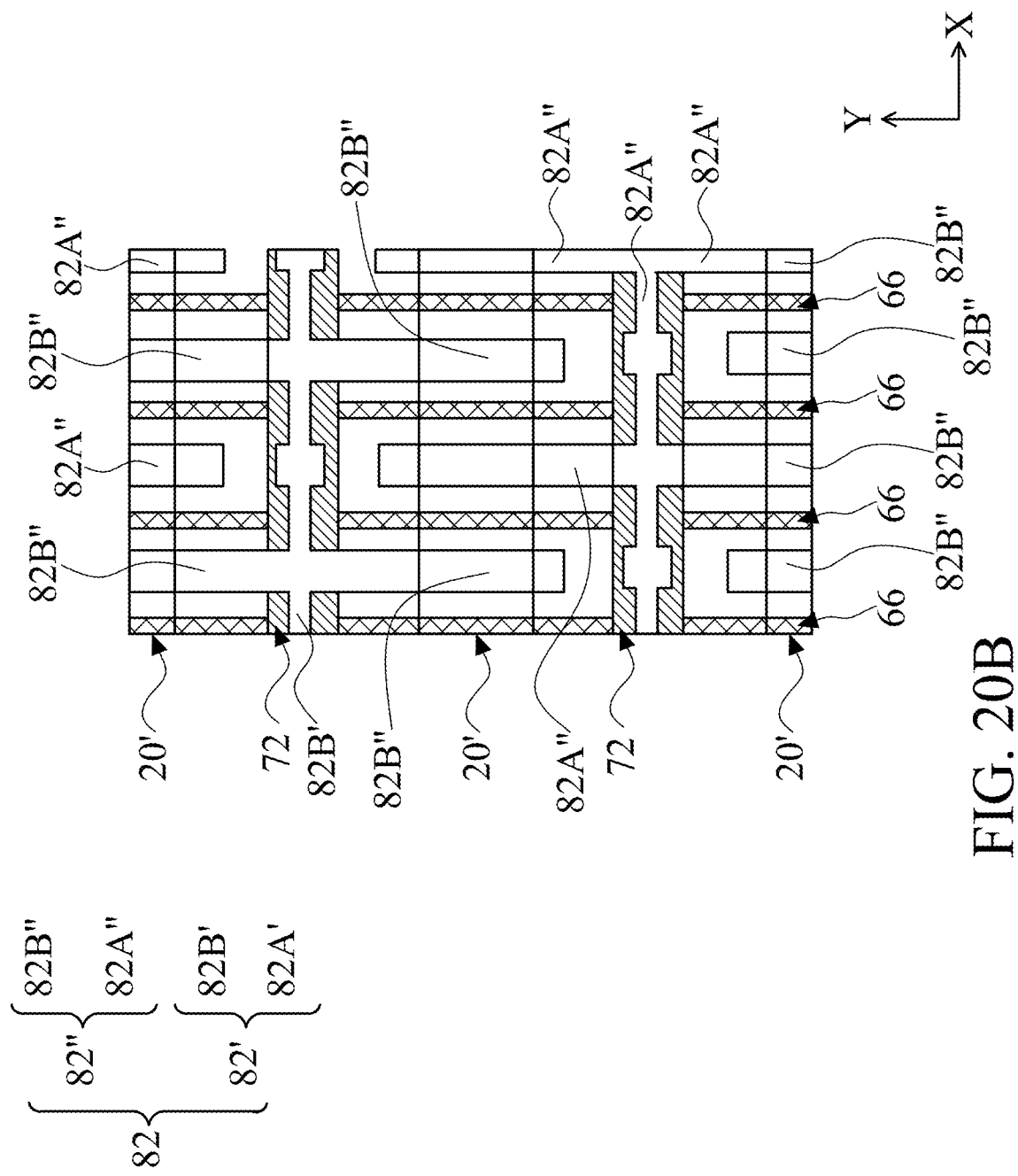

FIGS. 20A and 20B illustrate a perspective view and a top view, respectively, in the formation of contact plugs 82 (which include contact rails and source/drain contact plugs) and silicide regions 83. The respective process is illustrated as process 236 in the process flow 200 as shown in FIG. 40. In accordance with some embodiments, the formation of contact plugs 82 and silicide regions 83 includes depositing a metal layer (such as cobalt, nickel, or the like) extending into trenches 70, performing an annealing process, so that the metal layer reacts with source/drain regions 48 to form silicide regions 83. The un-reacted portions of the metal layer are then removed. Contact plugs 82 are then formed to fill trenches 70. Each of contact plugs 82 may include a conductive liner (such as a TiN layers) and a filling metallic material, which may comprise tungsten, cobalt, copper, or the like. Alternatively, each of contact plugs 82 may be formed of a homogeneous material such as cobalt, tungsten or the like.

Contact plugs 82 include contact rails 82' (including 82A' and 82B'). Each of contact rails 82A' and 82B' includes a portion over the respective CMG region 72, and may or may not include a lower portion extending into the respective CMG region 72. Contact plugs 82 further include source/drain contact plugs 82" (including 82A" and 82B"), which are formed in the same process as contact rails 82A' and 82B'. Source/drain contact plugs 82A" and 82B" are joined to contact rails 82A' and 82B', respectively, to form continuous regions, with no interface formed in between.

Figure 21A:
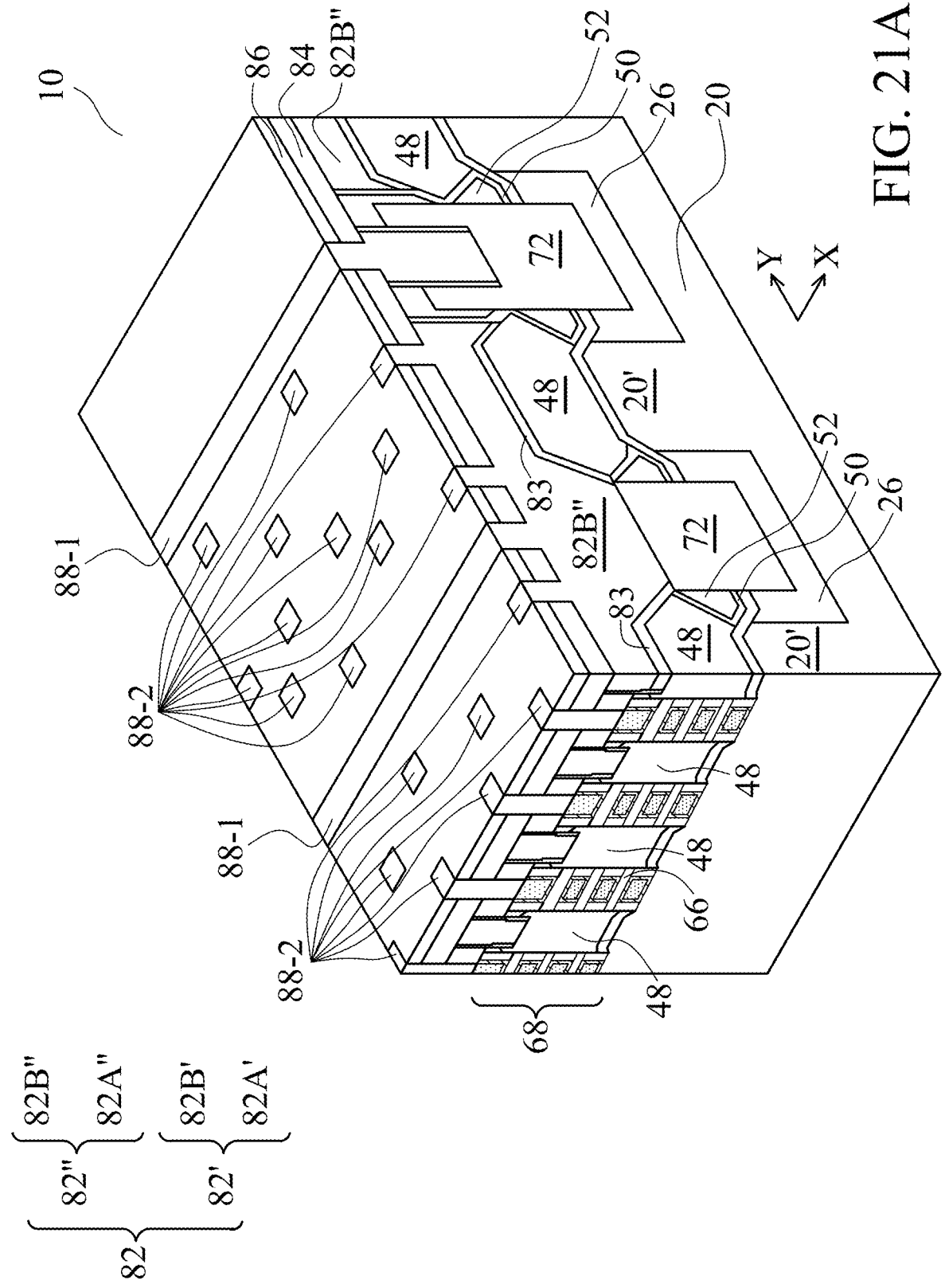
Figure 21B:
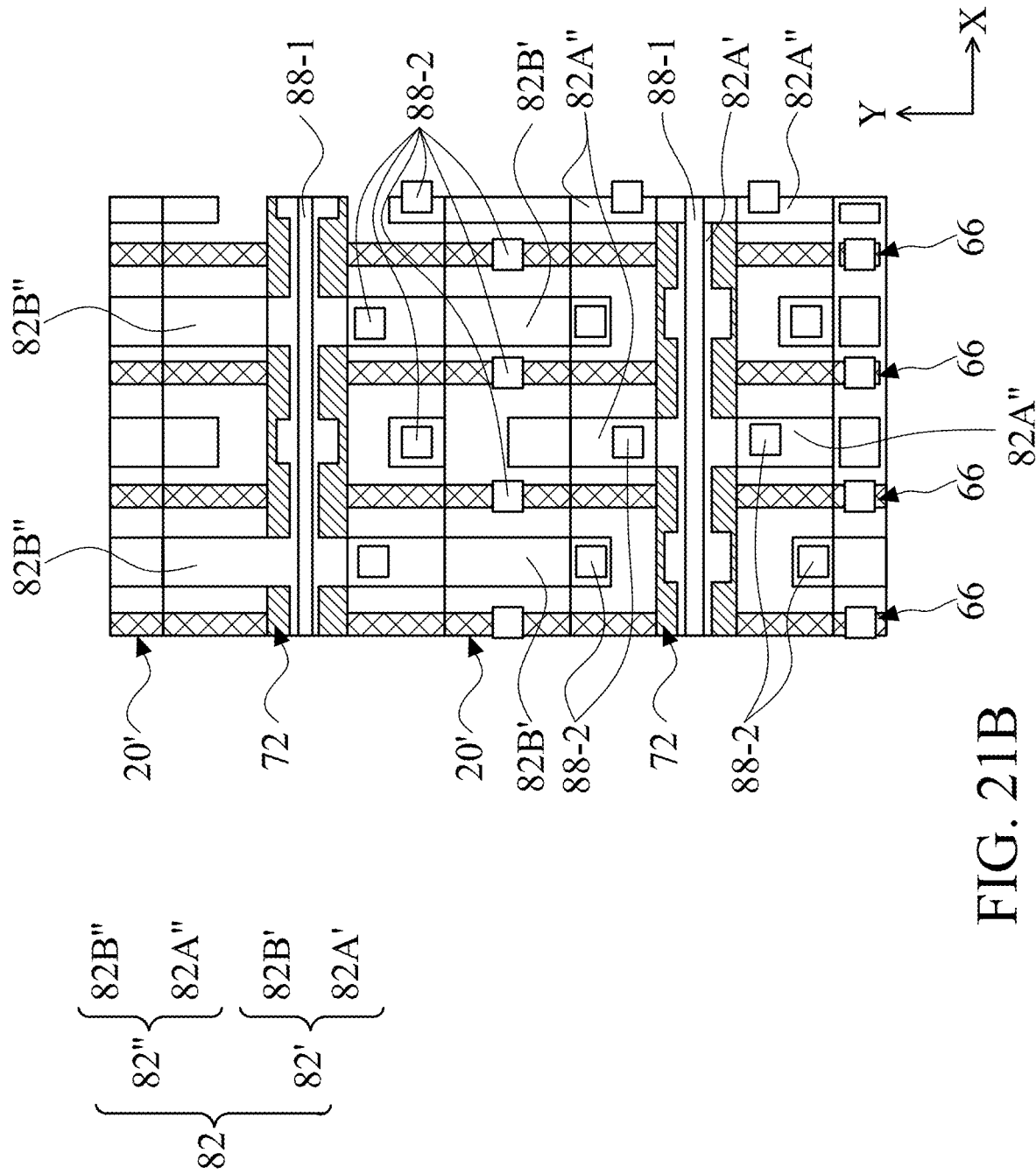
Figure 22:
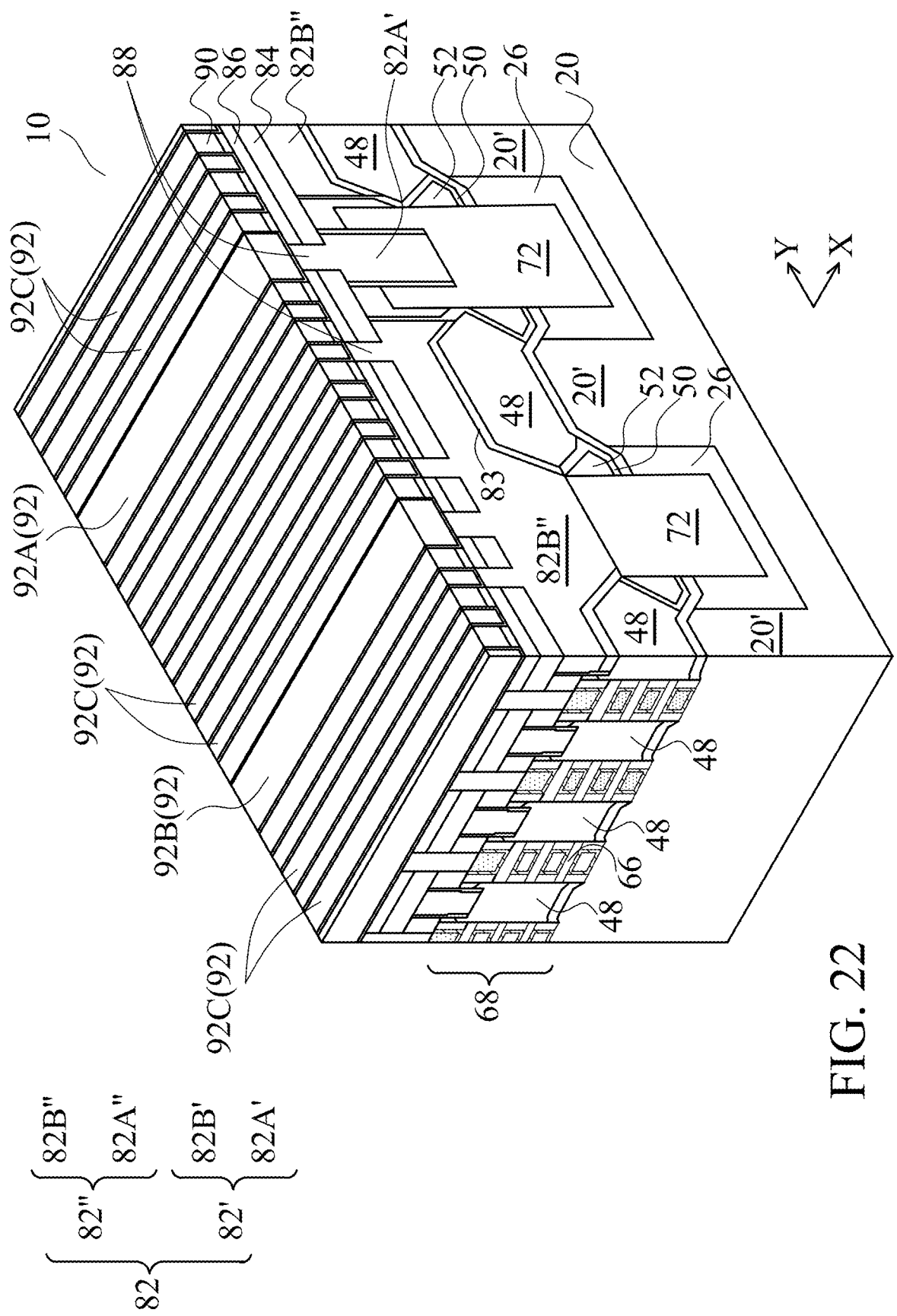

FIGS. 21A and 21B illustrate a perspective view and a top view, respectively, in the formation of etch stop layer 84, ILD 86, and vias 88 (including 88-1 and 88-2). The respective process is illustrated as process 238 in the process flow 200 as shown in FIG. 40. Vias 88-1 are connected to contact rails 82A' and 82B', and vias 88-2 are connected to source/drain contact plugs 82A" and 82B". Vias 88-1, which overlap and contact the elongated contact rails 82A' and 82B', may also be elongated. The vias 88-2 that overlap source/drain contact plugs 88B1 and 82B' may be non-elongated, and there may be multiple vias 88-2 connecting to the same source/drain region to reduce the contact resistance.

FIGS. 22A and 22B illustrate a perspective view and a top view, respectively, in the formation of Inter-Metal-Dielectric (IMD) 90 and (front-side) metal lines 92. The respective process is illustrated as process 240 in the process flow 200 as shown in FIG. 40. IMD 90 may be formed of a low-k dielectric material that has a dielectric constant (k value) lower than about 3.5. For example, IMD 90 may be formed of a carbon-containing low-k dielectric material. Metal lines 92, which are collectively referred to metal layer M0, include the front-side power rails 92A and 92B that overlap CMG regions 72, and the metal lines 92C, which connected to vias 88-2 (FIGS. 21A and 21B). There may also be signal lines in metal layer M0.

Figure 23:
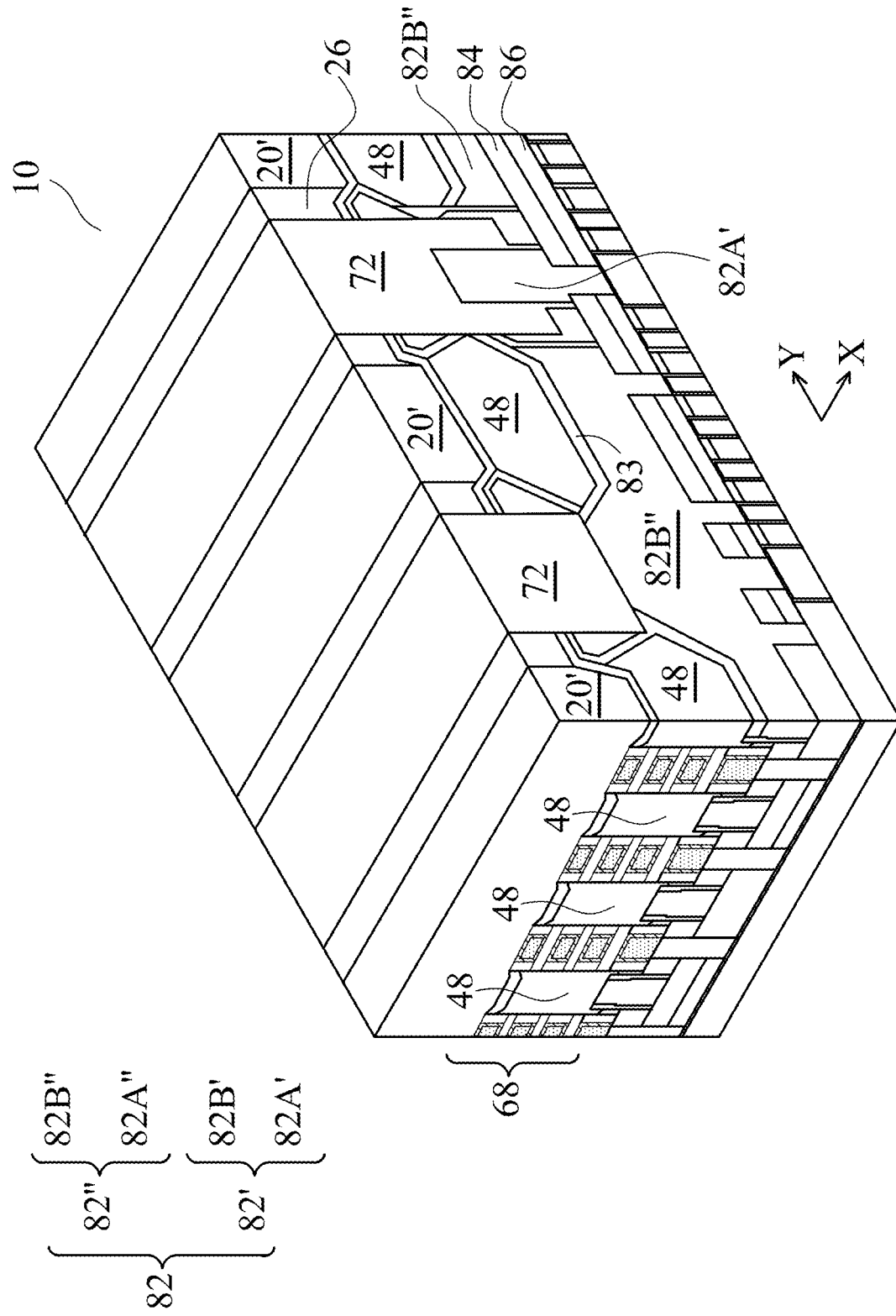

Next, referring to FIG. 23, wafer 10 is flipped upside down. A backside grinding process is performed on wafer 10, so that the bulk portion of semiconductor substrate 20 is removed. The respective process is illustrated as process 242 in the process flow 200 as shown in FIG. 40. Some bottom portions (when wafer 10 is oriented as in FIG. 22) of STI regions 26 may also be removed in the backside grinding process, so that CMG regions 72 are exposed. Alternatively, there may be some bottom portions of STI regions 26 left after the backside grinding process is performed, so that CMG regions 72 are not exposed.

Figure 24:
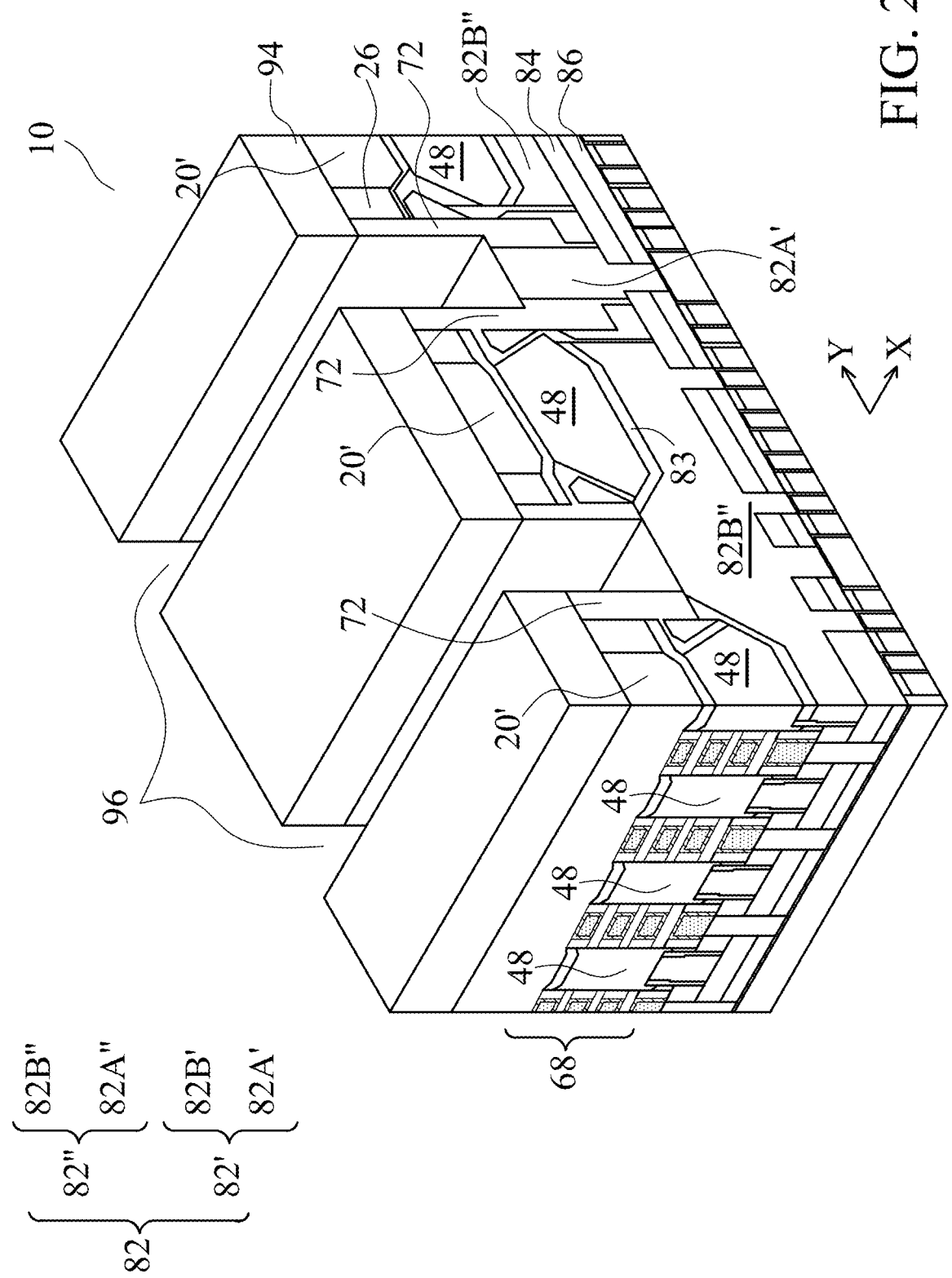
Figure 25A:
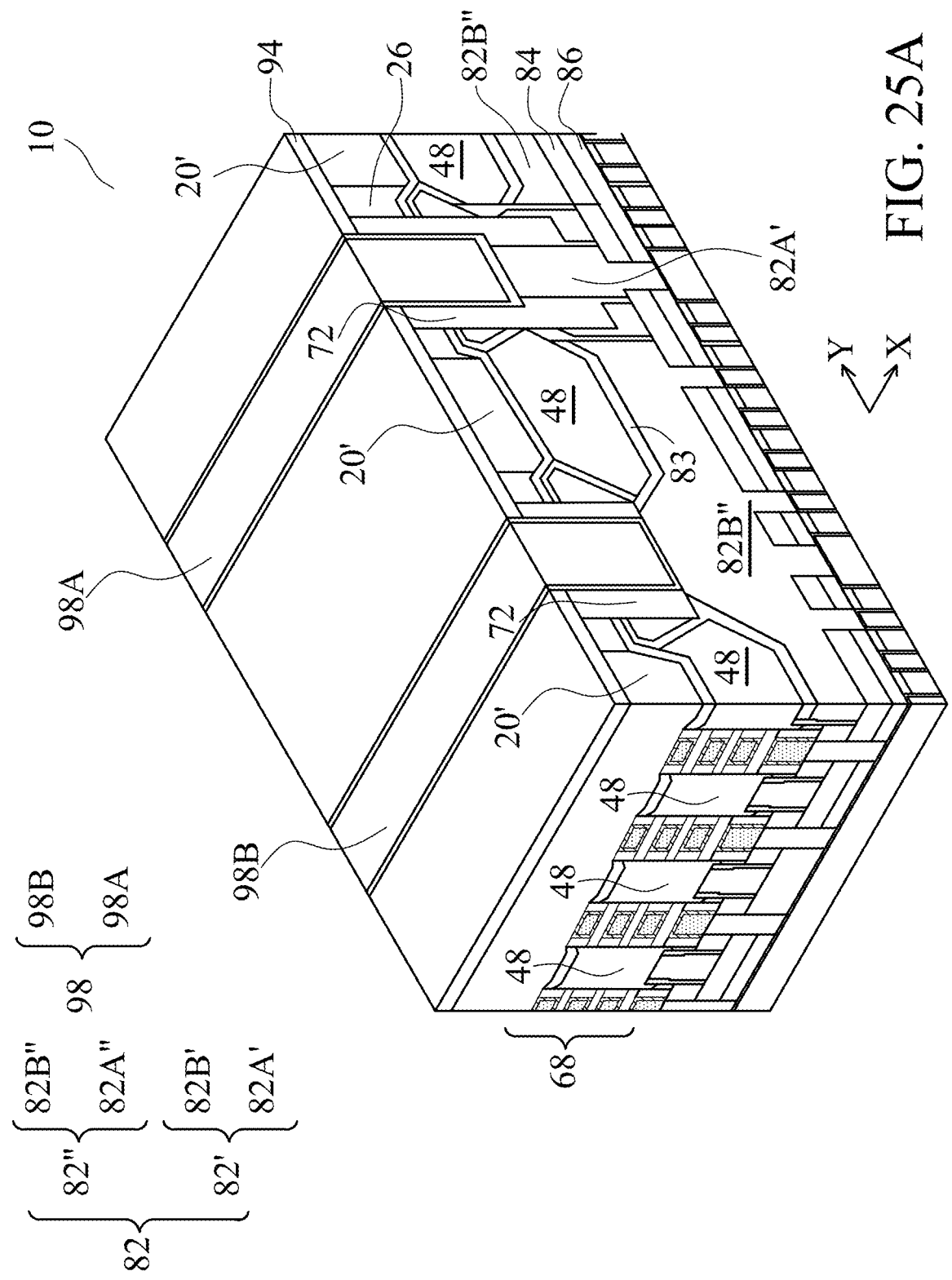

FIGS. 24 and 25A illustrate the formation of feed-through vias, which are also referred to as via rails. Referring to FIG. 24, hard mask 94 is formed. Hard mask 94 may be formed of or comprises SiN, SiON, SiO$_2$, oxygen-doped silicon carbide, oxygen-doped silicon carbonitride, or the like. Hard mask 94 may be patterned using an etching mask (not shown), which may comprise a photoresist. A middle portion of each of CMG regions 72 is etched to form trenches 96. The respective process is illustrated as process 244 in the process flow 200 as shown in FIG. 40. If CMG regions 72 were not exposed in the backside grinding process (and there are some portions STI regions 26 covering the CMG regions), the STI regions 26 are also etched-through in order to reveal the CMG regions 72. The underlying portion of contact rail 82A' and 82B' and source/drain contact plugs 82A" and 82B" are revealed through trenches 96.

Next, as shown in FIG. 25A, via rails 98 (including 98A and 98B) are formed. The respective process is illustrated as process 246 in the process flow 200 as shown in FIG. 40. The formation process may include depositing a conductive diffusion barrier layer (such as a TiN) layer, and a conductive material such as copper, tungsten, cobalt, or the like over the conductive diffusion barrier, and a planarization process to remove excess portions of the conductive materials. In accordance with alternative embodiments, the entireties of via rails 98 are formed of a homogeneous material such as tungsten, cobalt, or the like. Via rails 98A and 98B overlap and are in contact with contact rail 82A' and 82B', respectively, and are electrically connected to source/drain contact plugs 82A" and 82B", respectively. In accordance with some embodiments, after the planarization process, a layer of the hard mask 94 may be left unremoved. Alternatively, hard mask 94 is removed.

Figure 25B:
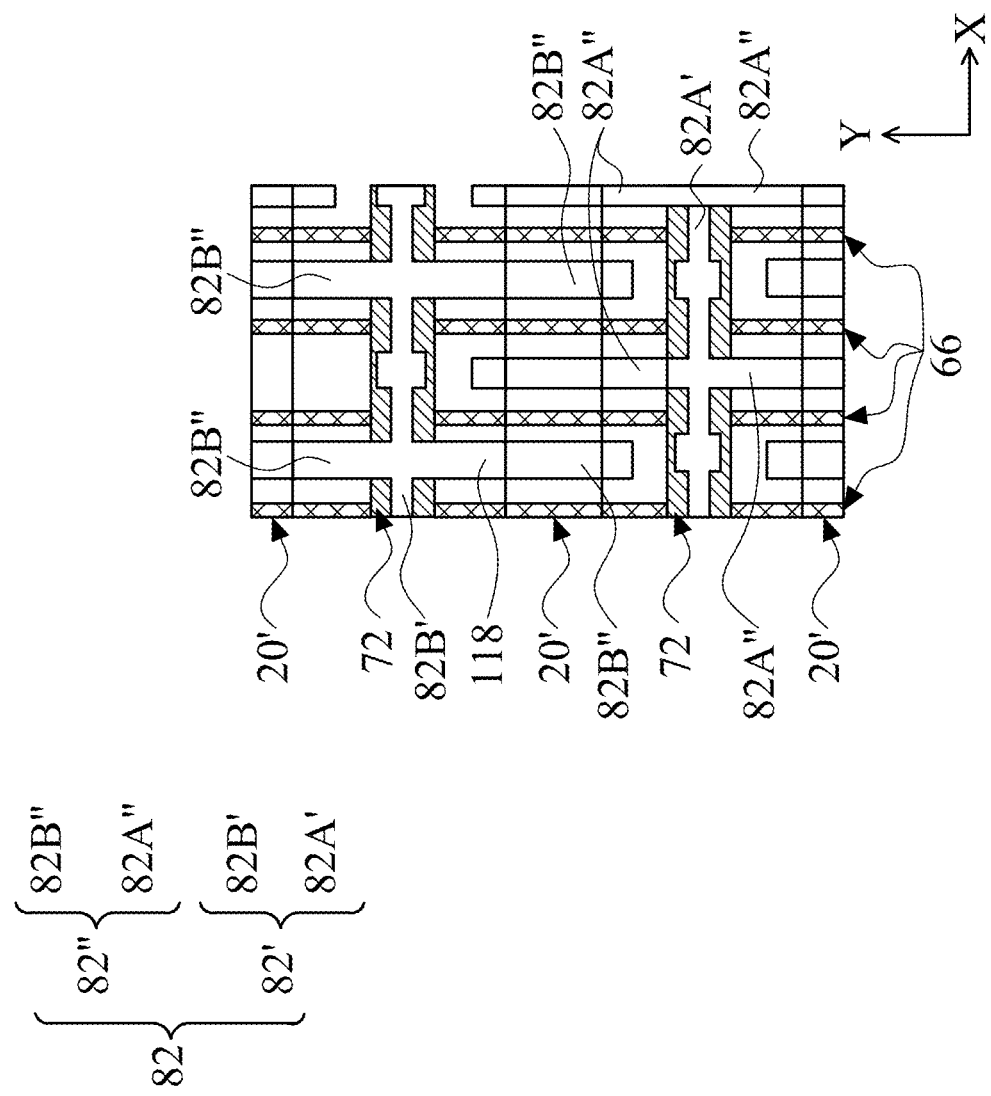
Figure 25C:
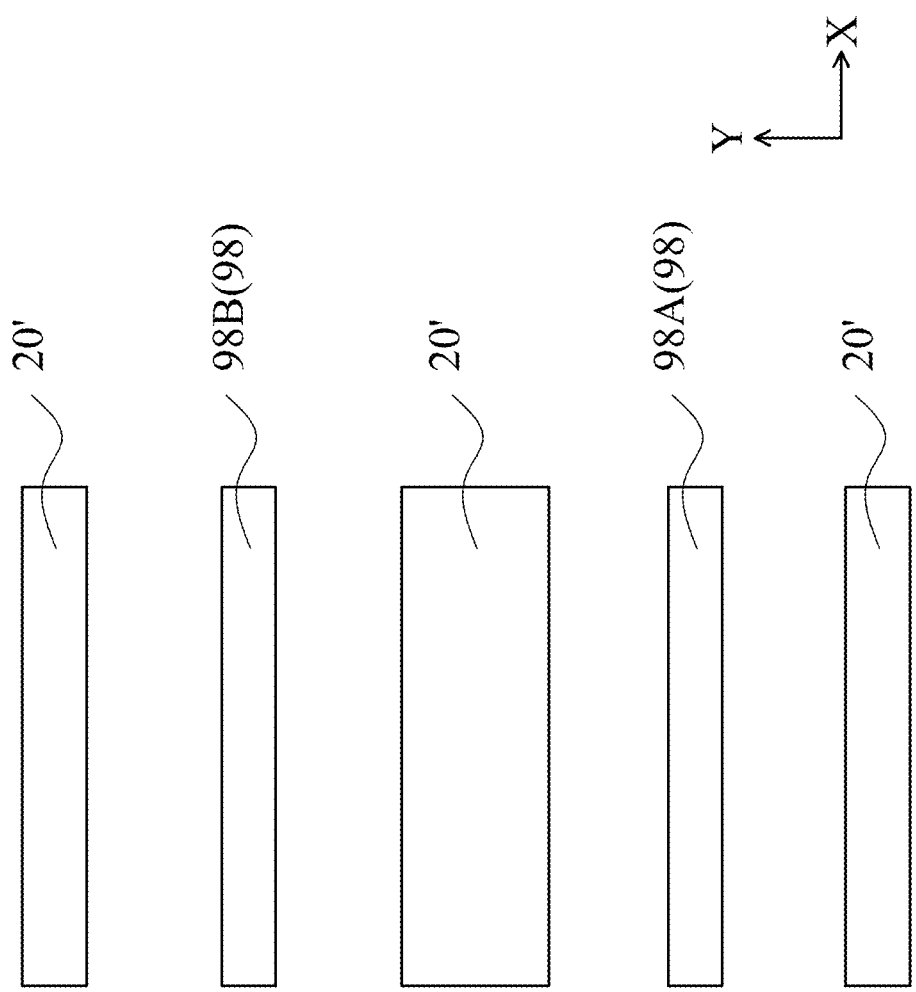

FIG. 25B illustrates a plane view of front side features including contact rails 82A' and 82B' and source/drain contact plugs 82A" and 82B", and gate stacks 66. FIG. 25C illustrates a plane view of backside features including via rails 98A and 98B, which are underlying and electrically connected to the overlying contact rails 82A' and 82B', respectively. Active regions 20' are also illustrated, and are located between via rails 98.

Next, as shown in FIG. 26A, etch stop layer 112 and backside ILD 114 are formed. Backside power rails 110 (including 110A and 11B) are formed in etch stop layer 112 and backside ILD 114, and are parallel to each other. The respective process is illustrated as process 248 in the process flow 200 as shown in FIG. 40. The etch stop layer 112 may be formed of or comprise WC, LaO, AlO, AlON, ZrO, HfO, ZnO, ZrN, ZrAlO, TiO, TaO, YO, or the like. The backside ILD 114 may be formed of a material selected from the same group of candidate materials for forming the front-side ILDs. Accordingly, the formation of head cell 68, ungated backside power rail 110A, and gated backside power rail 110B are finished. It is appreciated that it is advantageous to use backside power rails since backside power rails 110A and 110B may be wider than, and hence have less voltage drop than, front-side power rails 92.

Figure 26B:
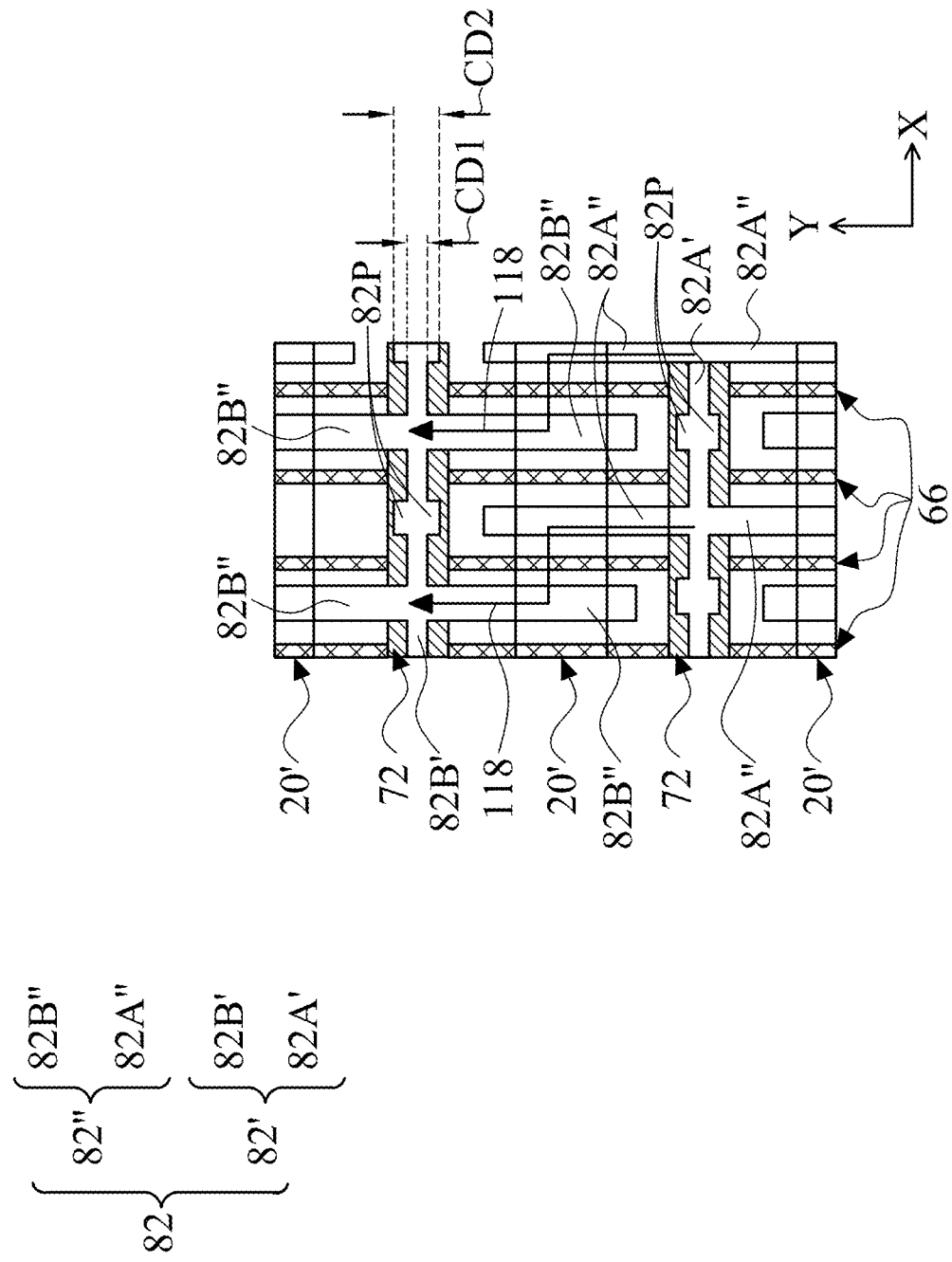

FIG. 26B illustrates a plane view of front-side features including contact rails 82A' and 82B', source/drain contact plugs 82A" and 82B", and gate stacks 66. Voltage paths 118 are the power supplying paths from ungated backside power rail 110A (carrying TVDD) to gated backside power rail 110B (carrying VVDD). In accordance with some embodiments, contact rails 82A' and 82B' have some protrusions 82P protruding out of the otherwise strip portion that has a uniform width.

Figure 26C:
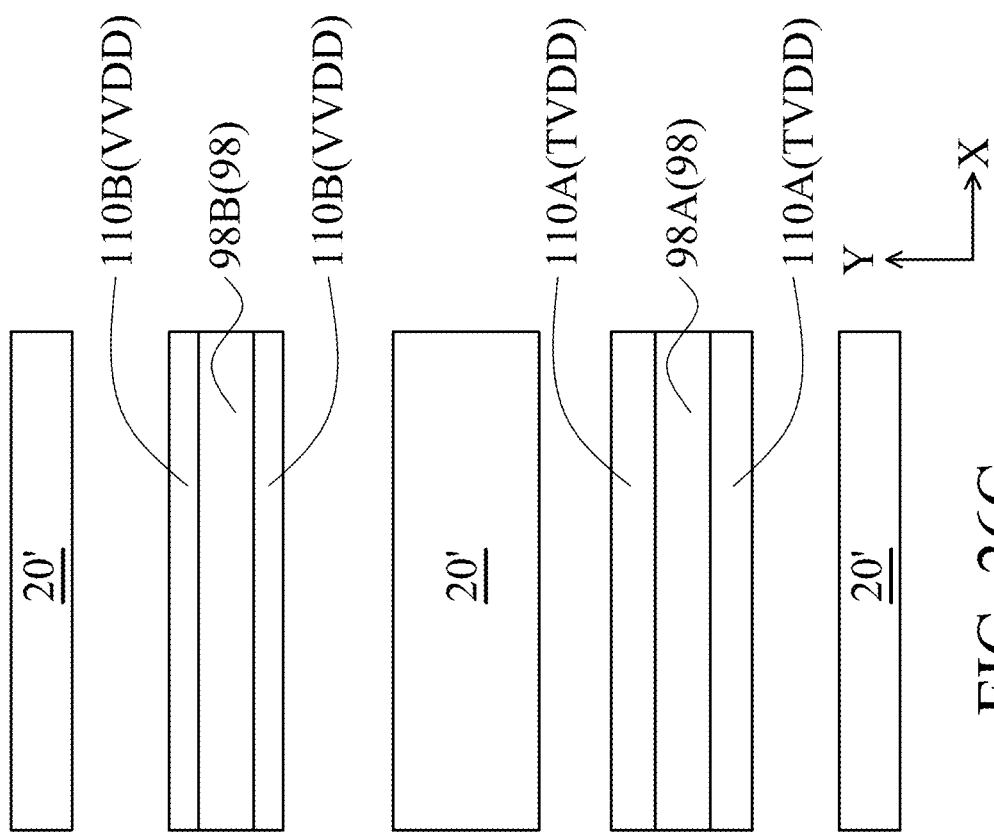

FIG. 26C illustrates a plane view of backside features including via rails 98A and 98B and backside power rails 110A and 110B. Active regions 20' are also illustrated, and are located between via rails 98.

As shown in FIGS. 26B and 26C, when header cell 68 is turned on, the ungated voltage TVDD on power rail 110A and via rail 98A is conducted through header cell 68 to backside power rail 110B and via rail 98B, and the respective voltage thereon is referred to as gated voltage VVDD. When header cell 68 is turned off, the voltage TVDD on power rail 110A and via rail 98A is not provided to backside power rail 110B and via rail 98B. Accordingly, header cell 68 acts as the switch between backside power rails 110A and 110B.

Figure 27A:
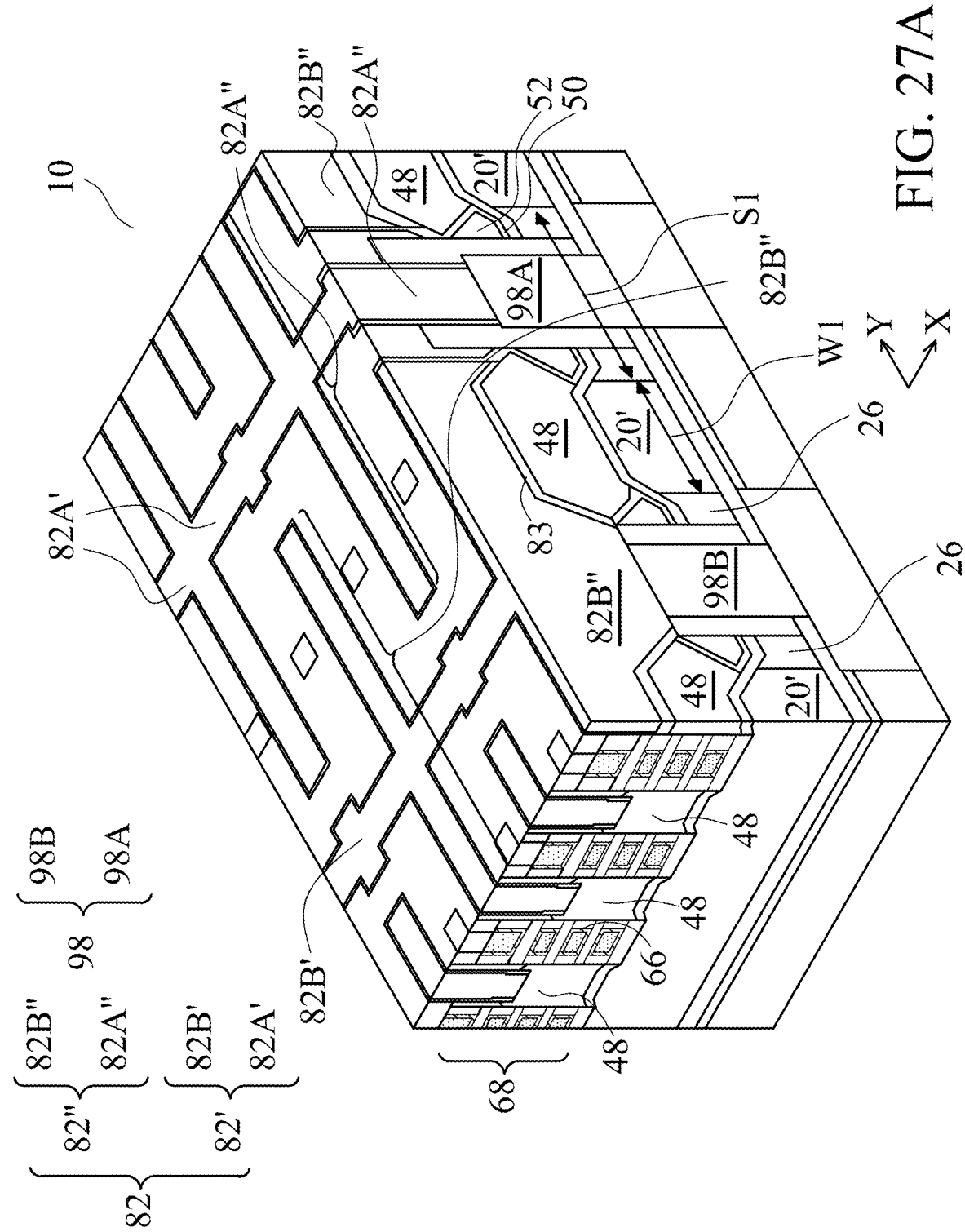
Figure 27B:
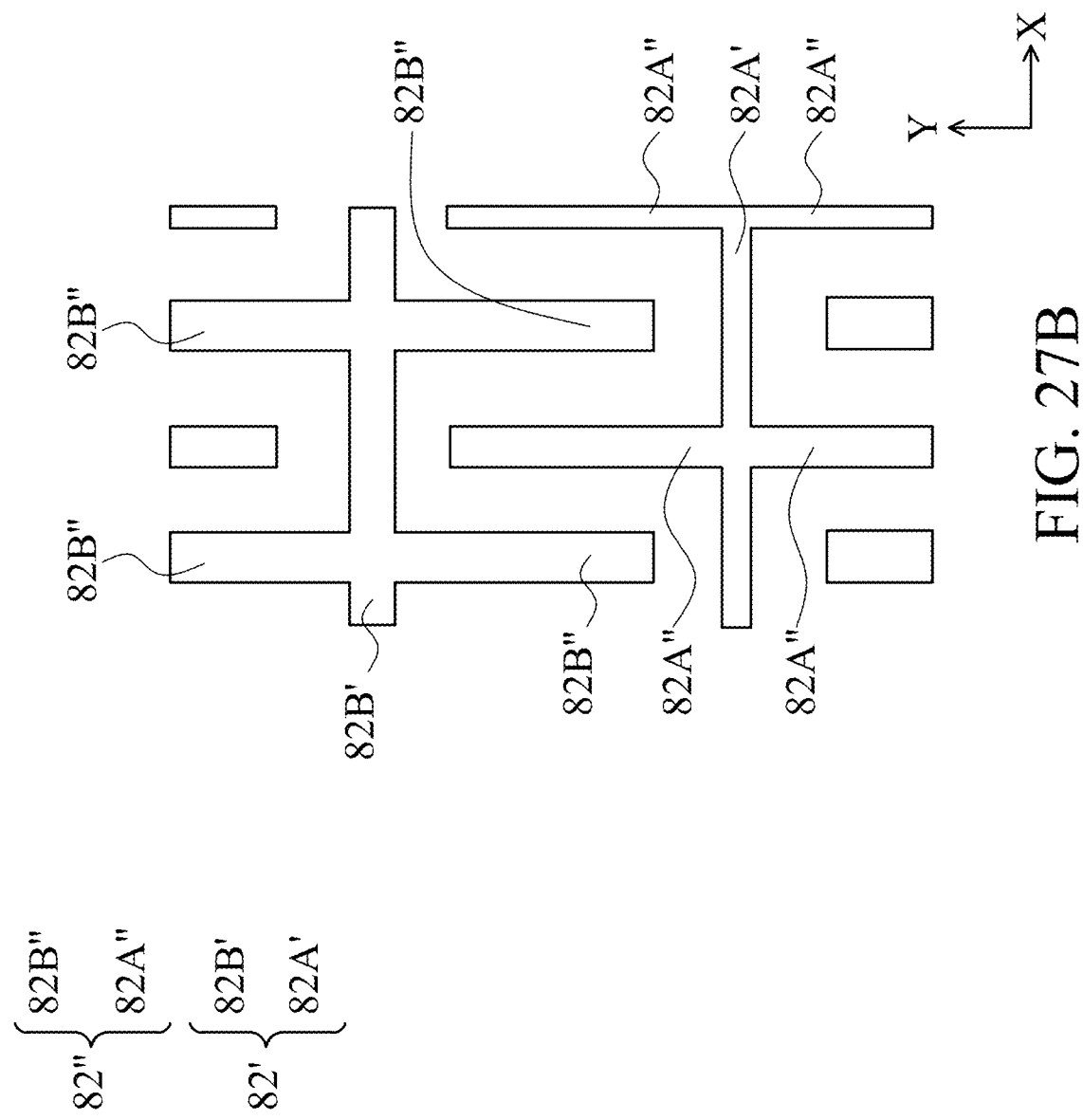

FIGS. 27A/27B through 29 illustrate some details of the structure shown in FIG. 26A. FIGS. 27A and 27B illustrate a perspective view and a top view of cross-sections A-A' and B-B', respectively, in FIG. 26A. Cross-section A-A' is at the top surfaces of contact rails 82A' and 82B' and source/drain contact plugs 82A" and 82B".

Contact plugs 82 form an inter-locked comb shape. In accordance with some embodiments, the width W1 (FIG. 27A) of active region 20' may be in the range between about 10 nm and about 100 nm. The spacing S1 of neighboring active regions 20' may be in the range between about 30 nm and about 200 nm. Contact rails 82A' and 82B' are joined with the respective source/drain contact plugs 82A" and 82B" to form crosses, while the shapes of these features may be rounded due to process reasons.

Referring to FIGS. 27A and 27B, contact rails 82A' and 82B' may be formed to extend to the same level as, or lower than, the bottoms of source/drain regions 48, so that it is easy for the formation of via rails from the backside of the respective wafer.

Figure 28:
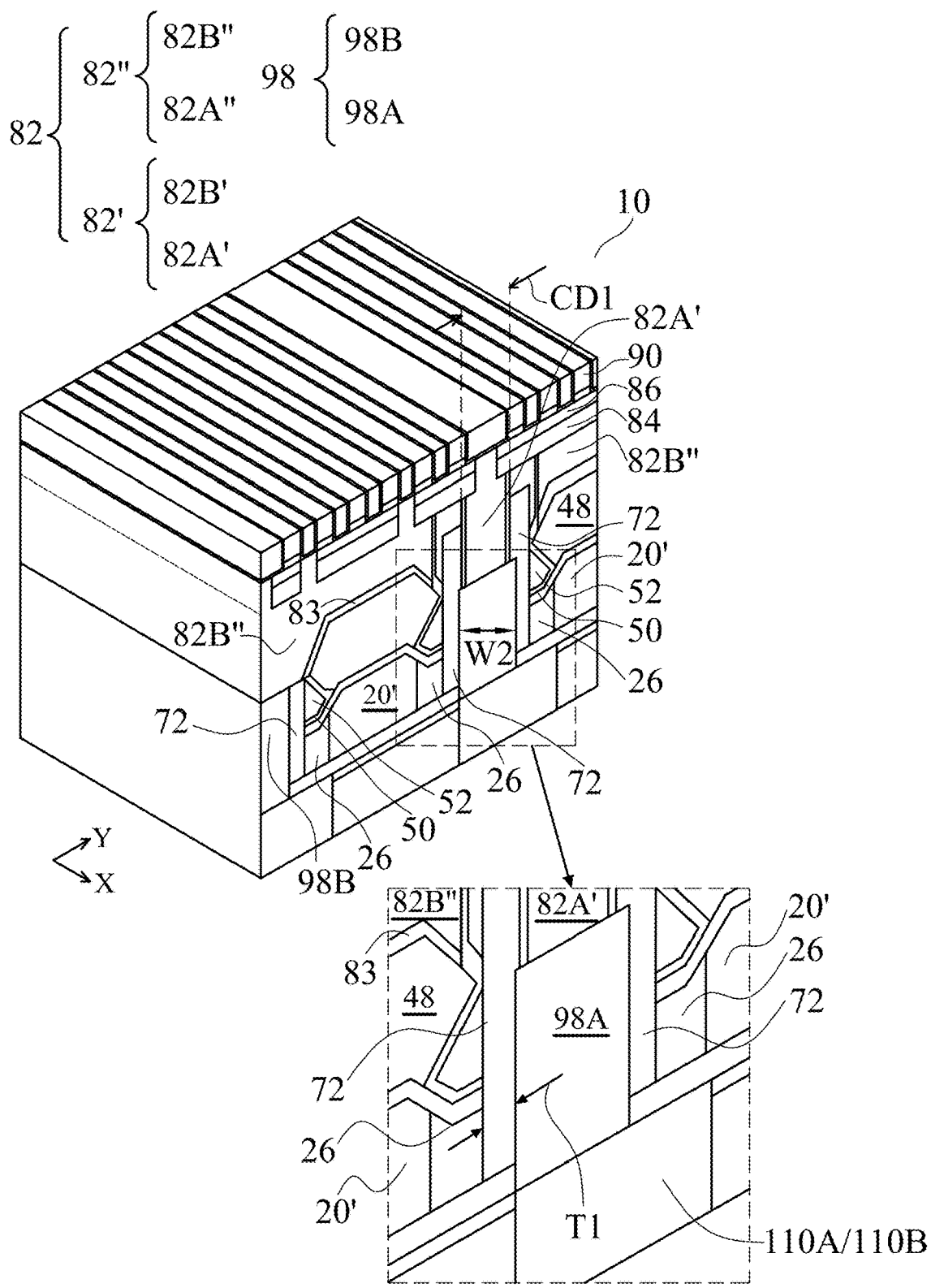

FIG. 28 illustrates a cross-section B-B in FIG. 26A, which cross-section cuts through contact rail 82B', via rail 98B, and metal line 92B in half. A portion of the structure in the square frame is magnified at the right bottom of FIG. 28. In accordance with some embodiments, the portions of CMG regions 72 on opposite sides of via rails 98 are thick enough, with thickness T1 (marked in the magnified portion) being greater than about 5 nm to prevent the leakage between via rails 98 and the nearest gate electrode 64. In accordance with some embodiments, the width CD1 of contact rails 82A' and 82B' are smaller than the width W2 of the respective underlying via rails 98A and 98B.

Figure 29:
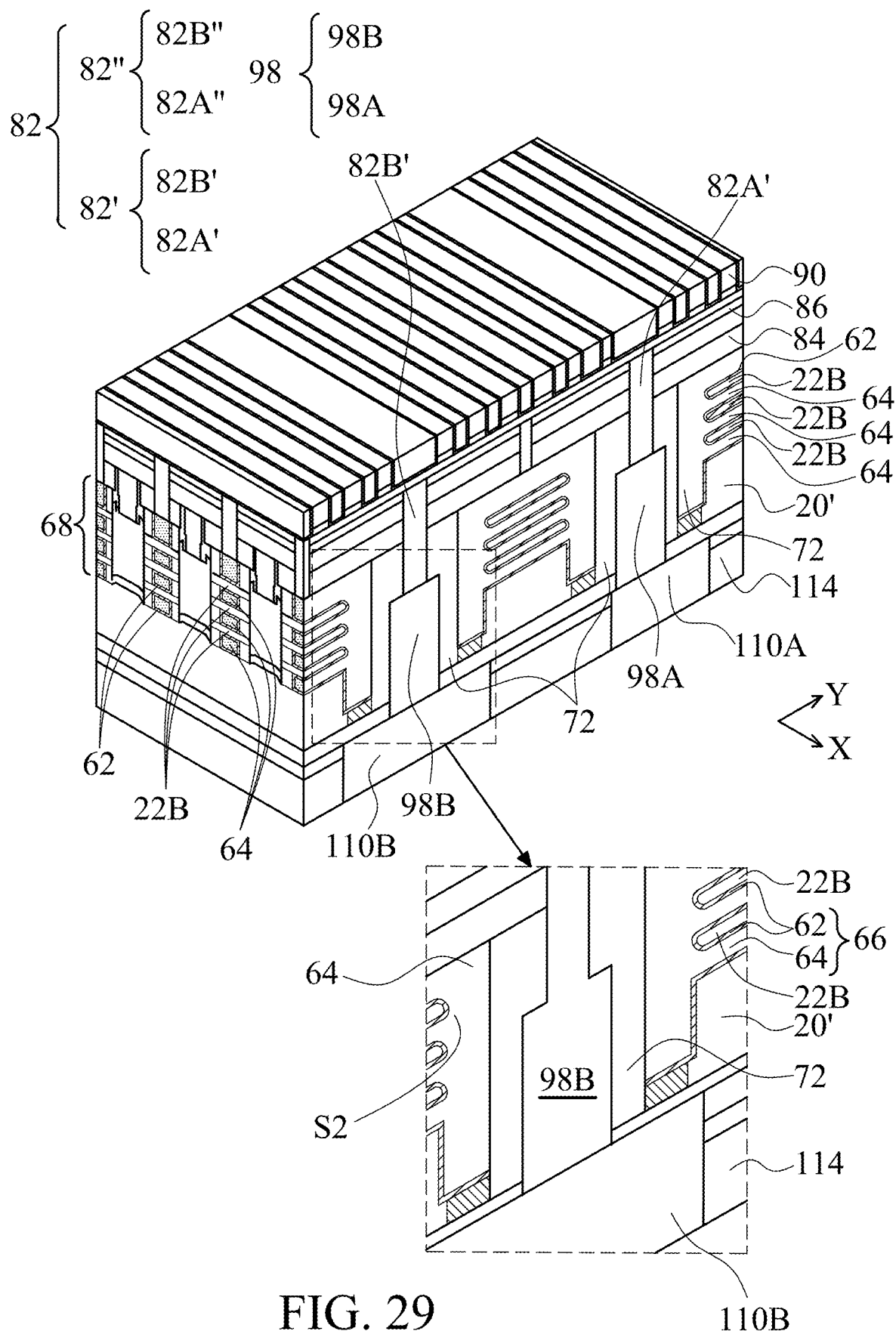

FIG. 29 illustrates a cross-section C-C in FIG. 26A, which cross-section cuts through nanostructures (channel regions) 22B and gate electrodes 64 in half. CMG regions 72, via rails 98A and 98B, backside power rails 110A and 110B, and contact rails 82A' and 82B' are also cut by cross-section C-C. In accordance with some embodiments, the spacing S2 (marked in a magnified portion) between contact rail 82B' and the nearest gate electrode 64 may be greater than about 10 nm, so that leakage is reduced.

Figure 30:
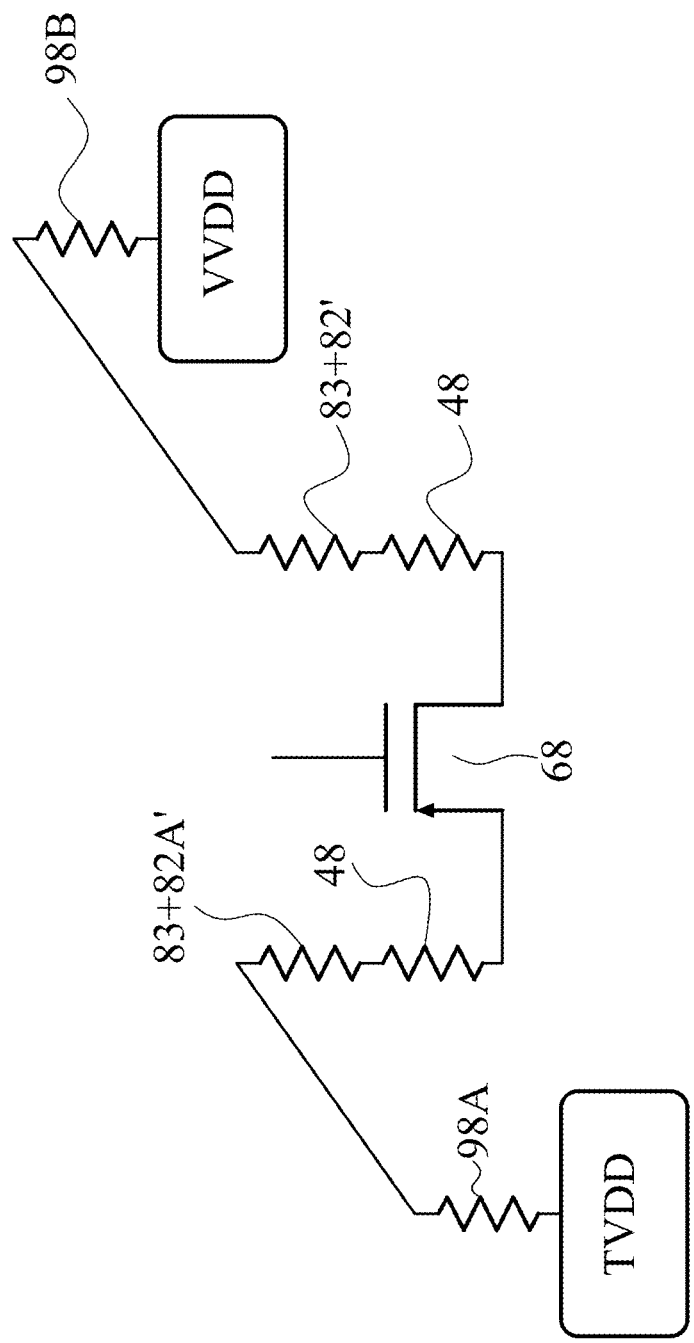
FIG. 30 illustrates an equivalent circuit of a header cell and the connections to backside power rails in accordance with some embodiments.

The embodiment of the present disclosure has low on-resistance in the voltage path from the ungated backside power rail 110A (TVDD) to the gated backside power rail (VVDD). FIG. 30 illustrates the equivalent resistance in the voltage path. The resistance of the voltage path includes the resistance of via rail 98A, contact rail 82A', silicide region 83, source region 48, the channels of header cell 68, drain region 48, silicide region 83, contact rail 82B', and via rail 98B. Via rails 98A and 98B may be made elongated, so that their resistance values are low. The resistance of the voltage path is significantly lower than the resistance of the voltage path when the gated and ungated power rails are on the front side of the wafer/die. The resistance of the voltage path is also significantly lower than the resistance of the voltage path when the gated and ungated power rails are on the backside of the wafer/die, with vias and epitaxy regions, rather than elongated contact rails, being adopted in the voltage paths.

Figure 31A:
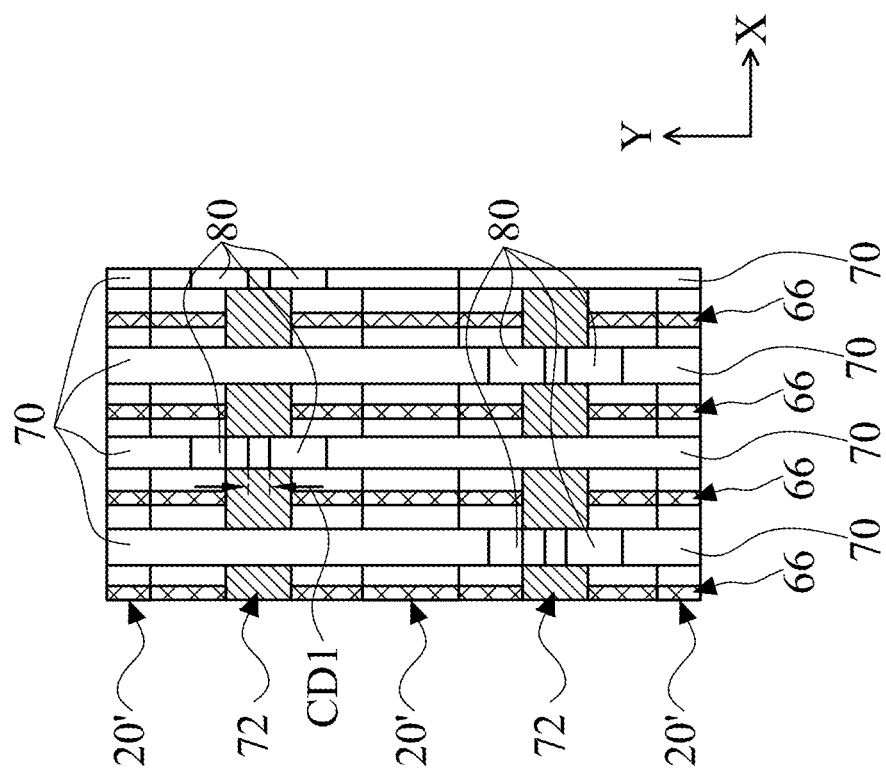
FIGS. 31A and 31B illustrate the top views of intermediate stages in the formation of contact rails in accordance with some embodiments.
Figure 31B:
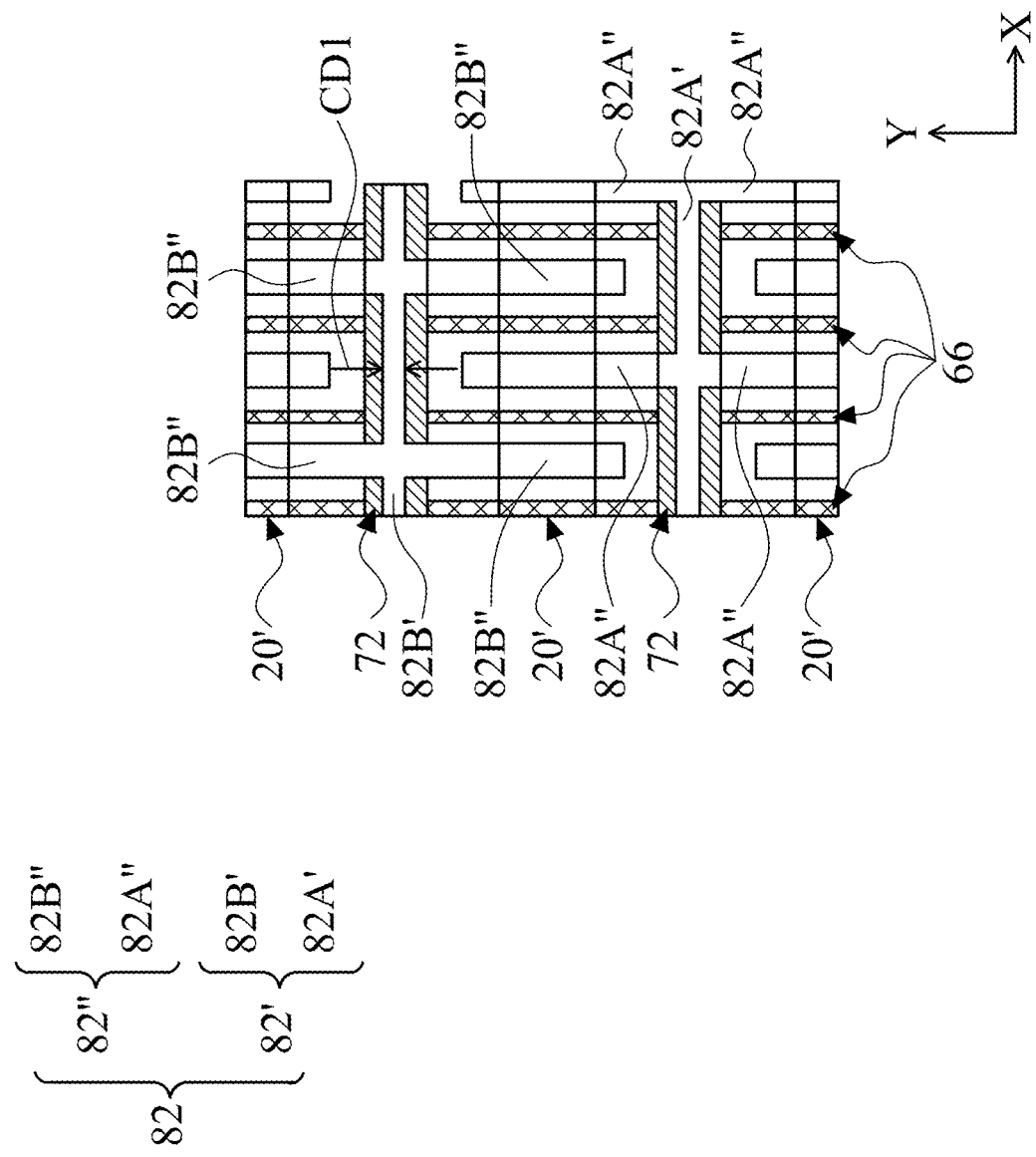

FIGS. 31A and 31B, FIGS. 32A and 32B, and FIGS. 33, 34, and 35 illustrate backside powered header cells in accordance with alternative embodiments. FIG. 31B illustrates the backside features of a backside powered header cell in accordance with some embodiments. These embodiments are similar to the embodiments in FIGS. 26A and 26B, except that contact rails 82A' and 82B' have a uniform width CD1. The corresponding etching mask 80 (which is used in the step corresponding to FIG. 16B) is shown in FIG. 31A, wherein the spacing between neighboring etching masks 80 are also equal to CD1.

Figure 32A:
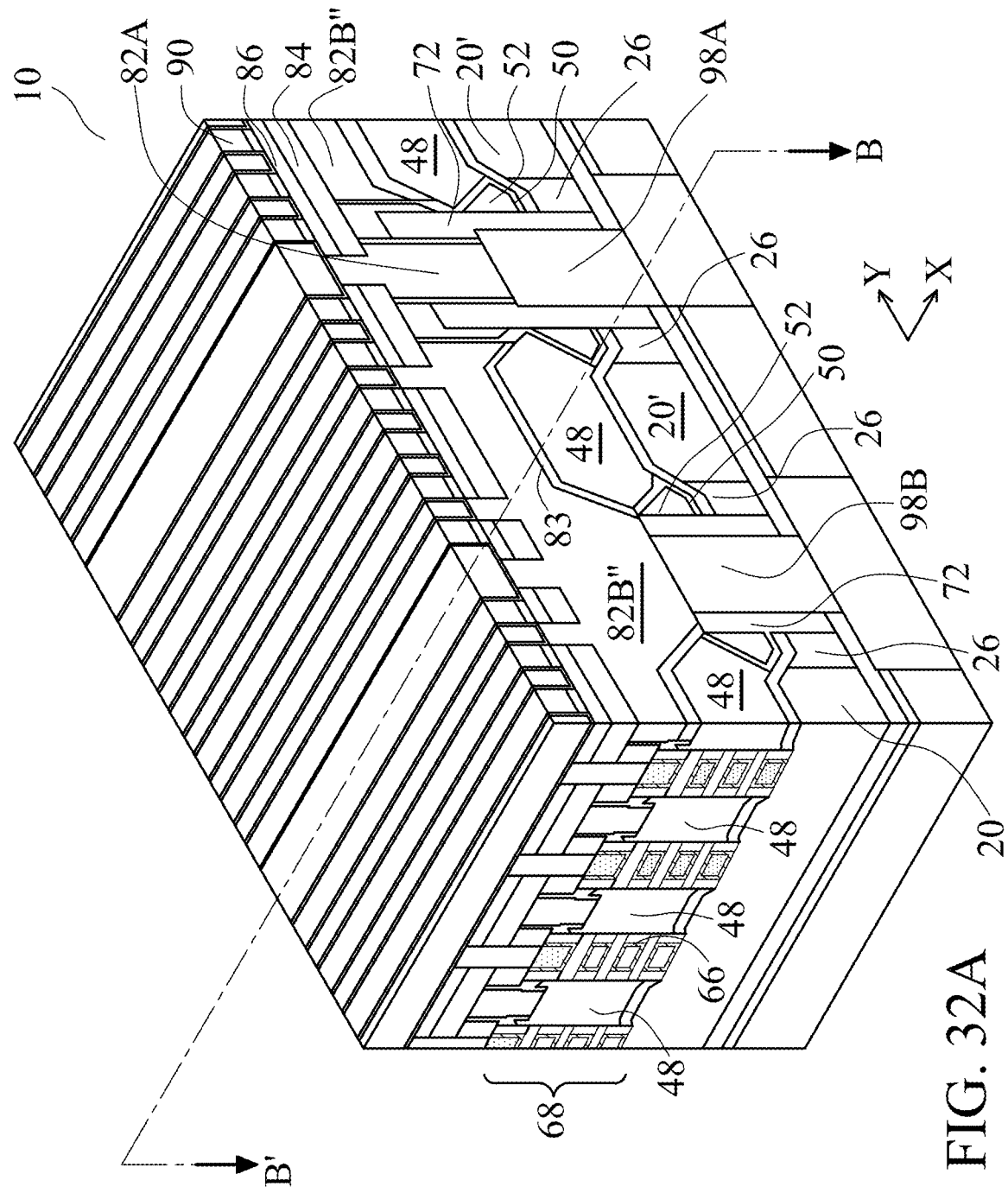
FIGS. 32A and 32B illustrate the perspective views of a header cell and contact rails in accordance with some embodiments.
Figure 32B:
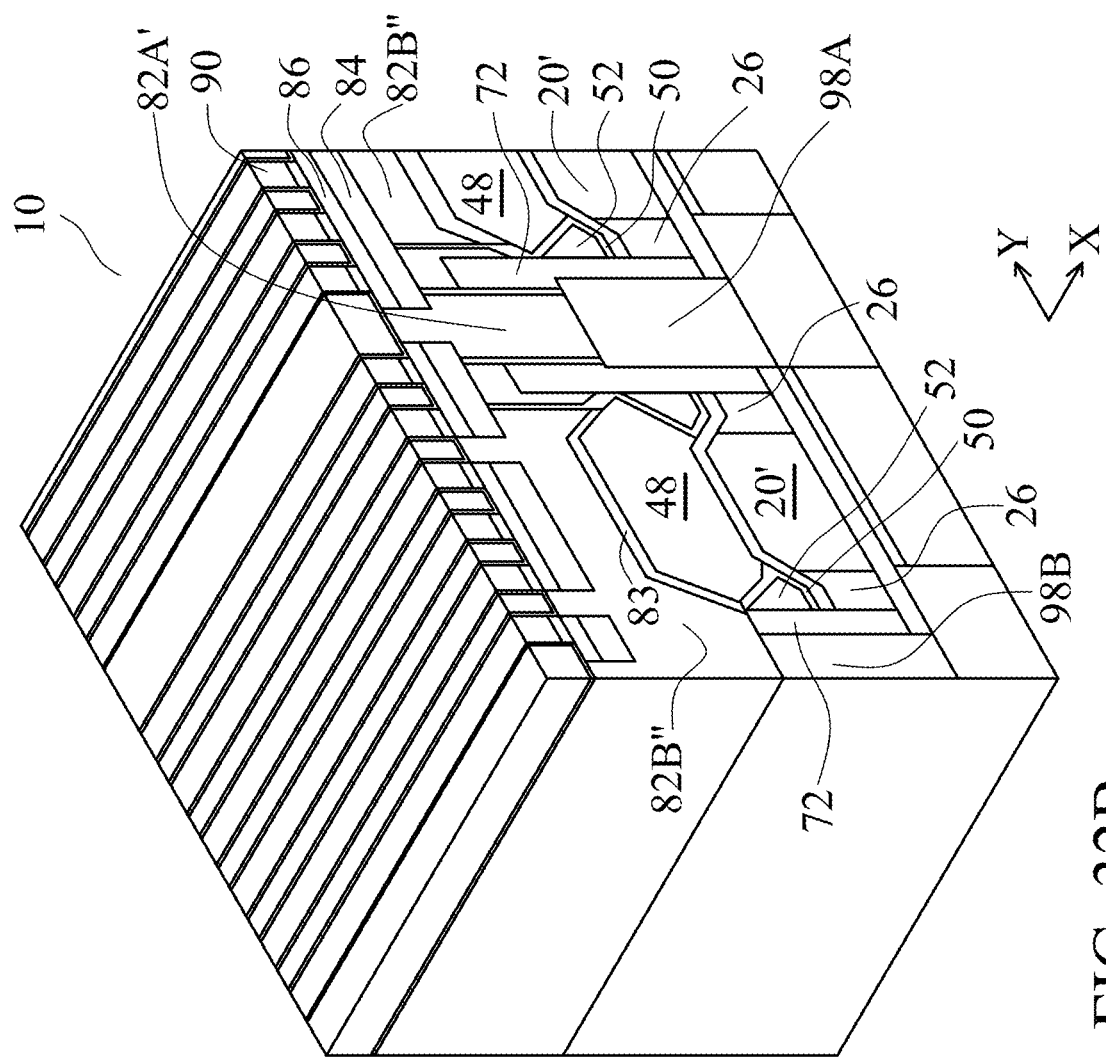

FIGS. 32A and 32B illustrate the perspective view of a backside powered header cell in accordance with alternative embodiments. These embodiments are similar to the embodiments in FIGS. 26A and 26B, except that contact rails 82A and 82B are not directly connected to the front-side power rails 92A and 92B. Alternatively stated, no via is formed in ILD 86 and hard mask 84 to connect contact rails 82A' and 82B' to front-side power rails.

Figure 33:
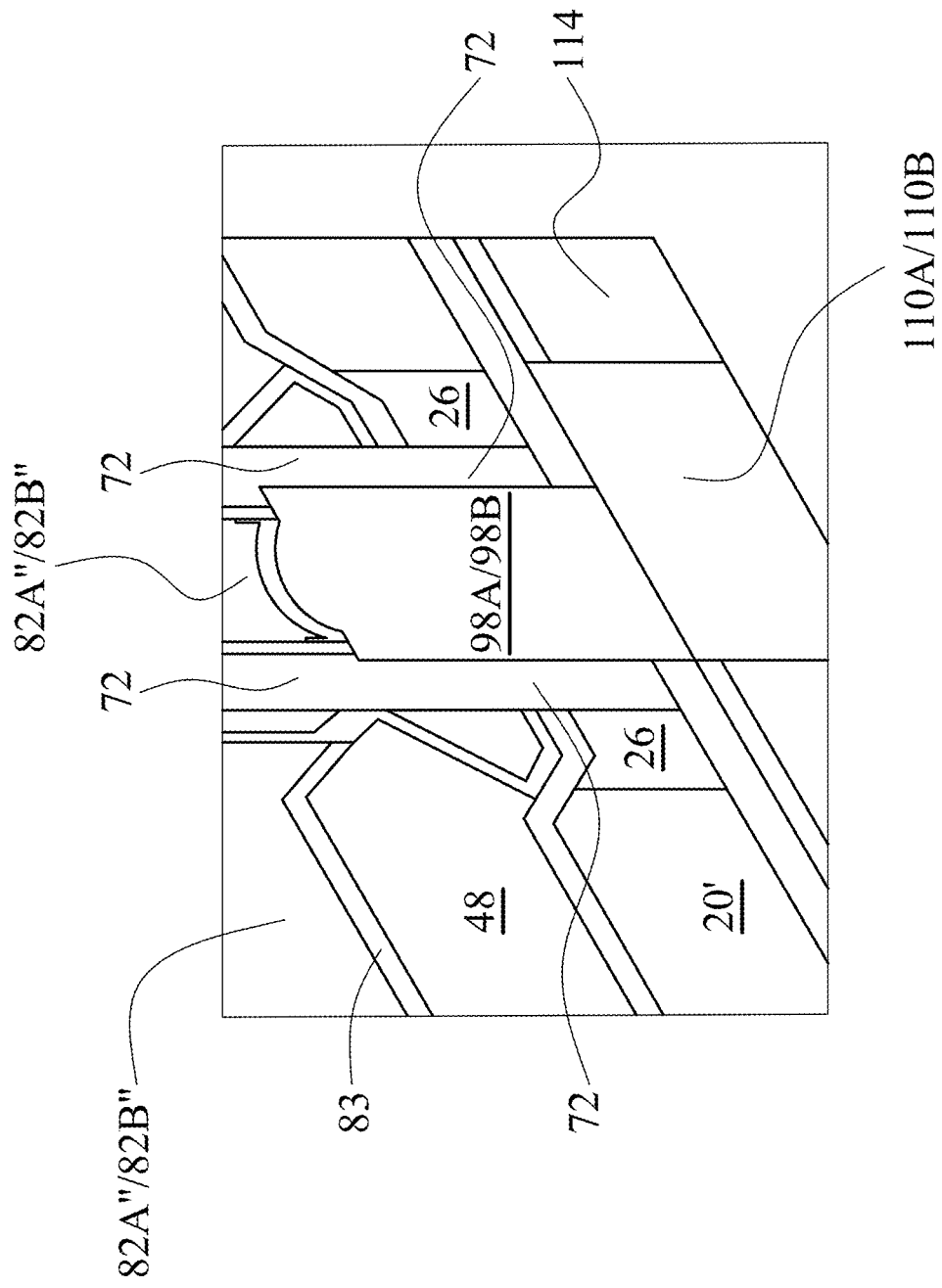
FIG. 33 illustrates a portion of a contact rail and a via rail in accordance with some embodiments.

FIG. 33 illustrates the perspective view of a portion of backside powered header cell in accordance with alternative embodiments. These embodiments are similar to the embodiments in FIGS. 26A and 26B, except that via rail 98A and 98B (denoted as 98A/98B) have portions extending into the corresponding contact rail 82A' and 82B'.

Figure 34:
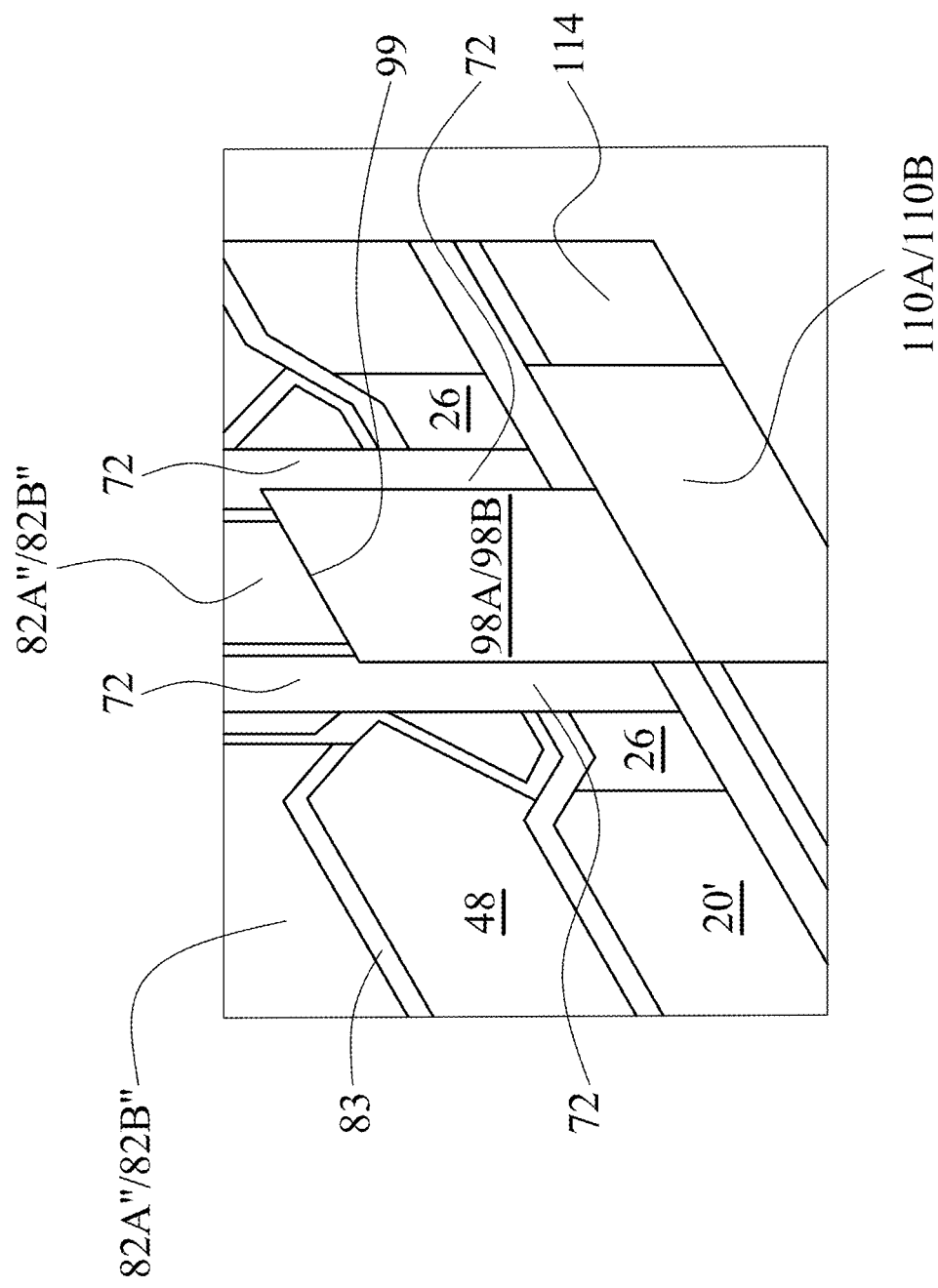
FIG. 34 illustrates a portion of a contact rail and a via rail in accordance with some embodiments.

FIG. 34 illustrates the perspective view of a portion of backside powered header cell in accordance with alternative embodiments. These embodiments are similar to the embodiments in FIGS. 26A and 26B, except that the interface 99 between contact rail 82A' and/or 82B' and the respective via rail 98A and/or 98B (denoted as 98A/98B) is lower than the bottom of source/drain region (epitaxy region) 48.

Figure 35:
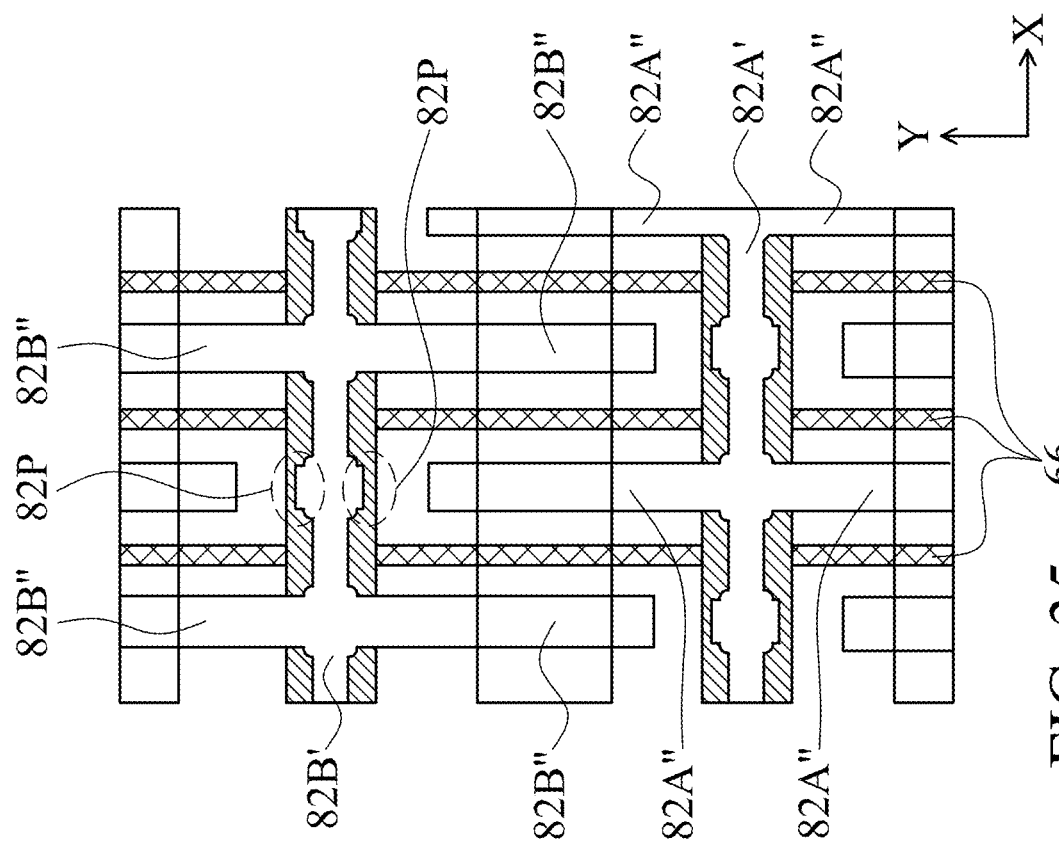
FIG. 35 illustrates the top view of contact rails and source/drain contact plugs in accordance with some embodiments.

FIG. 35 illustrates the perspective view of a portion of backside powered header cell in accordance with alternative embodiments. These embodiments are similar to the embodiments in FIGS. 26A and 26B, except that at the regions where contact rail 82A' and/or 82B' intercepts the respective source/drain contact plugs 82A" and 82B", edge rounding occurs. Also, the edge rounding also occurs where source/drain contact plugs 82A" and 82B" have protrusions 82P.

Figure 36A:
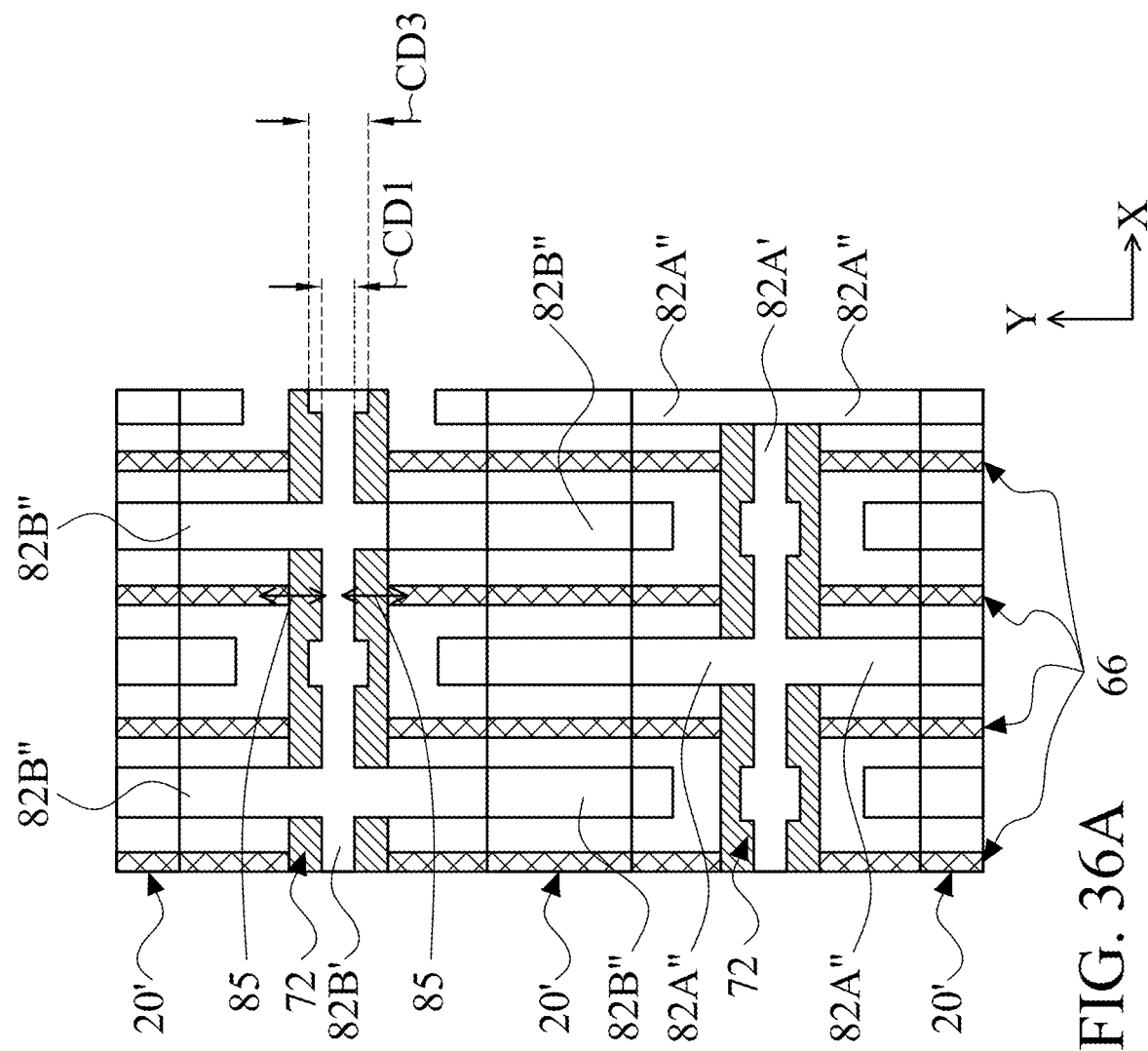
FIGS. 36A, 36B, and 36C illustrate some details of a header cell in accordance with some embodiments.
Figure 36B:
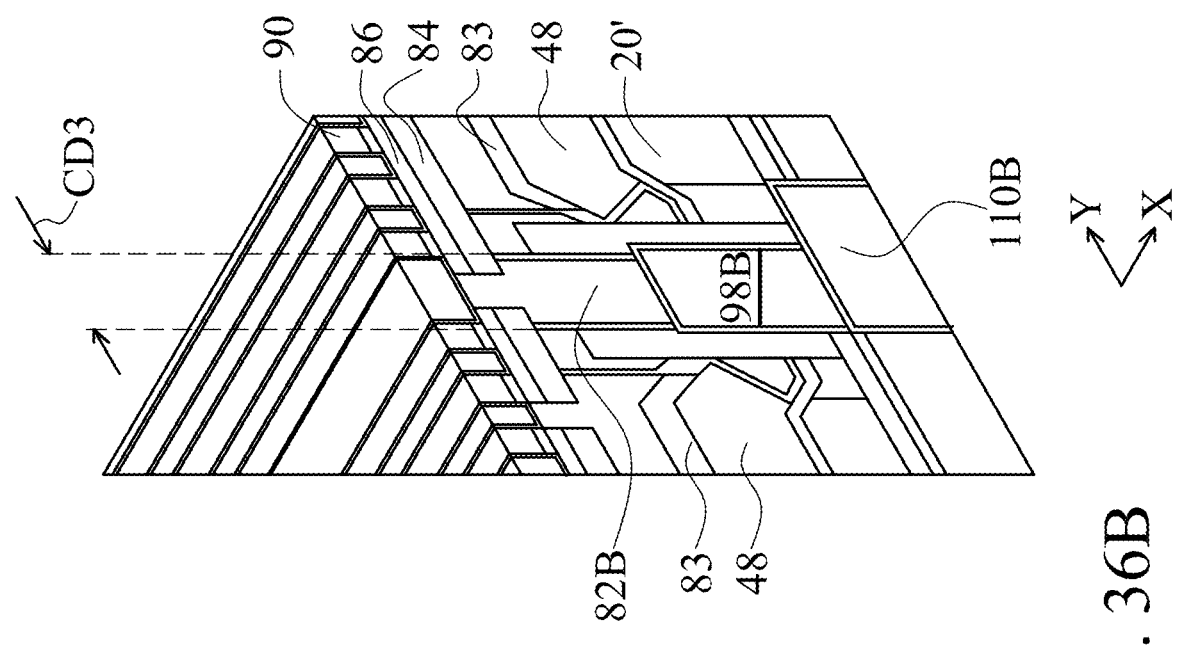
Figure 36C:
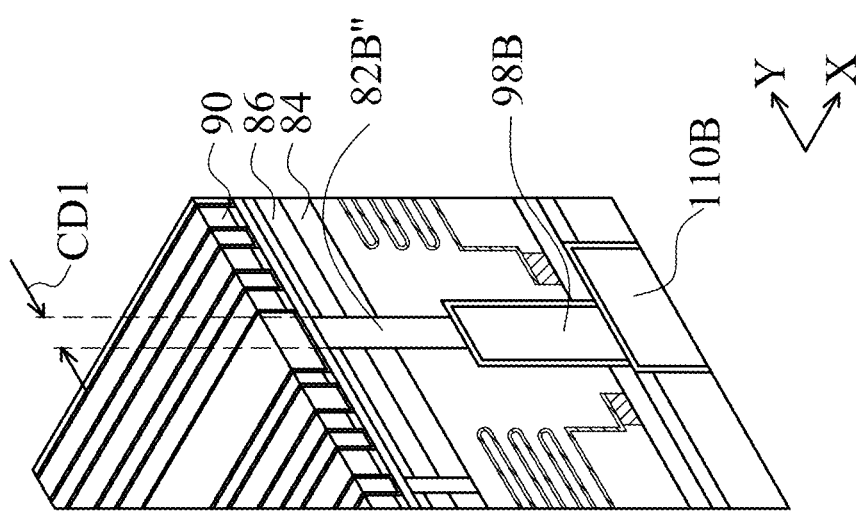

FIGS. 36A, 36B, and 36C illustrate the different widths CD1 and CD3 at different location. As shown in FIG. 36A, in the regions where contact rail 82B' are aligned to the gate stacks 66 that are cut, the width of the respective contact rail 82B' is CD1. In the regions where contact rail 82B' are aligned to source/drain regions 48 (not shown, same locations as contact plugs 82A" and 82B") the width of the respective contact rail 82B' is CD3. Width CD1 is smaller than width CD3, so that the leakage in leakage paths 85, which leakage is between gate stacks 66 and contact rails 82B' (and 82A'), is reduced. FIGS. 36B and 36C illustrate where widths CD1 and CD3 are measured.

Figure 37:
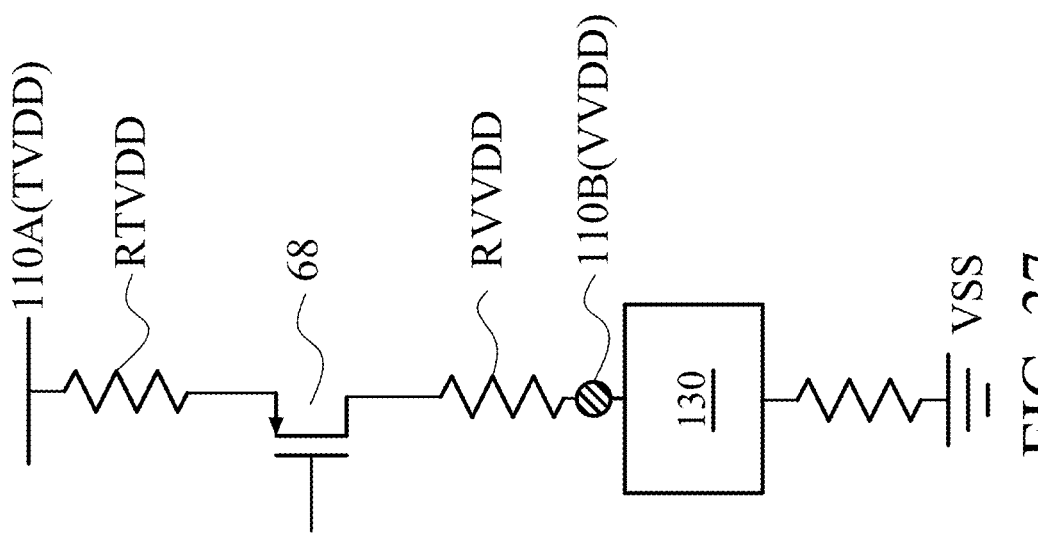
FIGS. 37, 38, and 39 illustrate a circuit diagram, a perspective view, and a top view of a header cell in accordance with some embodiments.

FIG. 37 illustrates the equivalent circuit of header cell 68 and the corresponding power rails in accordance with some embodiments. Header cell 68 is connected between power rails 110A and 110B, which carry ungated voltage TVDD and gated voltage VVDD, respectively. Resistor $R_{TVDD}$ represents the features on the source side of the header cell 68, and the corresponding features include via rail 98A, source region 48, and source silicide region 83. Resistor $R_{VVDD}$ represents the features on the drain side of the header cell 68, and the corresponding features include via rail 98B, source region 48, and drain silicide region 83. Circuit 130 represent the circuit powered by the gated voltage VVDD.

Figure 38:
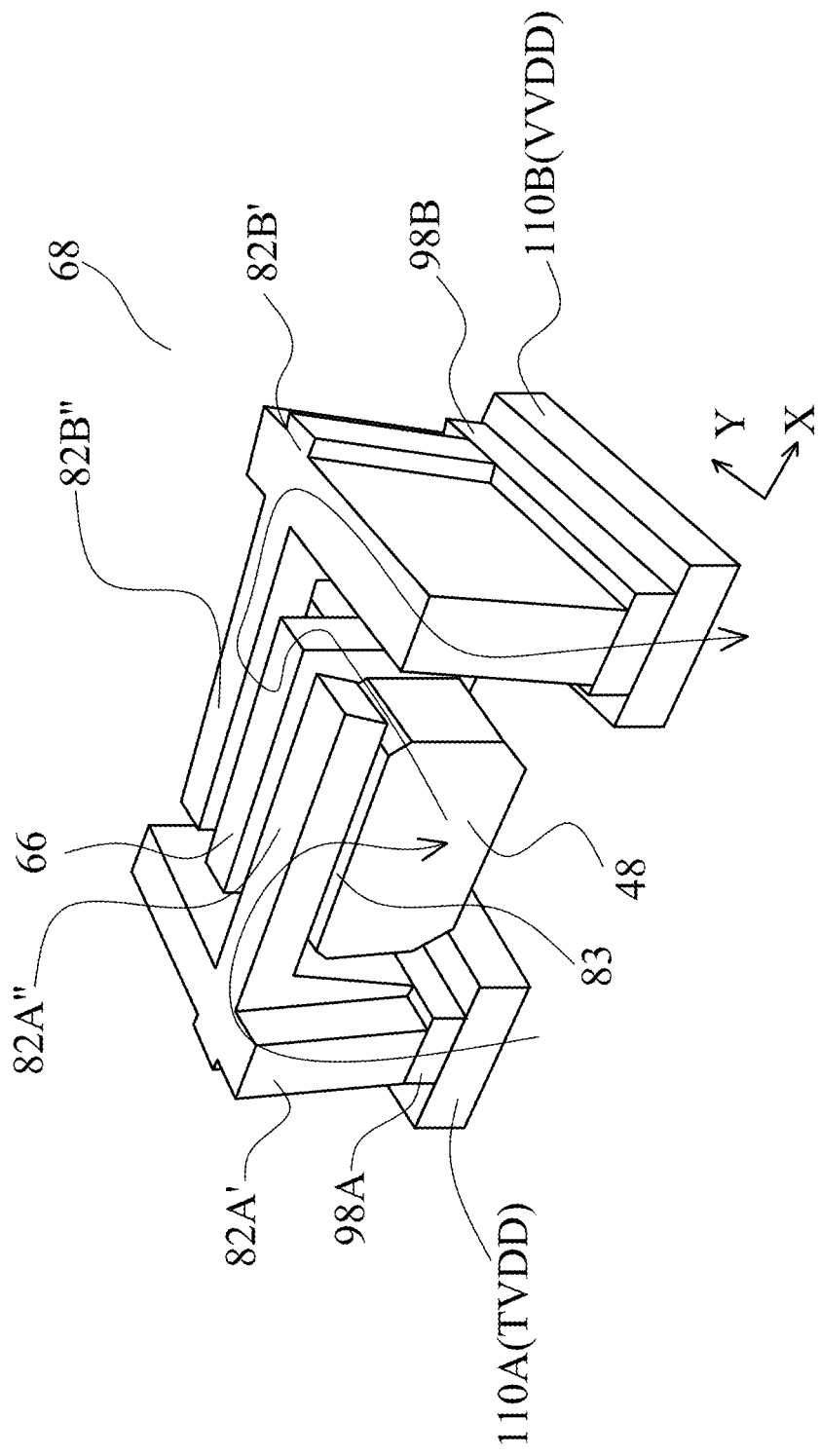

FIG. 38 illustrates a perspective view showing the head cells 68 and its connection to backside power rails 110A (TVDD) and 110B (VVDD) in accordance with some embodiments. Backside power rail 110A is connected to via rail 98A and the overlying contact rail 82A', and further to source contact plug 82A" and source region 48. Gate stack 66 controls the conduction of the channel region of header cell 68. When header cell 68 is turned on, the voltage is passed to drain region 48, drain contact plug 82B", contact rail 82B', via rail 98B, and to power rail 110B, which has the gated voltage VVDD.

Figure 39:
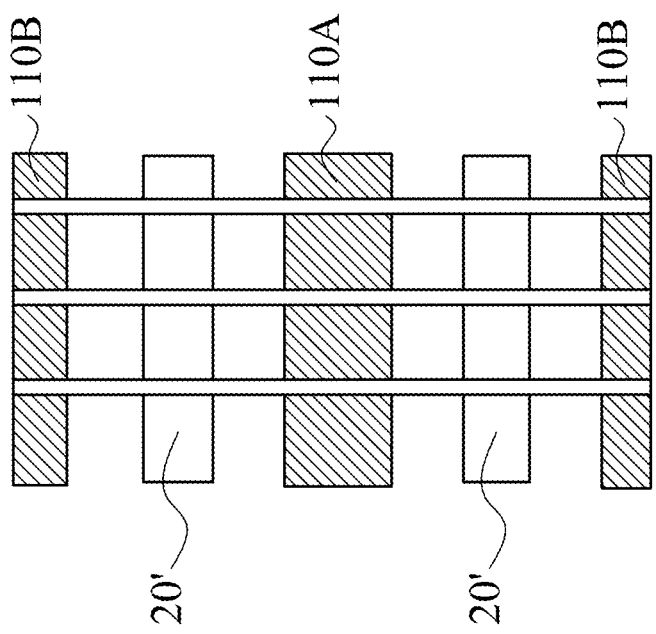

FIG. 39 illustrates the backside power rails 110B, which are separated from backside power rail 110A by active regions 20'.

The embodiments of the present disclosure have some advantageous features. By adopting backside power rails, the power rails may be formed wider since the backside has at least fewer (or no) signal lines, and voltage drop in the power rails may be reduced. Further by conducting the backside ungated power TVDD to contact rails that are formed simultaneously with source/drain contact plugs, elongated contact rails are used in the power supplying path, and the resistance of the power supplying paths (and hence voltage drop) is further reduced. Also, such scheme involves fewer silicide regions and epitaxy regions, and hence the resistance in the power supplying paths is further reduced.

In accordance with some embodiments of the present disclosure, a method comprises forming a gate electrode and a first source/drain region over a bulk portion of a semiconductor substrate; forming a cut-metal-gate region to separate the gate electrode into a first portion and a second portion; forming a source/drain contact plug overlapping and electrically connected to the first source/drain region; forming a first contact rail overlapping a portion of the cut-metal-gate region; removing the bulk portion of the semiconductor substrate; etching the cut-metal-gate region to form a trench, wherein a surface of the first contact rail is revealed to the trench; and forming a via rail in the trench, wherein the via rail is electrically connected to the first source/drain region through the first contact rail.

In an embodiment, the source/drain contact plug and the first contact rail are formed in same processes. In an embodiment, the cut-metal-gate region cuts a plurality of gate electrodes apart. In an embodiment, the gate electrode is elongated and has a first lengthwise direction, and the via rail is elongated and has a second lengthwise direction perpendicular to the first lengthwise direction. In an embodiment, after the etching the cut-metal-gate region to form the trench, the cut-metal-gate region comprises portions on opposing sides of the trench. In an embodiment, the method further comprises forming a first backside VDD line on a backside of the semiconductor substrate, wherein the first backside VDD line is electrically connected to the first source/drain region.

In an embodiment, the method further comprises forming a second backside VDD line on the backside of the semiconductor substrate, wherein the second backside VDD line is electrically connected to a second source/drain region, and wherein the first source/drain region and the second source/drain region are on opposite sides of the first portion of the gate electrode. In an embodiment, the first contact rail comprises a strip portion having a uniform width, and protrusion portions on opposite sides of the strip portion, wherein the protrusion portions are aligned to a straight line connecting the first portion and the second portion of the gate electrode.

In an embodiment, the method further comprises a second contact rail; a first plurality of source/drain contact plugs connected to the first contact rail; and a second plurality of source/drain contact plugs connected to the second contact rail, wherein the first contact rail, the second contact rail, the first plurality of source/drain contact plugs, and the second plurality of source/drain contact plugs in combination form inter-locked combs. In an embodiment, the method further comprises forming a plurality of stacked nanostructures, wherein the gate electrode extends into spaces between the plurality of stacked nanostructures.

In accordance with some embodiments of the present disclosure, a structure comprises a first source/drain region extending into a semiconductor substrate; a cut-metal-gate region comprising a dielectric material, wherein the cut-metal-gate region is on a side of the first source/drain region; a first gate electrode and a second gate electrode separated by, and in contact with, the cut-metal-gate region; a source/drain contact plug electrically connecting to the first source/drain region; a first contact rail comprising a portion in the cut-metal-gate region; and a first backside power rail, wherein the first contact rail is between the source/drain contact plug and the first backside power rail, and wherein the first backside power rail is electrically connected to the source/drain contact plug through the first contact rail.

In an embodiment, the semiconductor structure further comprises shallow trench isolation region in the semiconductor substrate, wherein the shallow trench isolation region comprises portions on opposite sides of, and in physical contact with, the cut-metal-gate region. In an embodiment, the semiconductor structure further comprises a via rail in the cut-metal-gate region, wherein the via rail electrically connects the first backside power rail to the first contact rail. In an embodiment, the first gate electrode and the second gate electrode are aligned to a first direction, and wherein the first contact rail is elongated and has a second lengthwise direction perpendicular to the first direction.

In an embodiment, the semiconductor structure further comprises a second backside power rail electrically connecting to a second source/drain region, wherein the first gate electrode is configured to control a connection between the first source/drain region and the second source/drain region. In an embodiment, the first gate electrode, the first source/drain region, and the second source/drain region collectively form a transistor, and the transistor is configured to pass an ungated voltage on the first source/drain region to the second source/drain region.

In accordance with some embodiments of the present disclosure, a semiconductor structure comprises a plurality of stacked nanostructures; a source/drain region adjoining the plurality of stacked nanostructures; a contact plug extending in a first direction and landing over an upper surface of the source/drain region; a contact rail connected to the contact plug and extending in a second direction that is perpendicular to the first direction; a via rail under the contact rail and extending in the second direction; and a metal line under the via rail and electrically connected to the source/drain region through the via rail, the contact rail and the contact plug.

In an embodiment, the semiconductor structure further comprises a cut-metal-gate region extending in the second direction, wherein the via rail is in the cut-metal-gate region. In an embodiment, the semiconductor structure further comprises a shallow trench isolation region, wherein a part of the cut-metal-gate region is further in the shallow trench isolation region. In an embodiment, the plurality of stacked nanostructures and the source/drain region are comprised in a transistor, and the transistor is configured to control an electrical connection from the metal line to an additional metal line, and wherein the metal line and the additional metal line are parts of a same metal layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a gate electrode and a first source/drain region over a bulk portion of a semiconductor substrate;
    forming a cut-metal-gate region to separate the gate electrode into a first portion and a second portion;
    forming a source/drain contact plug overlapping and electrically connected to the first source/drain region;
    forming a first contact rail overlapping a portion of the cut-metal-gate region;
    removing the bulk portion of the semiconductor substrate;
    etching the cut-metal-gate region to form a trench, wherein a surface of the first contact rail is revealed to the trench; and
    forming a via rail in the trench, wherein the via rail is electrically connected to the first source/drain region through the first contact rail.

2. The method of claim 1, wherein the source/drain contact plug and the first contact rail are formed in same processes.

3. The method of claim 1, wherein the cut-metal-gate region cuts a plurality of gate electrodes apart.

4. The method of claim 1, wherein the gate electrode is elongated and has a first lengthwise direction, and the via rail is elongated and has a second lengthwise direction perpendicular to the first lengthwise direction.

5. The method of claim 1, wherein after the etching the cut-metal-gate region to form the trench, the cut-metal-gate region comprises portions on opposing sides of the trench.

6. The method of claim 1 further comprising:
    forming a first backside VDD line on a backside of the semiconductor substrate, wherein the first backside VDD line is electrically connected to the first source/drain region.

7. The method of claim 6 further comprising forming a second backside VDD line on the backside of the semiconductor substrate, wherein the second backside VDD line is electrically connected to a second source/drain region, and wherein the first source/drain region and the second source/drain region are on opposite sides of the first portion of the gate electrode.

8. The method of claim 1, wherein the first contact rail comprises a strip portion having a uniform width, and protrusion portions on opposite sides of the strip portion, wherein the protrusion portions are aligned to a straight line connecting the first portion and the second portion of the gate electrode.

9. The method of claim 1 further comprising:
    a second contact rail;
    a first plurality of source/drain contact plugs connected to the first contact rail; and
    a second plurality of source/drain contact plugs connected to the second contact rail, wherein the first contact rail, the second contact rail, the first plurality of source/drain contact plugs, and the second plurality of source/drain contact plugs in combination form inter-locked combs.

10. The method of claim 1 further comprising forming a plurality of stacked nanostructures, wherein the gate electrode extends into spaces between the plurality of stacked nanostructures.

11. A method comprising:
    forming a first source/drain region extending into a semiconductor substrate;
    forming a cut-metal-gate region comprising a dielectric material, wherein the cut-metal-gate region is on a side of the first source/drain region;
    forming a first gate electrode and a second gate electrode separated by, and in contact with, the cut-metal-gate region;
    forming a source/drain contact plug electrically connecting to the first source/drain region;
    forming a first contact rail comprising a portion in the cut-metal-gate region; and forming a first backside power rail, wherein the first contact rail is between the source/drain contact plug and the first backside power rail, and wherein the first backside power rail is electrically connected to the source/drain contact plug through the first contact rail.

12. The method of claim 11 further comprising a shallow trench isolation region in the semiconductor substrate, wherein the shallow trench isolation region comprises portions on opposite sides of, and in physical contact with, the cut-metal-gate region.

13. The method of claim 12 further comprising a via rail in the cut-metal-gate region, wherein the via rail electrically connects the first backside power rail to the first contact rail.

14. The method of claim 11, wherein the first gate electrode and the second gate electrode are aligned to a first lengthwise direction, and wherein the first contact rail is elongated and has a second lengthwise direction perpendicular to the first lengthwise direction.

15. The method of claim 11 further comprising a second backside power rail electrically connecting to a second source/drain region, wherein the first gate electrode is configured to control a connection between the first source/drain region and the second source/drain region.

16. The method of claim 15, wherein the first gate electrode, the first source/drain region, and the second source/drain region collectively form a transistor, and the transistor is configured to pass an ungated voltage on the first source/drain region to the second source/drain region.

17. A method comprising:
forming a plurality of stacked nanostructures;
forming a source/drain region adjoining the plurality of stacked nanostructures;
forming a contact plug extending in a first direction and landing over an upper surface of the source/drain region;
forming a contact rail connected to the contact plug and extending in a second direction that is perpendicular to the first direction;
forming a via rail under the contact rail and extending in the second direction; and
forming a metal line under the via rail and electrically connected to the source/drain region through the via rail, the contact rail and the contact plug.

18. The method of claim 17 further comprising a cut-metal-gate region extending in the second direction, wherein the via rail is in the cut-metal-gate region.

19. The method of claim 18 further comprising a shallow trench isolation region, wherein a part of the cut-metal-gate region is further in the shallow trench isolation region.

20. The method of claim 17, wherein the plurality of stacked nanostructures and the source/drain region are comprised in a transistor, and the transistor is configured to control an electrical connection from the metal line to an additional metal line, and wherein the metal line and the additional metal line are parts of a same metal layer.

* * * * *